(12) United States Patent
Kishi

(10) Patent No.: US 6,492,215 B1
(45) Date of Patent: Dec. 10, 2002

(54) SEMICONDUCTOR DEVICE AND FABRICATING THE SAME

(75) Inventor: Toshiyuki Kishi, Tokorozawa (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/641,731

(22) Filed: Aug. 21, 2000

Related U.S. Application Data

(62) Division of application No. 09/132,894, filed on Aug. 12, 1998.

(30) Foreign Application Priority Data

Aug. 13, 1997 (JP) .............................................. 9-218527

(51) Int. Cl.⁷ .......................................... H01L 21/8234
(52) U.S. Cl. ........................ 438/197; 438/216; 438/287
(58) Field of Search ................................ 438/197, 216, 438/229, 264, 287

(56) References Cited

U.S. PATENT DOCUMENTS

| | | | |
|---|---|---|---|
| 4,042,945 A | | 8/1977 | Lin et al. ..................... 257/406 |
| 4,710,477 A | * | 12/1987 | Chen ........................... 438/261 |
| 4,937,756 A | * | 6/1990 | Hsu et al. .................... 364/490 |
| 5,247,199 A | * | 9/1993 | Matlock ....................... 257/371 |
| 5,468,987 A | | 11/1995 | Yamazaki et al. .......... 257/406 |
| 5,726,087 A | * | 3/1998 | Tseng et al. ................. 438/261 |
| 5,895,950 A | | 4/1999 | Walker et al. ............... 257/315 |
| 5,903,055 A | | 5/1999 | Takayama .................... 257/771 |

OTHER PUBLICATIONS

"CMOS Semiconductor Memory Structural Modification to Allow Increased Memory Charge" IBM Tech. Discl. Bull. vol. 31, No. 11, pp. 162–165 (Apr. 1989).*

Baker, Jr., A.R.; *IBM Technical Disclosure Bulletin*, vol. 1, No. 7, Dec. 1968.

* cited by examiner

*Primary Examiner*—Caridad Everhart
(74) *Attorney, Agent, or Firm*—Armstrong Westerman & Hattori, LLP

(57) ABSTRACT

In a semiconductor device comprising an N channel MOS device, and P channel MOS device, or additionally comprising a MONOS device, provided with a gate insulating film and gate electrode formed on a semiconductor substrate or semiconductor layers of a SOI substrate, respectively, the gate insulating film of at least the P channel MOS device is made up of a dual-layer film consisting of a gate oxide film composed of a silicon dioxide film, and a gate silicon nitride film.

4 Claims, 37 Drawing Sheets

SEMICONDUCTOR DEVICE AND FABRICATING THE SAME

This application is a division of Ser. No. 09/132,894 filed on Aug. 12, 1998.

BACKGROUND OF THE INVENTION

1. Field of the Invention

The invention relates generally to a semiconductor device and a method of fabricating the same, and more particularly, to the structure of a semiconductor device provided with an N channel MOS device and a P channel MOS device, or a MONOS device in addition thereto which are all formed on top of a common semiconductor substrate, or a common SOI substrate, and a method of fabricating the same.

2. Description of the related Art

A MOS (Metal-Oxide-Semiconductor) device using a semiconductor substrate made of silicon, and the same using a semiconductor substrate having a semiconductor layer on top of an insulating layer formed on a supporting substrate, a so-called SOI (Silicon on Insulator) substrate are well known.

First, the structure of a conventional MOS device using a semiconductor substrate made of silicon is described by way of example with reference to a schematic cross sectional view shown in FIG. 69.

The MOS device shown in FIG. 69 comprises an N channel MOS device 11, and a P channel MOS device 12, which are both formed on a semiconductor substrate 1 made of silicon, making up a complementary MOS device.

The N channel MOS device 11 is provided with a gate oxide film 2 and gate electrode 3 formed on the surface of the semiconductor substrate 1 over a P well 4 formed of a p-type doped layer diffused in the semiconductor substrate 1, and also with a source 6 and drain 7, formed of a heavily doped n-type layer on the surface of the semiconductor substrate 1, matching the gate electrode 3.

The P channel MOS device 12 is provided with a gate oxide film 2 and gate electrode 3 formed on the surface of the semiconductor substrate 1 over an N well 5 formed of an n-type doped layer diffused in the semiconductor substrate 1, and also with a source 16 and drain 17, formed of a heavily doped p-type layer on the surface of the semiconductor substrate 1, matching the gate electrode 3.

The N channel MOS device 11 and P channel MOS device 12 are isolated from each other by a field oxide film 13 formed on the surface of the semiconductor substrate 1.

An interlevel insulator 8 is formed on the entire surface of the semiconductor substrate 1, and via contact holes 9 formed in the interlevel insulator 8, connection to other MOS devices formed on the semiconductor substrate 1 is made with interconnections 10 (interconnection 10 connected to the gate electrodes 3, 3, respectively, is disposed at a position different in cross-sectional view from that shown in FIG. 69), one end of which are connected to the gate electrode 3, source 6 and drain 7 of the N channel MOS device 11 as well as the gate electrode 3, source 16 and drain 17 of the P channel MOS device 12, respectively.

Now the structure of a conventional MOS device using a SOI substrate is described by way of example with reference to a schematic cross sectional view shown in FIG. 70.

The MOS device shown in FIG. 70 makes use of the SOI substrate 23 comprising a supporting substrate 20, an insulating film 21, and a plurality of semiconductor layers 22a, 22b, each patterned in an island-like shape A gate oxide film 2 and gate electrode 3 are formed on top of the respective semiconductor layers 22a, and 22b, making up a semiconductor device comprising an N channel MOS device 11 and a P channel MOS device 12.

The N channel MOS device 11 is provided with a source 6 and drain 7, formed of a heavily doped N type layer, in a region of the semiconductor layer 22a, matching a gate electrode 3.

Similarly, the P channel MOS device 12 is provided with a source 16 and drain 17, formed of a heavily doped P type layer, in a region of the semiconductor layer 22b, matching a gate electrode 3.

The N channel MOS device 11 and the P channel MOS device 12 are completely isolated for insulation from each other with an interlevel insulator 8 and the insulating film 21.

Then, via respective contact holes 9 formed in the interlevel insulator 8, connection to other MOS devices formed on the SOI substrate 23 is made with interconnections 10 (interconnection 10 connected to the gate electrodes 3, 3, respectively, is disposed at a position different in cross-sectional view from that shown in FIG. 70), one end of which is connected to the gate electrode 3, source 6 and drain 7 of the N channel MOS device 11 as well as the gate electrode 3, source 16 and drain 17 of the P channel MOS device 12, respectively.

Next, the structure of a conventional semiconductor device incorporating a MONOS device in addition to the semiconductor device shown in FIG. 69 is described by way of example with reference to FIG. 71.

In the semiconductor device shown in FIG. 71, an N channel MOS device 11, a P channel MOS device 12, and a MONOS device 35 are formed on a semiconductor substrate 1 made of silicon.

The N channel MOS device 11 is provided with a gate oxide film 2 and gate electrode 3 formed on the surface of the semiconductor substrate 1 over a P well 4 formed of a p-type doped layer diffused in the semiconductor substrate 1, and also with a source 6 and a drain 7, formed of a heavily doped n-type layer on the surface of the semiconductor substrate 1, matching the gate electrode 3.

The P channel MOS device 12 is provided with a gate oxide film 2 and gate electrode 3 formed on the surface of the semiconductor substrate 1 over an N well 5 formed of an n-type doped layer diffused in the semiconductor substrate 1, and also with a source 16 and a drain 17, formed of a heavily doped p-type layer on the surface of the semiconductor substrate 1, matching the gate electrode 3.

The MONOS device 35 is provided with a memory insulating film 34 comprising a memory oxide film 31, a memory nitride film 32, and a top oxide film 33, and also with a memory gate electrode 50, which are all formed on the surface of the semiconductor substrate 1 over a P well 4 formed of a p-type doped layer diffused in the semiconductor substrate 1, and also with a source 7 (for common use as the drain 7 of the N channel MOS device 11) and a drain 18, formed of a heavily doped n-type layer on the surface of the semiconductor substrate 1, matching the memory gate electrode 50.

The P channel MOS device 12, N channel MOS device 11, and MONOS device 35 are isolated from each other with field oxide films 13 formed on the surface of the semiconductor substrate.

An interlevel insulator 8 is formed on the entire surface of the semiconductor substrate 1 and via contact holes 9 formed in the interlevel insulator 8, connection to other MOS devices formed on the semiconductor substrate 1 is made with interconnections 10, ends of which are connected to the gate electrodes 3, the sources 6, 16 and the drains 7, 17, 18 of the respective semiconductor devices 11, 12, and 35.

A method of fabricating the semiconductor device shown in FIG. 71 is described hereinafter with reference to FIGS. 72 through 76, which are cross-sectional views showing respective steps of a fabrication process.

The first half of the fabrication process of the semiconductor device described above comprises the same steps as those of a third embodiment of a method of fabricating a semiconductor device according to the invention as described hereinafter with reference to FIGS. 29 through 34. Accordingly, illustration of these steps is omitted, and the fabrication process is described with reference to FIG. 72 only.

First, by oxidizing the semiconductor substrate 1 made of silicon in an oxidizing atmosphere, an oxide film is formed on the surface thereof Subsequently, a photo-resist which is a photosensitive polymer is formed on the entire surface of the oxide film by use of a spin coater, and by applying exposure and development treatment thereto with the use of a predetermined mask, the photo-resist is patterned in such a way as to form an opening delineating an N channel region where the N channel MOS device and the MONOS device are to be formed. Thereafter, the oxide film is etched by use of the photo-resist as an etching mask.

Then, a first buffer oxide film is formed by oxidizing the semiconductor substrate 1 in an oxidizing atmosphere, whereupon ions of boron, a p-type dopant, are implanted to form a P well. As a result, boron is implanted in the surface region of the semiconductor substrate 1, in the N channel region 42 where the first buffer oxide film with a thin oxide film is formed.

Subsequently, after removing the oxide film described in the foregoing and the first buffer oxide film, a second buffer oxide film is formed on the entire surface of the semiconductor substrate 1 by oxidizing the same in an oxidizing atmosphere, and the photo-resist is patterned in such a way as to form an opening delineating a P channel region 43 where the P channel MOS device is to be formed.

Ions of phosphorus, an n-type dopant, are implanted into the P channel region 43 with the use of the photo-resist described above as a mask against ion implantation. The second buffer oxide film is then removed.

Thereafter, by oxidizing the semiconductor substrate 1 in a thin oxidizing atmosphere and applying heat treatment thereto, the ion-implanted dopants are activated, thereby forming the P well 4 and an N well 5, and at the same time, a pad oxide film is formed on the surface of the semiconductor substrate 1.

Subsequently, on the entire surface of the pad oxide film, a nitride film composed of a silicon nitride film is formed by means of the chemical vapor deposition process, and a photo-resist is formed in regions where the N channel MOS device, P channel MOS device, and MONOS device are to be formed, respectively.

The nitride film is then etched using the photo-resist described above as an etching mask.

Thereafter, field oxide films 13 shown in FIG. 72 are formed through selective oxidation in an oxidizing atmosphere, and the nitride film as well as the pad oxide film are removed.

As shown in FIG. 72, gate oxide films 2 are then formed through oxidation in an oxidizing atmosphere, and a first gate electrode material 48 is formed over the gate oxide films 2.

Then, photo-resists 113 are patterned in regions where the gate electrodes are to be formed. The first gate electrode material 48 is etched using the photo-resists 113 as etching masks, forming the gate electrodes 3 as shown in FIG. 73. Further, the gate oxide film 2 except portions thereof underneath the gate electrodes 3 is removed.

Thereafter, through oxidation in an oxidizing atmosphere, the memory oxide film 31 shown in FIG. 74 is formed and turned into a nitride oxide film by annealing in an ammonia atmosphere.

In the course of annealing in an ammonia atmosphere, ammonia and hydrogen are diffused into the gate oxide films 2, a constituent part of the MOS devices already formed, causing a problem of positive electric charge being induced in the gate oxide films 2 and at the interface between the gate oxide films 2 and the semiconductor substrate 1.

Since the electric charge remains without electrical neutrality being restored before completion of the fabrication process, there will arise a problem that shift in the threshold voltage of the respective MOS devices occurs.

Subsequently, on the entire surface of the memory oxide film 31, the memory nitride film 32, the top oxide film 33, and the second gate electrode material 49 are formed in sequence.

Thereafter, photo-resist 114 is patterned in a region where the memory gate electrode of the MONOS device is to be formed.

The second gate electrode material 49, the top oxide film 33, the memory nitride film 32, and the memory oxide film 31 are etched using the photo-resist 114 as an etching mask, forming the memory gate electrode 50 as shown in FIG. 75.

Then, ions of arsenic, an n-type dopant, are implanted into the surface of the semiconductor substrate 1, in parts of the N channel region 42, matching the gate electrode 3, and the memory gate electrode 50, forming the source 6 and the drains 7, belonging to a heavily doped N layer as shown in FIG. 76.

Subsequently, ions of boron, a p-type dopant, are implanted into the surface of the semiconductor substrate 1, in part of the P channel region 43 shown in FIG. 75, matching the gate electrode 3, forming the source 16 and the drain 17 belonging to a heavily doped P layer as shown in FIG. 76. Thereafter, heat treatment is applied thereto in order to activate the dopants.

Further, an interlevel insulator 8 is formed on the entire surface as shown in FIG. 76, openings for the contact holes 9 are formed in the interlevel insulator 8, and the interconnections 10 is provided.

Thus, using the semiconductor substrate 1 made of silicon, the semiconductor device comprising the N channel MOS device 11, the P channel MOS device 12, and the MONOS device 35, which are formed on the same semiconductor substrate 1, is fabricated.

There are cases where MOS devices of the aforesaid structure are used in the controller of a satellite sent up into space, or the controller of a nuclear reactor.

However, when the conventional MOS devices described above are put to use in an environment where radiation such as gamma rays are present, positive electric charge is developed in the gate oxide films, or at the interface between the semiconductor substrate and the gate oxide films, lowering the threshold voltage of the N channel MOS device, and generating leakage current.

On the other hand, this will raise the threshold voltage of the P channel MOS device, rendering the controller inoperative.

Also, when fabricating a semiconductor device comprising the N channel MOS device, the P channel MOS device, and the MONOS device, all formed on a semiconductor substrate made of silicon, the memory oxide film is turned into a nitride oxide film by applying heat treatment thereto in an ammonia atmosphere in order to improve the writable and erasable characteristic of the MONOS device. At this point in time, positive electric charge is induced in the gate oxide films and at the interface between the gate oxide films and the semiconductor substrate as described in the foregoing due to the reaction of ammonia and hydrogen, creating a cause for malfunction due to shift in the threshold voltage.

SUMMARY OF THE INVENTION

It is therefore an object of the invention to inhibit shift in the threshold voltage of MOS devices in a radiation environment, and another object of the invention is to inhibit shift in the threshold voltage of MOS devices which occurs when annealing in an ammonia atmosphere during a process of fabricating a semiconductor device comprising MOS devices and a MONOS device, formed on the semiconductor substrate, by solving the problems described in the foregoing.

To this end, a semiconductor device according to the invention has the structures described as follows:

The semiconductor device comprises a semiconductor substrate, and an N channel MOS device and a P channel MOS device having a gate insulating film formed on the semiconductor substrate and a gate electrode formed on the gate insulating film, the gate insulating film being made up of a dual-layer film consisting of a gate oxide film composed of a silicon dioxide film and a gate silicon nitride film respectively.

Or, in a semiconductor device comprising an SOI substrate made up of a supporting substrate, an insulating film, and a plurality of semiconductor layers, each patterned in an island-like shape, and an N channel MOS device and a P channel MOS device having a gate insulating film formed on each of the semiconductor layers, and a gate electrode formed on the gate insulating film, respectively, the gate insulating film may be made up of a dual-layer film consisting of a gate oxide film composed of a silicon dioxide film, and a gate silicon nitride film.

These semiconductor devices may further comprise a MONOS device having a memory insulating film composed of a memory oxide film, a memory nitride film, and a top oxide film, formed on the semiconductor substrate, and a memory gate electrode formed on the memory insulating film.

Further the gate insulating film of the N channel MOS device is made up of a gate oxide film composed of a silicon dioxide film, and only the gate insulating film of the P channel MOS device is made up of a dual-layer film consisting of a gate oxide film composed of a silicon dioxide film, and a gate silicon nitride film.

The method of fabricating a semiconductor device according to the invention comprises the following steps (1) to (18) to accomplish the object of the invention:

(1) step of forming an oxide film on the entire surface of a semiconductor substrate through oxidation thereof in an oxidizing atmosphere;

(2) step of etching the oxide film on the semiconductor substrate, in a N channel region where an N channel MOS device is to be formed;

(3) step of forming a first buffer oxide film for implanting a p-type dopant into the N channel region;

(4) step of implanting the p-type dopant into the N channel region of the semiconductor substrate;

(5) step of forming a second buffer oxide film on the entire surface of the semiconductor substrate after etching the oxide film formed on the entire surface of the semiconductor substrate;

(6) step of implanting an n-type dopant into a P channel region of the semiconductor substrate, where a P channel MOS device is to be formed, using photosensitive polymer as a mask;

(7) step of forming a pad oxide film on the entire surface of the semiconductor substrate after etching the second buffer oxide film, and activating the respective dopants implanted in an oxidizing atmosphere;

(8) step of forming a nitride film composed of a silicon nitride film, on the pad oxide film;

(9) step of etching the nitride film in regions of the semiconductor substrate where field oxide films are to be formed;

(10) step of removing the nitride film and pad oxide film after forming the field oxide films on the semiconductor substrate by means of a selective oxidation method for effecting device isolation between the N channel region and the P channel region;

(11) step of forming a gate oxide film on the entire surface of the semiconductor substrate, in the N channel region and P channel region, in an oxidizing atmosphere, forming a gate silicon nitride film on the entire surface of the gate oxide film, and forming a gate electrode material on the entire surface of the gate silicon nitride film;

(12) step of forming gate electrodes by etching the gate electrode material and the gate silicon nitride film;

(13) step of forming a highly doped n-type layer in regions for forming a source and drain, in the N channel region of the semiconductor substrate, using photosensitive polymer as a mask against ion implantation;

(14) step of forming a highly doped p-type layer in regions for forming a source and drain, in the P channel region of the semiconductor substrate, using photosensitive polymer as a mask against ion implantation;

(15) step of forming an interlayer insulating film composed primarily of a silicon dioxide film on the entire surface of the semiconductor substrate;

(16) step of activating the highly doped n-type and p-type layers by annealing thereto, and step of forming a plurality of contact holes in the interlayer insulating film by means of the photo-etching method; and

(17) step of forming interconnections connected, via the contact holes, to the gate electrode, the source, and the drain of the N channel MOS device and the P channel MOS device, respectively.

Further, the following steps may be included instead of the aforementioned steps (11) and (12):

step of forming a gate oxide film on the entire surface of the semiconductor substrate, in the N channel region and P channel region in an oxidizing atmosphere, forming a gate silicon nitride film on the entire surface of the gate oxide film;

step of removing the gate silicon nitride film by photo-etching such that the gate silicon nitride film in the N channel region is left intact;

step of forming a gate electrode material on the entire surface of the semiconductor substrate; and step of forming gate electrodes by etching the gate electrode material.

Further, in the case of fabricating the semiconductor device provided with a MONOS semiconductor device, it comprises the following steps instead of the aforementioned steps (11) and (12)

step of forming a gate oxide film on the entire surface of the semiconductor substrate, in the N channel region and the P channel region, in an oxidizing atmosphere, and forming a gate silicon nitride film on the entire surface of the gate oxide film;

step of forming a first gate electrode material on the entire surface of the gate silicon nitride film, and forming gate electrodes by a photo-etching method;

step of forming a memory oxide film by oxidizing the entire surface of the semiconductor substrate in an oxidizing atmosphere, and turning the memory oxide film into an nitride oxide film by annealing in an ammonia atmosphere;

step of forming a memory nitride film on the memory oxide film, forming a top oxide film by oxidizing the memory nitride film in an oxidizing atmosphere, and forming a second gate electrode material on the entire surface of the top oxide film;

step of forming a memory gate electrode by photo-etching the second gate electrode material, the top oxide film, the memory nitride film, and the memory oxide film; and step of forming interconnections connected, via the contact holes, to the gate electrode, the source, and the drain of the N channel MOS device, the P channel MOS device, and a MONOS device, respectively in the aforementioned step (17).

In the case of using an SOI substrate made up of a supporting substrate an insulating film and the semiconductor layer, the following steps (1) to (14) are included:

(1) step of forming a first semiconductor layer patterned in an island-like shape on which an N channel MOS device is to be formed, and a second semiconductor layer patterned in an island-like shape on which a P channel MOS device is to be formed, by etching the semiconductor layer on the SOI substrate using the photosensitive polymer as an etching mask;

(2) step of forming a gate oxide film on the surface of the first and second semiconductor layers, respectively, by oxidizing the respective semiconductor layers in an oxidizing atmosphere;

(3) step of forming a P channel doped layer in the region of the first semiconductor layer using photosensitive polymer as a mask against ion implantation;

(4) step of forming an N channel doped layer in the region of the second semiconductor layer using photosensitive polymer as a mask against ion implantation;

(5) step of forming a p-type doped layer for prevention of surface inversion in the boundary region surrounding the first semiconductor layer using photosensitive polymer as a mask against ion implantation;

(6) step of forming an n-type doped layer for prevention of surface inversion in the boundary region surrounding the second semiconductor layer using photosensitive polymer as a mask against ion implantation;

(7) step of forming a gate silicon nitride film on the gate oxide film formed on the surface of the respective semiconductor layers and forming a gate electrode material on the gate silicon nitride film;

(8) step of forming gate electrodes by etching the gate electrode material and the gate silicon nitride film.

(9) step of forming a highly doped n-type layer in regions of the first semiconductor layer, for forming a source and a drain, using photosensitive polymer as a mask against ion implantation;

(10) step of forming a highly doped p-type layer in regions of the second semiconductor layer, for forming a source and a drain, using photosensitive polymer as a mask against ion implantation;

(11) step of forming an interlayer insulating film composed primarily of a silicon dioxide film on the entire surfaces of the semiconductor layers;

(12) step of activating the highly doped n-type and p-type layers by annealing;

(13) step of forming a plurality of contact holes in the interlayer insulating film by means of a photo-etching method; and

(14) step of forming interconnections connected, via the contact holes, to the gate electrode, the source, and the drain of the N channel MOS device and the P channel MOS device, respectively.

The following steps may be included instead of the aforementioned steps (7) and (8):

step of forming a gate silicon nitride film on the gate oxide film formed on the surface of the respective semiconductor layers;

step of removing the gate silicon nitride film by the photo-etching method except that the region of the first semiconductor layer is kept intact;

step of forming a gate electrode material on the entire surfaces of the semiconductor layers; and step of forming gate electrodes by etching the gate electrode material.

Still further, in the case of fabricating a semiconductor device provided with a MOS semiconductor device and a MONOS semiconductor device using an SOI substrate made up of a supporting substrate, an insulating film and a semiconductor layer, the following steps (1) to (17) are included:

(1) step of forming photosensitive polymer on the semiconductor layer of the SOI, and forming a first semiconductor layer patterned in an island-like shape on which an N channel MOS device is to be formed, a second semiconductor layer patterned in an island-like shape on which a P channel MOS device is to be formed, and a third semiconductor layer patterned in an island-like shape on which a MONOS device is to be formed, by etching the semiconductor layer using the photosensitive polymer as an etching mask;

(2) step of forming a gate oxide film on the surface of the first through third semiconductor layers, respectively, by oxidizing the respective semiconductor layers in an oxidizing atmosphere;

(3) step of forming a P channel doped layer in the regions of the first and the third semiconductor layers using photosensitive polymer as a mask against ion implantation;

(4) step of forming an N channel doped layer in the region of the second semiconductor layer using photosensitive polymer as a mask against ion implantation;

(5) step of forming a p-type doped layer for prevention of surface inversion in the boundary regions surrounding the first and the third semiconductor layers using photosensitive polymer as a mask against ion implantation;

(6) step of forming an n-type doped layer for prevention of surface inversion in the boundary region surrounding the second semiconductor layer using photosensitive polymer as a mask against ion implantation;

(7) step of forming a gate silicon nitride film on the entire surfaces of the semiconductor layers;

(8) step of forming a first gate electrode material on the entire surface of the gate silicon nitride film, and forming gate electrodes by means of a photo-etching method;

(9) step of forming a memory oxide film by oxidizing the entire surface of the semiconductor layers in an oxidizing atmosphere, and annealing in an ammonia atmosphere for turning the memory oxide film into a nitride oxide film;

(10) step of forming a memory nitride film on the memory oxide film, forming a top oxide film by oxidizing the memory nitride film in an oxidizing atmosphere, and forming a second gate electrode material on the top oxide film;

(11) step of forming a memory gate electrode by etching the second gate electrode material, the top oxide film, the memory nitride film, and the memory oxide film by means of the photo-etching method;

(12) step of forming a highly doped n-type layer in regions of the first and third semiconductor layers, respectively, for forming a source and a drain, using photosensitive polymer as a mask against ion implantation;

(13) step of forming a highly doped p-type layer in regions of the second semiconductor layer, for forming a source and a drain, using photosensitive polymer as a mask against ion implantation;

(14) step of forming an interlayer insulating film composed primarily of a silicon dioxide film on the entire surfaces of the semiconductor layers;

(15) step of activating the highly doped n-type and p-type layers by annealing;

(16) step of forming a plurality of contact holes in the interlayer insulating film by means of the photo-etching method; and

(17) step of forming interconnections connected, via the contact holes, to the gate electrode, the source, and the drain of the N channel MOS device, the P channel MOS device, and the MONOS device, respectively.

As described above, in the semiconductor device and the method of fabricating the same, according to the invention, the gate insulating film of the N channel MOS device and the P channel MOS device, respectively, or the gate insulating film of the P channel MOS device only, is made up of the dual-layer film consisting of the gate oxide film composed of the silicon dioxide film, and gate silicon nitride film.

As a result, diffusion of reacting gas such as ammonia and hydrogen is inhibited in the course of heat treatment in an ammonia atmosphere during the fabrication process owing to the effect of the gate silicon nitride film which is a closely packed film, making up the gate insulation film.

Consequently, reaction in the gate oxide film, and at the interface between the gate oxide films and semiconductor substrate can be inhibited with the result that generation of positive electric charge in these regions is prevented, thereby inhibiting shift in the threshold voltage.

Further, since the gate insulating film is made up of the dual-layer film consisting of the gate oxide film composed of the silicon dioxide film and the gate silicon nitride film, there will arise a matching problem at the interface between the gate oxide film and the gate silicon nitride film with the result that an electrically charged interfacial energy level occurs at the interface.

In the MOS devices of the invention, the threshold voltage is controlled by regulating the concentration of dopants in the wells to cope with the interfacial energy level.

Hence, when the semiconductor device according to the invention is put to use in a radiation environment, positive electric charge generated by the presence of gamma rays or the like decreases in magnitude due to the effect of the interfacial energy level, thereby inhibiting shift in the threshold voltage.

The above and other objects, features and advantages of the invention will be apparent from the following detailed description which is to be read in conjunction with the accompanying drawings.

BRIEF DESCRIPTION OF THE DRAWINGS

FIGS. 57 through 66 are schematic cross-sectional views showing the state of the semiconductor device and constituent materials thereof in respective steps of a fabrication process in order to describe a sixth embodiment of a method of fabricating the same according to the invention.

DETAILED DESCRIPTION OF THE PREFERRED EMBODIMENTS

Referring now to the accompanying drawings, the preferred embodiments of the structure of a semiconductor device and a method of fabricating the same, according to the invention, are described in detail hereinafter.

To begin with, first through sixth embodiments of the invention are described with reference to FIGS. 1 through 6, respectively.

Figure 1:
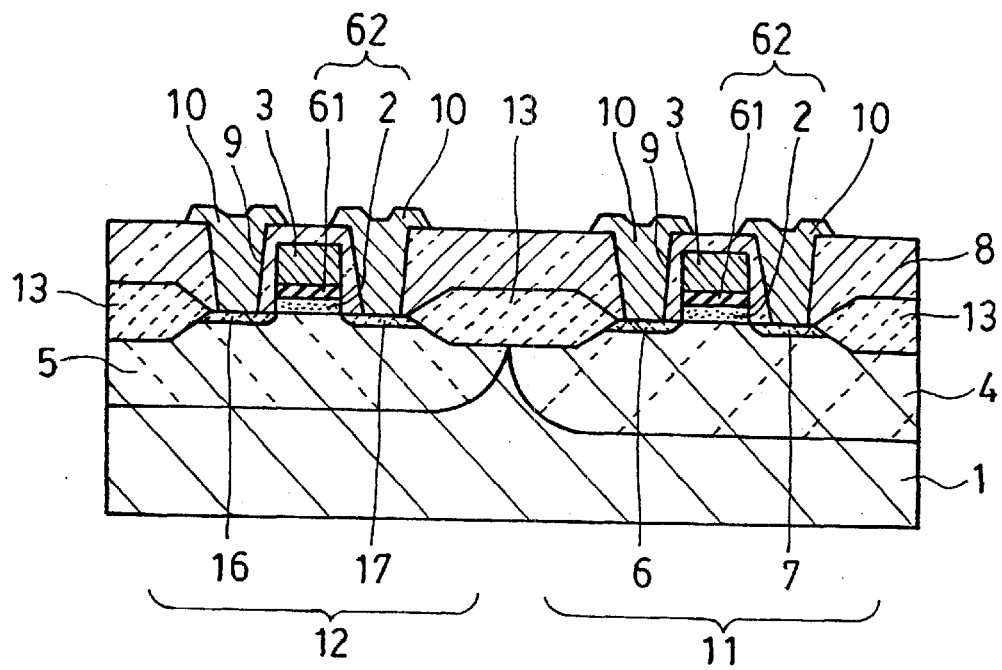
FIGS. 1 through 6 are schematic cross-sectional views showing the structure of first through sixth embodiments of a semiconductor device according to the invention, respectively.

First Embodiment of a Semiconductor Device: FIG. 1

The structure of the first embodiment of a semiconductor device according to the invention is described with reference to a schematic cross sectional view in FIG. 1.

The semiconductor device shown in FIG. 1 makes use of a semiconductor substrate made of silicon, and comprises an N channel MOS device 11, and a P channel MOS device 12, which are both formed on the semiconductor substrate 1, making up a complementary MOS device.

The N channel MOS device 11 is provided with a gate insulating film 62 and a gate electrode 3 formed on the surface of the semiconductor substrate 1 over a P well 4 formed of a p-type doped layer diffused in the semiconductor substrate 1, and also with a source 6 and a drain 7, formed of a heavily doped n-type layer on portions of the surface of the semiconductor substrate 1, matching the gate electrode 3.

The gate insulating film 62 is made up of a dual-layer film consisting of a gate oxide film 2 composed of a silicon dioxide film and a gate silicon nitride film 61.

The P channel MOS device 12 is provided with a gate insulating film 62 and a gate electrode 3 formed on the surface of the semiconductor substrate 1 over an N well 5 formed of an n-type doped layer diffused in the semiconductor substrate 1, and also with a source 16 and a drain 17, formed of a heavily doped p-type layer on portions of the surface of the semiconductor substrate 1, matching the gate electrode 3.

The gate insulating film 62 described above is also made up of a dual-layer film consisting of a gate oxide film 2 composed of a silicon dioxide film and a gate silicon nitride film 61.

The N channel MOS device 11 and the P channel MOS device 12 are isolated from each other by field oxide films 13 formed on the surface of the semiconductor substrate 1.

An interlevel insulator 8 is formed on the entire surface of the semiconductor substrate 1 and via contact holes 9 formed in the interlevel insulator 8, connection to other MOS devices formed on the semiconductor substrate 1 is made with interconnections 10 (interconnection 10 connected to the gate electrodes 3, 3, respectively, is disposed at a position different in cross-sectional view from that shown in FIG. 1), ends of which are connected to the gate electrodes 3, 3, the sources 6, 16, and the drains 7, 17 of the N channel MOS device 11 and the P channel MOS device 12, respectively.

With the semiconductor device, the gate insulating film 62 of the N channel MOS device 11 and the P channel MOS device 12, respectively, is made up of the dual-layer film consisting of the gate oxide film 2 composed of a silicon dioxide film and the gate silicon nitride film 61. Consequently, there will arise a matching problem at the interface between the gate oxide film and the gate silicon nitride film with the result that an electrically charged interfacial energy level occurs at the interface.

The threshold voltage is controlled by regulating concentration of dopants in the wells to cope with the interfacial energy level. Hence, when the semiconductor device is put to use in a radiation environment, positive electric charge generated by the presence of gamma rays or the like decreases in value due to the effect of the interfacial energy level, thereby inhibiting shift in the threshold voltage.

Figure 2:
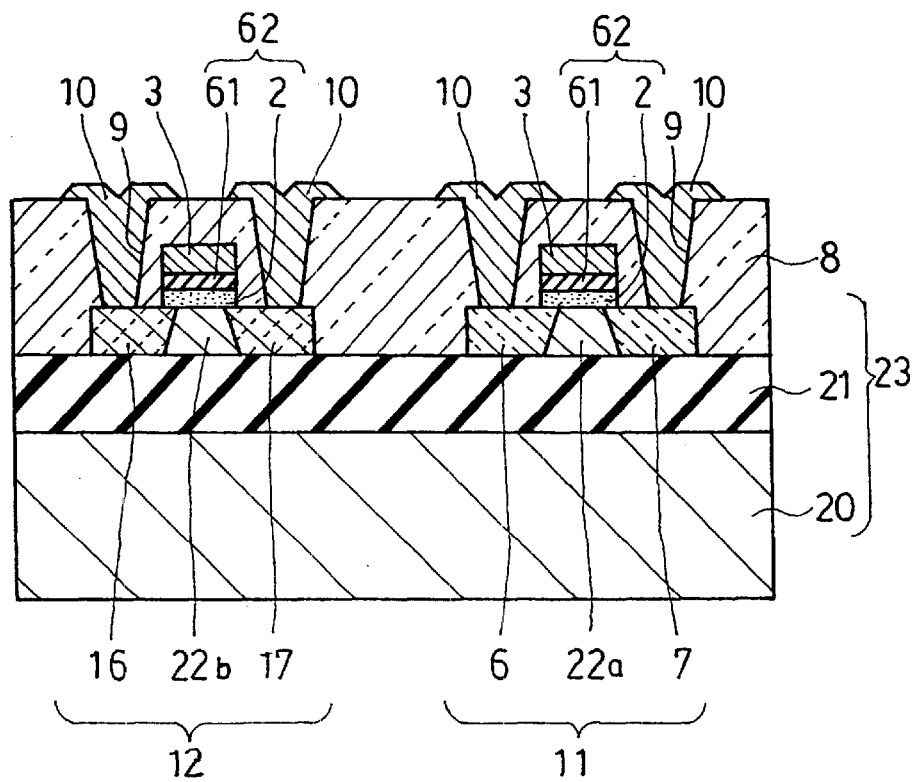

Second Embodiment of a Semiconductor Device: FIG. 2

Now, the structure of the second embodiment of a semiconductor device according to the invention is described with reference to the schematic cross-sectional view in FIG. 2.

The semiconductor device shown in FIG. 2 makes use of an SOI substrate 23 comprising a supporting substrate 20, an insulating film 21, and a plurality of semiconductor layers 22a, 22b, each patterned in an island-like shape.

A gate insulating film 62 and a gate electrode 3 are formed on top of the respective semiconductor layers 22a, and 22b, making up the semiconductor device comprising an N channel MOS device 11 and a P channel MOS device 12.

The gate insulating film 62 is made up of a dual-layer film consisting of a gate oxide film 2 composed of a silicon dioxide film and a gate silicon nitride film 61.

The N channel MOS device 11 is provided with a source 6 and a drain 7, formed of a heavily doped n-type layer, in regions of the semiconductor layer 22a, matching the gate electrode 3.

Similarly, the P channel MOS device 12 is provided with a source 16 and a drain 17, formed of a heavily doped p-type layer, in regions of the semiconductor layer 22b, matching the gate electrode 3.

The N channel MOS device II and the P channel MOS device 12 are completely isolated for insulation from each other with an interlevel insulator 8 and the insulating film 21.

There is provided interconnections 10 (interconnection 10 connected to the gate electrodes 3, 3, respectively, is disposed at a position different in cross-sectional view from that shown in FIG. 2), ends of which are connected to the gate electrodes 3, 3, the sources 6, 16, and the drains 7, 17 of the N channel MOS device 11 and P channel MOS device 12, respectively, via respective contact holes 9 formed in the interlevel insulator 8.

With this semiconductor device as well, the gate insulating film 62 of the N channel MOS device 11 and the P channel MOS device 12, respectively, is made up of a dual-layer film consisting of the gate oxide film 2 composed of a silicon dioxide film and the gate silicon nitride film 61. Consequently, an electrically charged interfacial energy level occurs at the interface between the gate oxide film and the gate silicon nitride film.

Hence, when the semiconductor device is put to use in a radiation environment, positive electric charge generated by the presence of gamma rays or the like decreases in value due to the effect of the interfacial energy level, thereby inhibiting shift in the threshold voltage.

Figure 3:
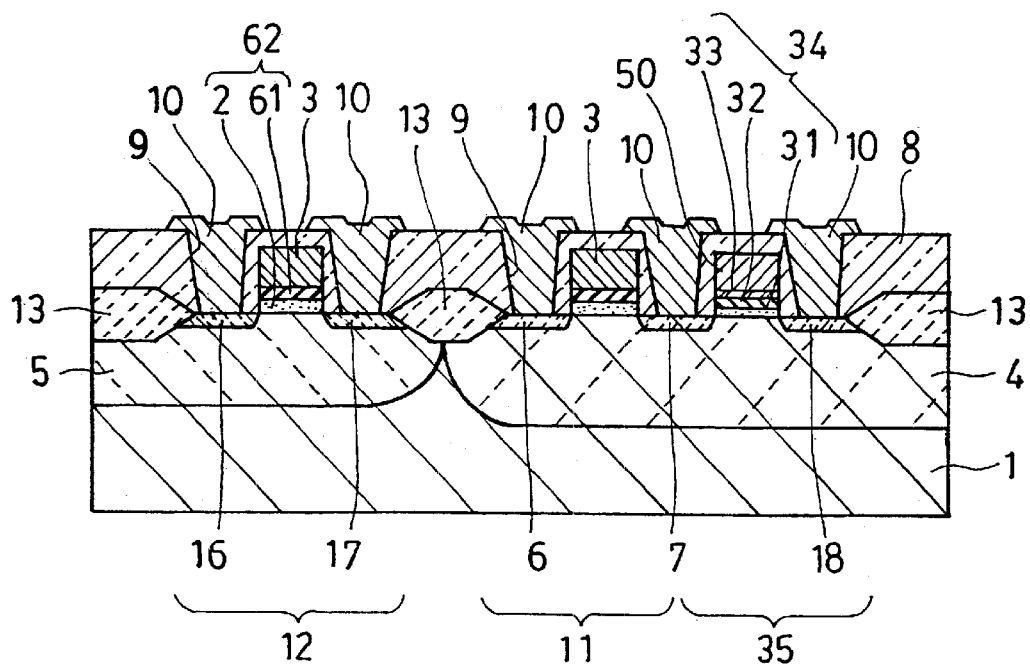

Third Embodiment of a Semiconductor Device:
FIG. 3

Next, the structure of the third embodiment of a semiconductor device according to the invention is described with reference to the schematic cross-sectional. view shown in FIG. 3.

FIG. 3 shows the structure of the semiconductor device employing a semiconductor substrate made of silicon, and comprising an N channel MOS device 11, a P channel MOS device 12, and a MONOS device 35, formed on a common semiconductor substrate 1.

Since the structure of the N channel MOS device 11, and the P channel MOS device 12, respectively. is the same as that previously described in the first embodiment with reference to FIG. 1, description thereof is omitted.

The MONOS device 35 is provided with a memory insulating film 34 comprising a memory oxide film 31, a memory nitride film 32, and a top oxide film 33, which are all formed on the surface of the semiconductor substrate 1 over a P well 4 formed of a p-type doped layer diffused in the semiconductor substrate 1, and further, is provided with a memory gate electrode 50 on the top oxide film 33. A source 7 (for common use as a drain 7 of the N channel MOS device 11) and drain 18, formed of a heavily doped n-type layer, are provided on portions of the surface of the semiconductor substrate 1, matching the memory gate electrode 50.

The P channel MOS device 12, the N channel MOS device 11, and the MONOS device 35 are isolated from each other with field oxide films 13 formed on the surface of the semiconductor substrate 1, interposed therebetween.

With this semiconductor device comprising the MONOS device as described above, an electrically charged interfacial energy level also occurs at the interface between the gate oxide film and the gate silicon nitride film provided that the gate insulating film of the N channel MOS device and P channel MOS device, respectively, and is made up of the dual-layer film consisting of the gate oxide film composed of the silicon dioxide film and the gate silicon nitride film. Hence, when the semiconductor device is put to use in a radiation environment positive electric charge generated by the presence of gamma rays or the like decreases in value due to the effect of the interfacial energy level.

Further, in the course of annealing and the like in an ammonia atmosphere during the fabrication process, diffusion of reacting gases such as ammonia and hydrogen is inhibited by the gate silicon nitride film which is a closely packed film, making up the gate insulating film.

As a result, reactions in the gate oxide film, or at the interface between the gate oxide film and the semiconductor substrate, can be inhibited, blocking generation of positive electric charge in these regions.

Thus, shift in the threshold voltage can be inhibited.

Figure 4:
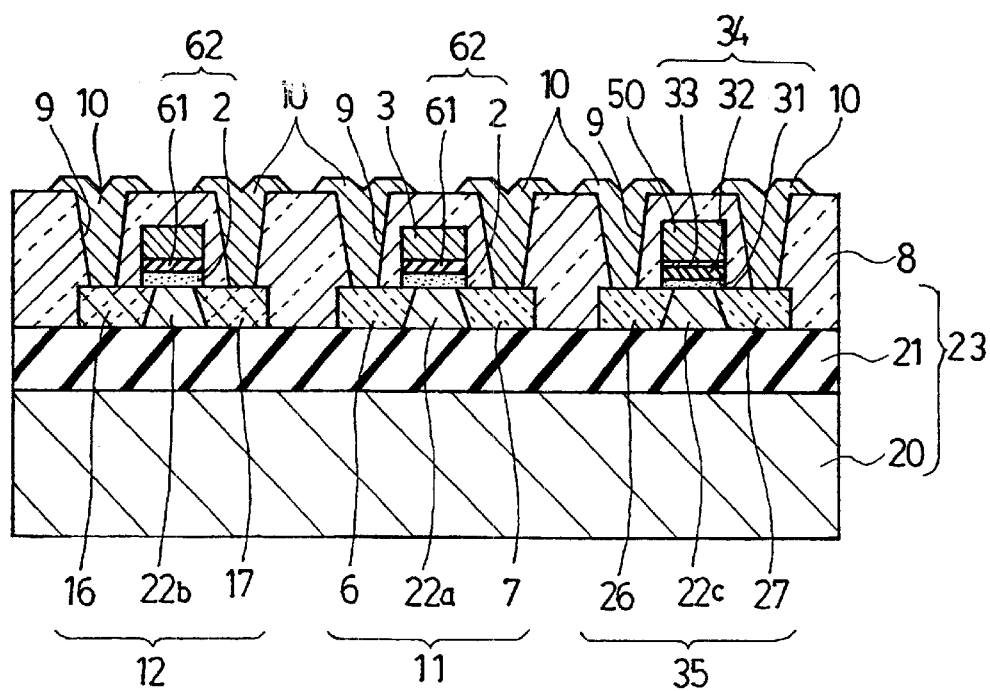

Fourth Embodiment of a Semiconductor Device:
FIG. 4

Next, the structure of the fourth embodiment of a semiconductor device according to the invention is described with reference to the schematic cross sectional view shown in FIG. 4.

The semiconductor device shown in FIG. 4 makes use of an SOI substrate 23 comprising a supporting substrate 20, an insulating film 21, and a plurality of semiconductor layers 22a, 22b, and 22c, each patterned in an island-like shape.

An N channel MOS device 11, a P channel MOS device 12, and a MONOS device 35 are formed on top of the semiconductor layers 22a, 22b, and 22c of the SOI substrate 23, respectively.

Since the structure of the N channel MOS device 11 and P channel MOS device 12, respectively, is the same as that previously described in the second embodiment with reference to FIG. 2, description thereof is omitted.

The MONOS device 35 is provided with a memory insulating film 34 comprising a memory oxide film 31, a memory nitride film 32, and a top oxide film 33, and also with a memory gate electrode 50, which are all formed on the surface of the semiconductor layer 22c. Further, a source 26 and a drain 27, formed of a heavily doped n-type layer, are provided on portions of the surface of the semiconductor layer 22c, matching the memory gate electrode 50.

The N channel MOS device 11, the P channel MOS device 12, and the MONOS device 35 are completely isolated from each other for insulation with an interlevel insulator 8 and the insulating film 21.

Contact holes 9 are formed in the interlevel insulator 8 and via the contact holes 9, connection to other MOS devices formed on the SOI substrate 23 is made with interconnections 10 (interconnection 10 connected to the gate electrodes 3, 3, 50, respectively, is disposed at a position different in cross sectional view from that shown in FIG. 4), ends of which are connected to the gate electrodes 3, 3, 50, the sources 6, 16, 26 and the drains 7, 17, 27 of the respective semiconductor devices 11, 12, and 35.

The operation and effect of the fourth embodiment of the semiconductor device according to the invention are the same as those for the third embodiment.

Figure 5:
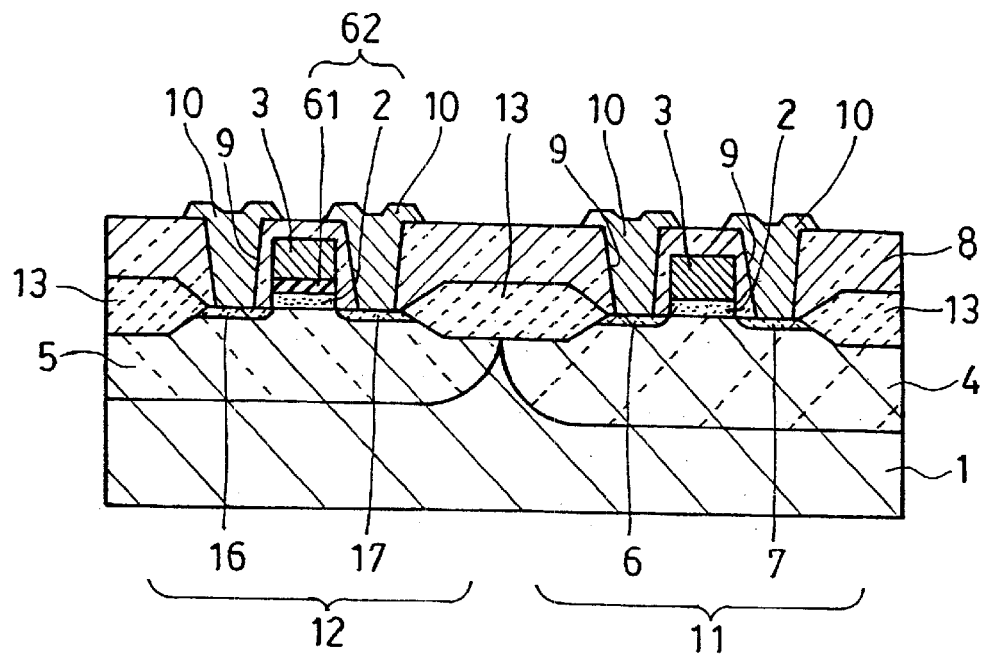

Fifth Embodiment of a Semiconductor Device:
FIG. 5

Now, the structure of the fifth embodiment of a semiconductor device according to the invention is described with reference to the schematic cross sectional view shown in FIG. 5.

The semiconductor device shown in FIG. 5 employs a semiconductor substrate 1 made of silicon, and comprises an N channel MOS device 11, and a P channel MOS device 12, which are both formed on the semiconductor substrate 1, making up a complementary MOS device.

This semiconductor device is of the same structure as that for the first embodiment shown in FIG. 1 except that a gate insulating film of the N channel MOS device 11 is made up of only a gate oxide film 2 composed of a silicon dioxide film.

In the fifth embodiment of the invention, the gate insulating film of the N channel MOS device 11 is made up of only the gate oxide film 2 while a gate insulating film 62 of the P channel MOS device 12 is made up of a dual-layer film consisting of a gate oxide film 2 composed of a silicon dioxide film, and a gate silicon nitride film 61.

Even with such a structure of the semiconductor device, shift in the threshold voltage can be inhibited when the semiconductor device is put to use in a radiation environment.

In this semiconductor device, the N channel MOS device 11 and P channel MOS device 12 are isolated from each other with field oxide films 13 formed on the surface of the semiconductor substrate 1.

An interlevel insulator 8 is formed on the entire surface of the semiconductor substrate 1 and via contact holes 9 formed in the interlevel insulator 8, connection to other MOS devices formed on the semiconductor substrate 1 is made with interconnections 10, ends of which are connected to the respective electrodes of the respective semiconductor devices 11 and 12.

Figure 6:
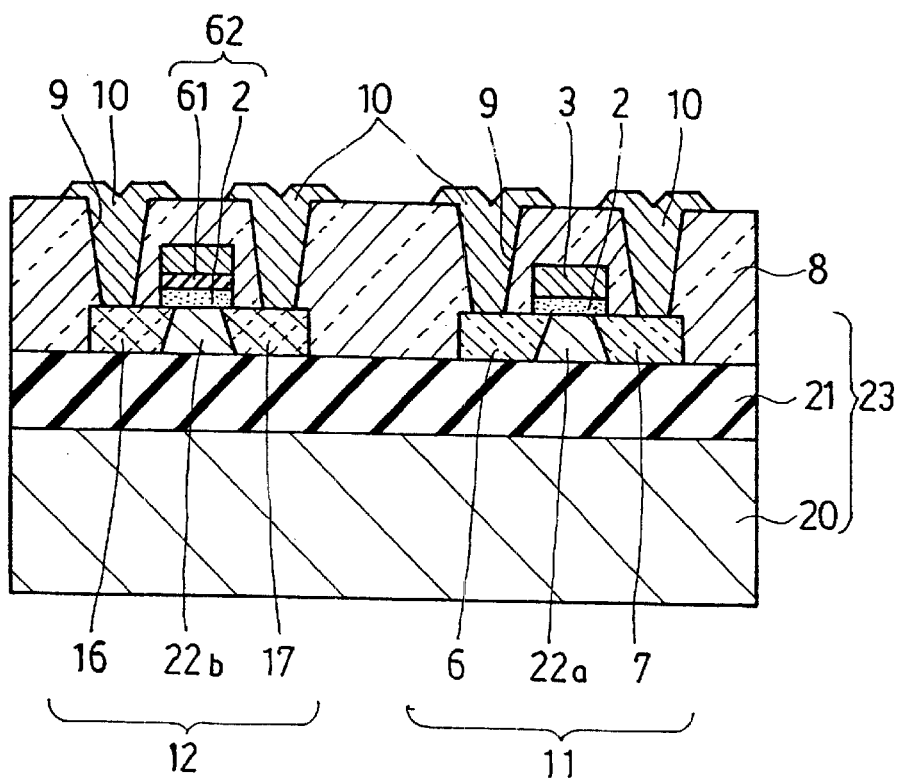

Sixth Embodiment of a Semiconductor Device: FIG. 6

Now, the structure of the sixth embodiment of a semiconductor device according to the invention is described with reference to the schematic cross sectional view shown in FIG. 6.

The semiconductor device shown in FIG. 6 is of the same structure as that for the second embodiment shown in FIG. 2 except that a gate insulating film of an N channel MOS device 11 is made up of only a gate oxide film 2 composed of a silicon dioxide film.

In the sixth embodiment of the invention, the gate insulating film of the N channel MOS device 11 is made up of only the gate oxide film 2 while a gate insulating film 62 of a P channel MOS device 12 is made up of a dual-layer film consisting of a gate oxide film 2 and a gate silicon nitride film 61.

Even with such a structure of the semiconductor device, shift in the threshold voltage can be inhibited when the semiconductor device is put to use in a radiation environment.

In this semiconductor device, the N channel MOS device 11 and the P channel MOS device 12 are completely isolated from each other for insulation by an interlevel insulator 8 and insulating film 21.

Also, there is provided interconnections 10, ends of which are connected to a gate electrode of the respective semiconductor devices 11 and 12 via respective contact holes 9 formed in the interlevel insulator 8.

First Embodiment of a Fabrication Method: FIG. 1 and FIGS. 7 through 18

A method of fabricating the semiconductor device (the first embodiment) according to the invention, described with reference to FIG. 1, is described hereinafter as a first embodiment of a method of fabricating the semiconductor device according to the invention.

FIGS. 7 through 14 are schematic cross-sectional views showing the state of the semiconductor device and constituent materials thereof in respective steps of the method of fabricating the same. Referring to these figures and FIG. 1 showing the completed state, the first embodiment of the method of fabricating the semiconductor device is described hereinafter.

Figure 7:
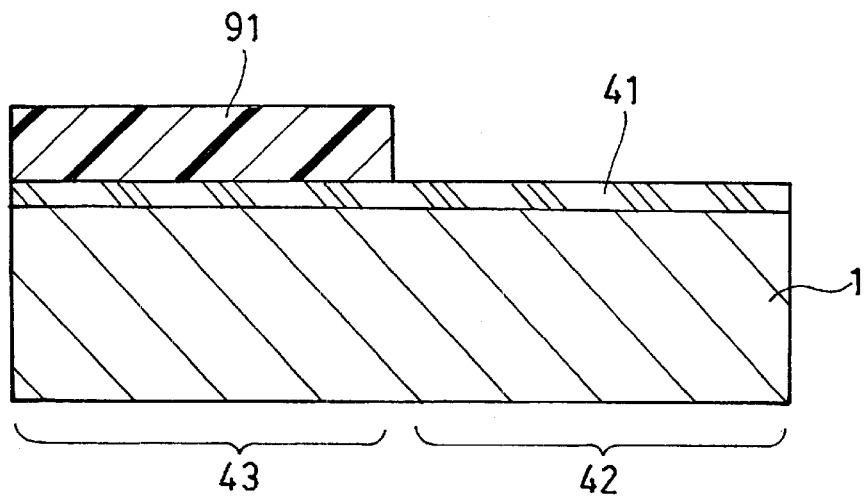
FIGS. 7 through 18 are schematic cross-sectional views showing the state of the semiconductor device and constituent materials thereof in respective steps of a fabrication process in order to describe a first embodiment of a method of fabricating the same according to the invention.

As shown in FIG. 7, oxidation treatment is applied to an n-type semiconductor substrate 1 in a water vapor oxidizing atmosphere, forming an oxide film 41 composed of a silicon dioxide film of 550 nm in thickness over the entire surface of the semiconductor substrate 1.

Subsequently, photo-resist which is a photosensitive polymer is formed on the entire surface of the oxide film 41, and exposure and development treatment is applied thereto using a predetermined photo mask, patterning a photo-resist 91 such that an opening is formed delineating an N channel region 42 where an N channel MOS device is to be formed.

The oxide film 41 is then etched by a hydrofluoric acid buffer solution using the photo-resist 91 as an etching mask. Thereafter, the photo-resist 91 used as the etching mask is removed.

Figure 8:
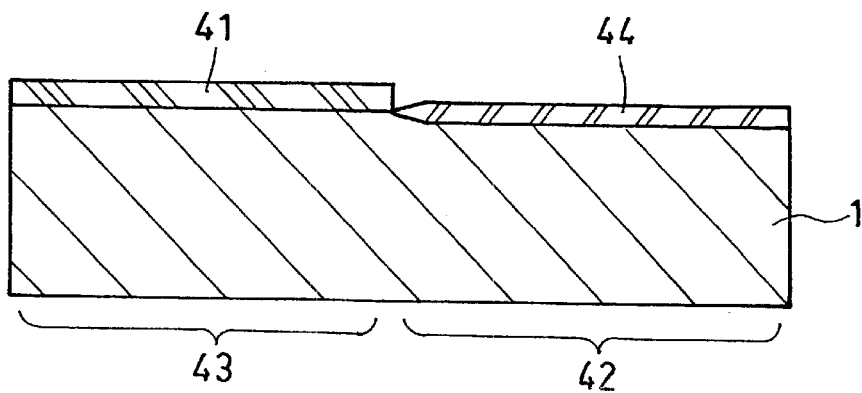

Subsequently, oxidation treatment is applied thereto in a mixed gas of oxygen and nitrogen, and as shown in FIG. 8, a first buffer oxide film 44 composed of a silicon dioxide film of 80 nm in thickness is formed.

As a result, the oxide film 41, a thick oxide film, is formed on the surface of the semiconductor substrate 1, in a P channel region 43 where a P channel MOS device is to be formed while the first buffer oxide. film 44, an oxide film thinner than the oxide film 41, is formed on the surface of the semiconductor substrate 1 in the N channel region 42.

Thereafter, ions of boron, a p-type dopant atom, are implanted at an acceleration energy of 60 KeV, and at a dopant dose on the order of $2.0 \times 10^{13}$ atoms/cm$^2$.

Such ion implantation is executed into only the N channel region 42 with the thinner oxide film formed thereon.

Thereafter, the entire surface of the oxide film 41 and the first buffer oxide film 44 are etched by use of hydrofluoric acid buffer solution, and removed.

Figure 9:
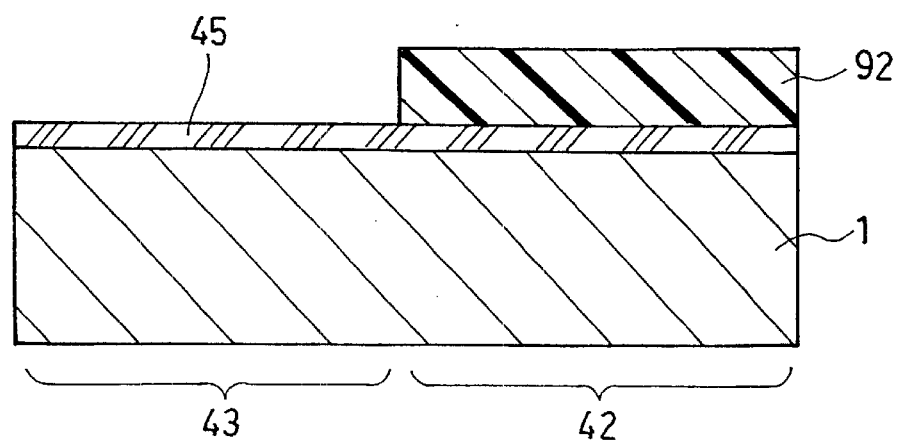

Then, oxidation treatment is applied thereto in a mixed gas of oxygen and nitrogen, and as shown in FIG. 9, a second buffer oxide film 45 composed of a silicon dioxide film of 40 nm in thickness is formed on the entire surface of the semiconductor substrate 1.

Subsequently, photo-resist is formed on the entire surface of the second buffer oxide film 45, and exposure and development treatment is applied thereto using a predetermined photo mask, patterning a photo-resist 92 in such a way as to form an opening delineating a P channel region 43.

Using the photo-resist 92 as a mask against ion implantation, ions of phosphorus, an n-type dopant atom, are implanted into the semiconductor substrate 1 in the P channel region 43 at an acceleration energy of 100 KeV, and at a dopant dose on the order of $8.0 \times 10^{13}$ atoms/cm$^2$.

Thereafter, the photo-resist 92 is removed, and further, the entire surface of the second buffer oxide film 45 is etched by use of a hydrofluoric acid buffer solution.

Figure 10:
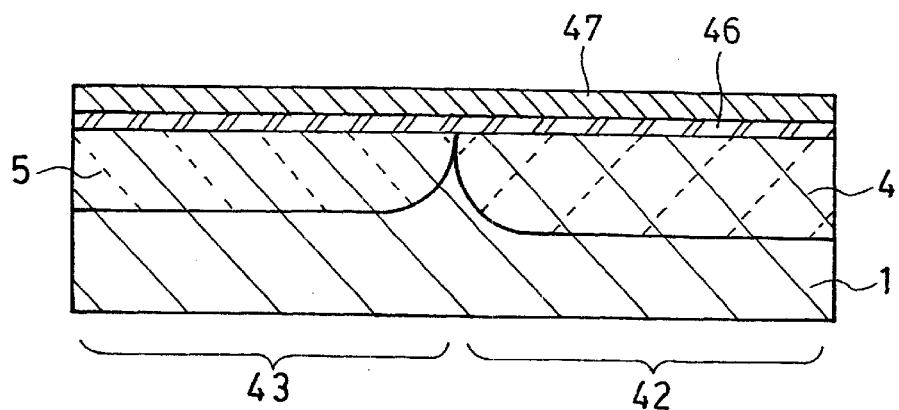

Subsequently, heat treatment is applied to the semiconductor substrate 1 in a mixed gas of oxygen and nitrogen. As a result of the heat treatment, the dopants which are ion-implanted are activated, forming a P well 4 in the N channel region 42, and an N well 5 in the P channel region 43 as shown in FIG. 10. Further, through the heat treatment, a pad oxide film 46 composed of a silicon dioxide film of 20 nm in thickness is formed on the entire surface of the semiconductor substrate 1.

Thereafter, a nitride film 47 composed of a silicon nitride film is formed on the entire surface of the pad oxide film 46 to a thickness on the order of 120 nm by means of chemical vapor deposition techniques (referred to hereinafter as the CVD process) applied at 740° C. using a gas containing dichlorosilane ($SiH_2Cl_2$) and ammonia ($NH_3$).

Figure 11:
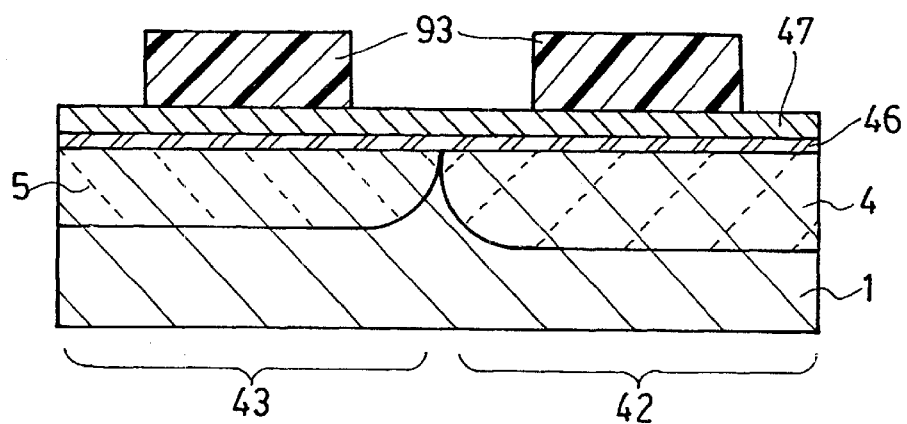

Then, a photo-resist which is photosensitive polymer is formed on the entire surface of the nitride film 47, and exposure and development treatment is applied thereto using a predetermined mask, patterning a photo-resist 93 in such a way as to form openings delineating field regions surrounding device regions as shown in FIG. 11.

The nitride film 47 is then etched and removed using the photo-resist 93 as an etching mask.

The etching of the nitride film 47 is executed by use of the dry etching method in a mixed gas containing $SF_6$, $CHF_3$, and He.

Figure 12:
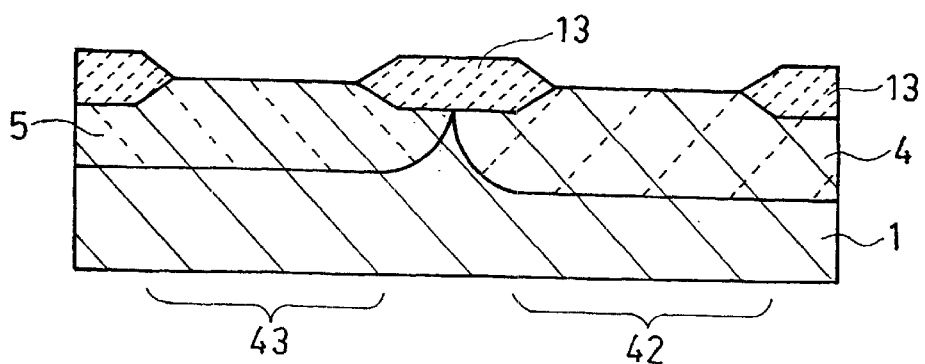

Then, by applying selective oxidation treatment so-called LOCOS (LOCal Oxidation of Silicon) process whereby the field regions around the device regions are oxidized with the use of the nitride film 47, an oxidation-resistant film, as a mask, and field oxide films 13 are formed to a thickness on the order of 700 nm as shown in FIG. 12. The selective oxidation treatment is executed by applying oxidation treatment at 1000° C. in a water vapor oxidizing atmosphere.

The nitride film 47 is then removed by use of phosphoric acid ($H_3PO_4$) heated to 180° C., and further, the pad oxide film 46 is etched by use of hydrofluoric acid buffer solution, and removed. FIG. 12 shows the state of the semiconductor substrate 1 after such removal has been made.

Figure 13:
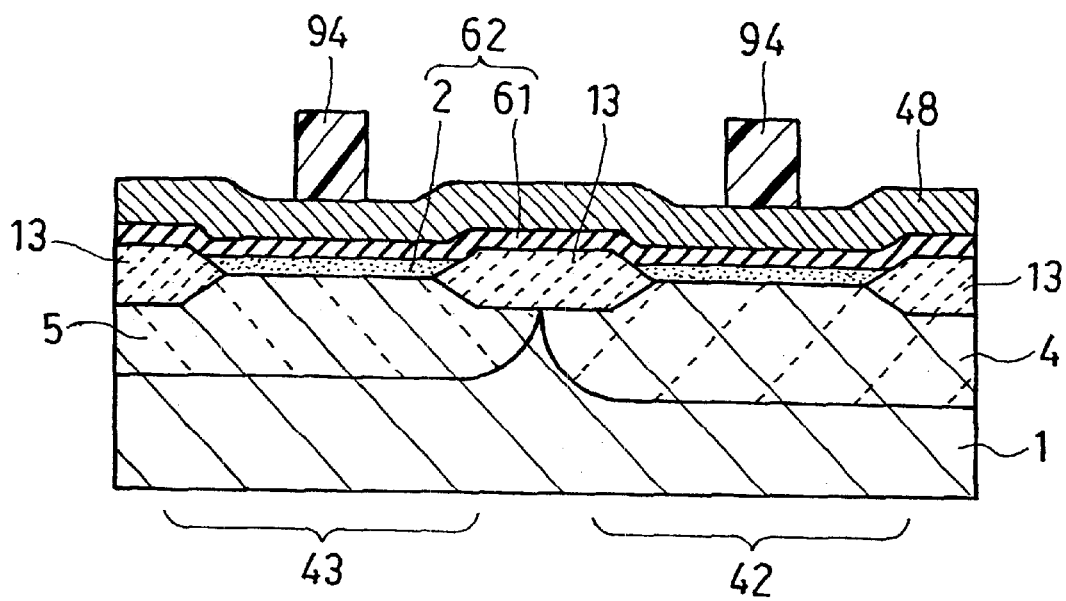

Thereafter, oxidation treatment is applied in a mixed gas of oxygen and nitrogen, and as shown in FIG. 13, a gate oxide film 2 composed of a silicon dioxide film of about 10 nm in thickness is formed on he entire surface of the semiconductor substrate 1, in the N channel region 42 as well as the P channel region 43.

Subsequently, a gate silicon nitride film 61 composed of a silicon nitride film is formed to thickness on the order of 5 nm on the entire surface of the semiconductor substrate 1 for MOS devices, including the surface of the gate oxide film 2 by means of the CVD process.

The gate silicon nitride film 61 is formed by means of the CVD process applied at 700° C. using a gas containing dichlorosilane ($SiH_2Cl_2$) and ammonia ($NH_2$).

A gate insulating film 62 is made up of a dual-layer film consisting of the gate silicon nitride film 61 and the gate oxide film 2.

Thereafter, a gate electrode material 48 composed of a polysilicon film is formed on the entire surface to a thickness on the order of 450 nm by means of the CVD process applied at 600° C. using monosilane ($SiH_4$) gas.

Subsequently, photo-resist is formed on the entire surface, and exposure and development treatment is applied by use of a predetermined photo mask, patterning photo-resists 94 in regions where gate electrodes are to be formed.

The gate electrode material 48 and gate silicon nitride film 61 are then etched by means of the dry etching method using the photo-resists 94 as etching masks, and a mixed gas of $SF_5$ and $O_2$ as an etching gas, thereby forming a pair of gate electrodes 3, 3. Thereafter, the photo-resists 94 are removed.

Figure 14:
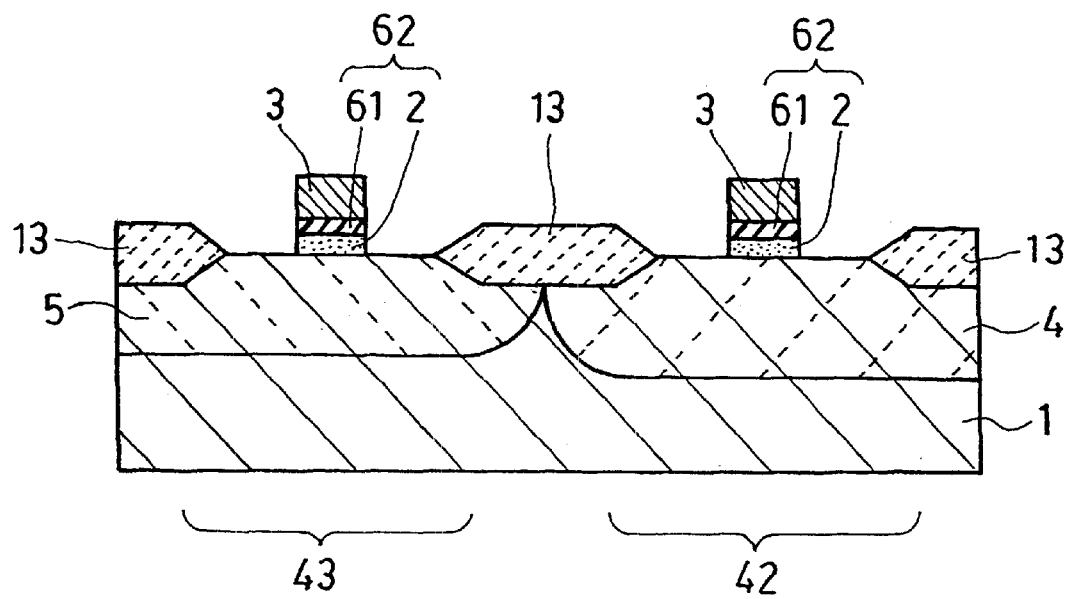

As a result, as shown in FIG. 14, the gate insulating film 62 made up of the dual-layer film consisting of the gate oxide film 2 and the gate silicon nitride film 61, formed on the surface of the semiconductor substrate 1, and the gate electrode material 48 formed on top of the gate insulating film 62 are removed, leaving intact only portions thereof on which MOS devices are to be formed (only portions where the electrodes 3 are disposed), over the N channel region 42 and the P channel region 43.

Figure 15:
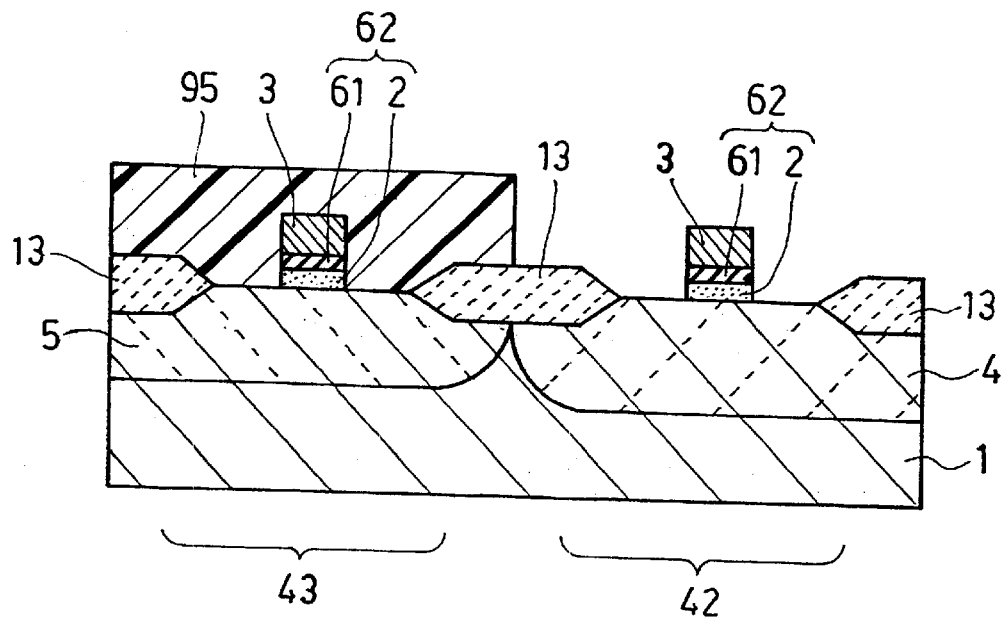

Subsequently, a photo-resist which is a photosensitive polymer is formed on the entire surface of the semiconductor substrate 1, and exposure and development treatment is applied thereto by use of a predetermined photo mask, patterning the photo-resist 95 in such a way as to form an opening delineating the N channel region 42 as shown in FIG. 15.

Thereafter, using the photo-resist 95 as a mask against ion implantation, ions of arsenic, an n-type dopant atom, are implanted at an acceleration energy of 60 KeV, and at a dopant dose on the order of $3.0 \times 10^{15}$ atoms/cm$^2$. The photo-resist 95 used as the mask against ion implantation is then removed.

Figure 16:
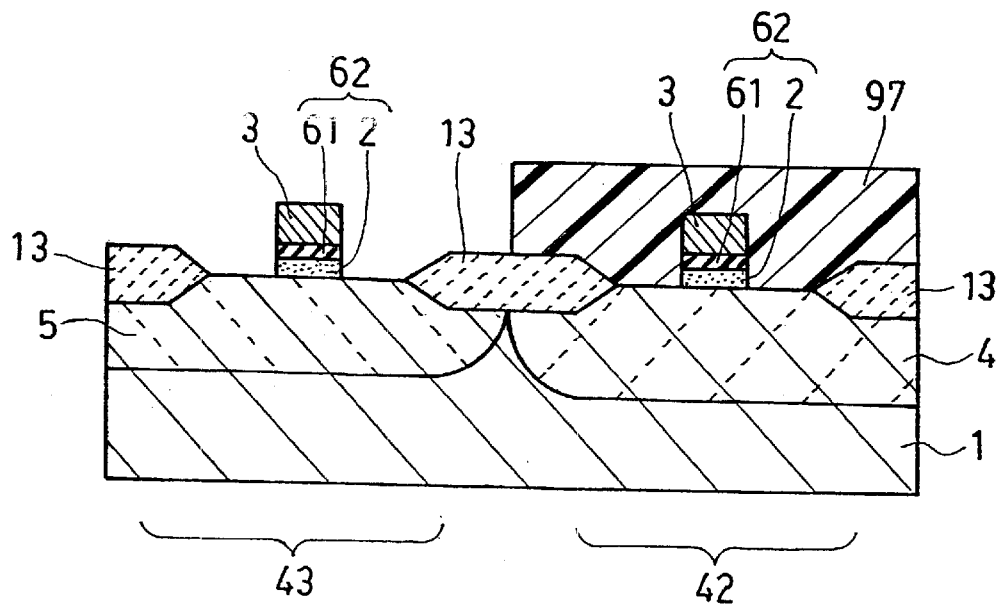

Thereafter, a photo-resist which is a photosensitive polymer is again formed on the entire surface of the semiconductor substrate 1, and exposure and development treatment is applied thereto by use of a predetermined photo mask, patterning the photo-resist 97 in such a way as to form an opening delineating the P channel region 43 as shown in FIG. 16.

Using the photo-resist 97 as a mask against ion implantation, ions of boron, a p-type dopant atom, are implanted at an acceleration energy of 40 KeV, and at a dopant dose on the order of $3.0 \times 10^{15}$ atoms/cm$^2$. The photo-resist 97 is then removed.

Figure 17:
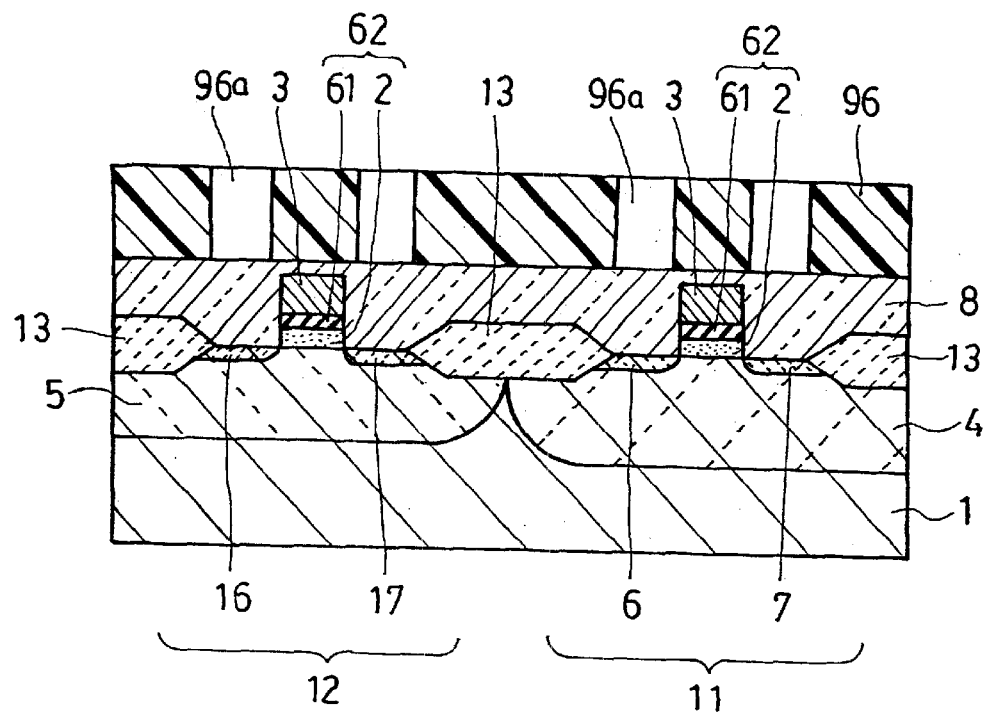

Subsequently, as shown in FIG. 17 an interlevel insulator 8 composed primarily of a silicon dioxide film is formed on the entire surface.

Annealing at 900° C. is then applied thereto in a nitrogen atmosphere for activation of the ion-implanted dopants, and concurrently for effecting reflow of the interlevel insulator 8.

As a result, a source 6 and a drain 7, composed of a highly doped n-type layer of the N channel MOS device 11, as well as a source 16 and drain 17, composed of a highly doped p-type layer of the P channel MOS device 12, are formed.

Thereafter, a photo-resist 96 is formed on the entire surface of the interlevel insulator 8, and exposure and development treatment is applied thereto using a predetermined photo mask, forming openings 96a in regions where contact holes for interconnection are to be formed as shown in FIG. 17.

Figure 18:
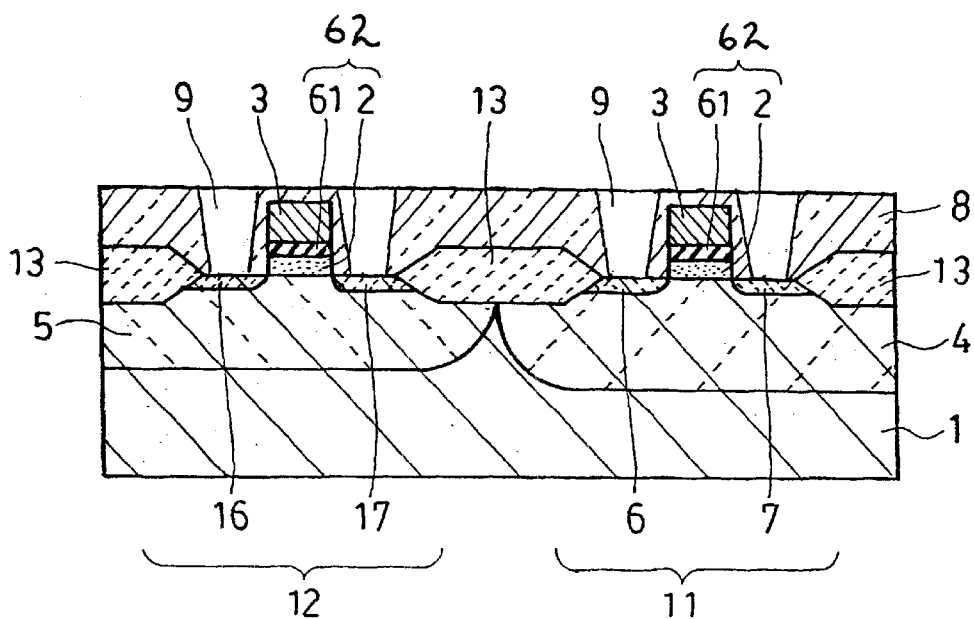

The interlevel insulator 8 is then etched using the photo-resist 96 as an etching mask, forming the contact holes 9 as shown in FIG. 18. The etching for forming the contact holes 9 is executed by the dry-etching system using a mixed gas containing $C_2F_6$, He, and $CHF_3$ as an etching gas.

The photo-resist 96 used as the etching mask is then removed.

Subsequently, interconnecting material made primarily of aluminum is applied to the entire surface (including the inside of the contact holes 9), and photo-resist for forming interconnections is formed thereon.

Thereafter, the interconnecting material is etched using the photo-resist as an etching mask, providing the interconnections 10 shown in FIG. 1.

The etching of the wiring material is executed by the dry-etching process using a mixed gas containing $BCl_3$, $CHCl_3$, $Cl_2$, and $N_2$ as an etching gas.

The semiconductor device shown in FIG. 1, comprising the N channel MOS device 11 and the P channel MOS device 12, is thus completed.

Second Embodiment of a Fabrication Method: FIG. 2 and FIGS. 19 through 28

A method of fabricating the semiconductor device (the second embodiment) according to the invention, described with reference to FIG. 2, is described hereinafter as a second embodiment of a method of fabricating the semiconductor device according to the invention.

FIGS. 19 through 28 are schematic cross sectional views showing the state of the semiconductor device and constituent materials thereof in respective steps of the method of fabricating the same. Referring to these figures and FIG. 2 showing the completed state, the second embodiment of the method of fabricating, the semiconductor device is described hereinafter.

Figure 19:
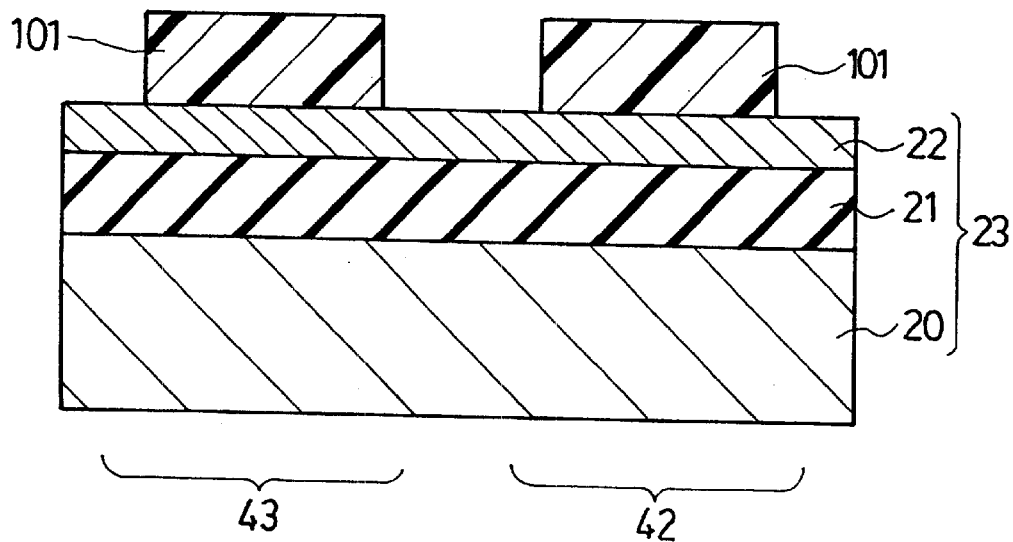
FIGS. 19 through 28 are schematic cross-sectional views showing the state of the semiconductor device and constituent materials thereof in respective steps of a fabrication process in order to describe a second embodiment of a method of fabricating the same according to the invention.

As shown in FIG. 19, an SOI substrate 23 comprising a supporting substrate 20, an insulating film 21, and a semiconductor layer 22 is employed in this embodiment.

Photo-resist is formed on the entire surface of the SOI substrate 23. Exposure and development treatment is then applied thereto using a predetermined photo mask, patterning a photo-resist 101 over an N channel region 42 where an N channel MOS device is to be formed, and a P channel region 43 where a P channel MOS device is to be formed, respectively.

Then, the semiconductor layer 22 is etched using the photo-resists 101 as etching masks.

The semiconductor layer 22 is etched by use of the dry-etching system in a mixed gas containing $SF_6$ and $O_2$. Thereafter, the photo-resists 101 used as the etching masks are removed.

Figure 20:
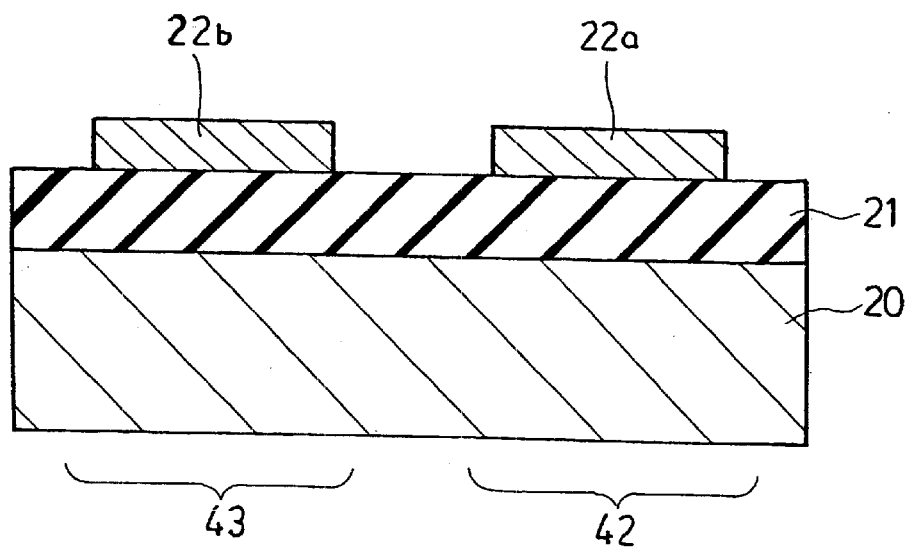

As a result, as shown in FIG. 20, the semiconductor layer 22 on the SOI substrate 23 is patterned into a first semiconductor layer 22a in an island-like shape, formed over an N channel region 42, and a second semiconductor layer 22b in an island-like shape, formed over a P channel region 43, respectively.

Figure 21:
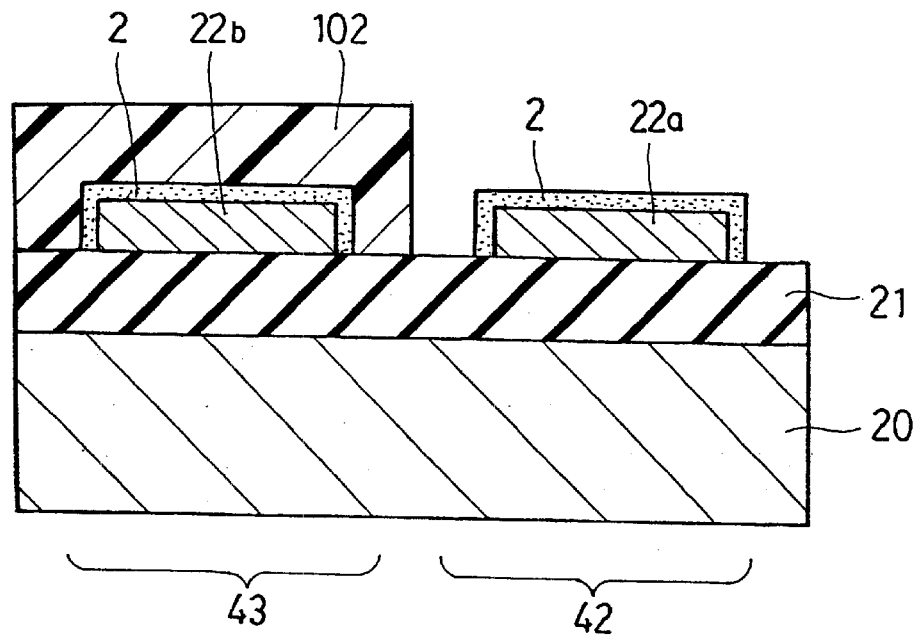

Subsequently, oxidation treatment is applied to the SOI substrate 23 in a mixed gas of oxygen and nitrogen, and as shown in FIG. 21, a gate oxide film 2 composed of a silicon dioxide film of about 10 nm in thickness is formed on the entire surface of the first and second semiconductor layers 22a, 22b.

Thereafter, photo-resist is formed on the entire surface of the SOI substrate, and exposure and development treatment is applied thereto using a predetermined photo mask, patterning a photo-resist 102 in such a way as to form an opening delineating the N channel region 42.

Then, using the photo-resist 102 as a mask against ion implantation, ions of boron, a p-type dopant atom, are implanted into the first semiconductor layer 22a in the N channel region 42 at an acceleration energy of 25 KeV, and at a dopant dose on the order of $2.0 \times 10^{13}$ atoms/cm$^2$. The photo-resist 102 used as the mask against ion implantation is then removed.

Figure 22:
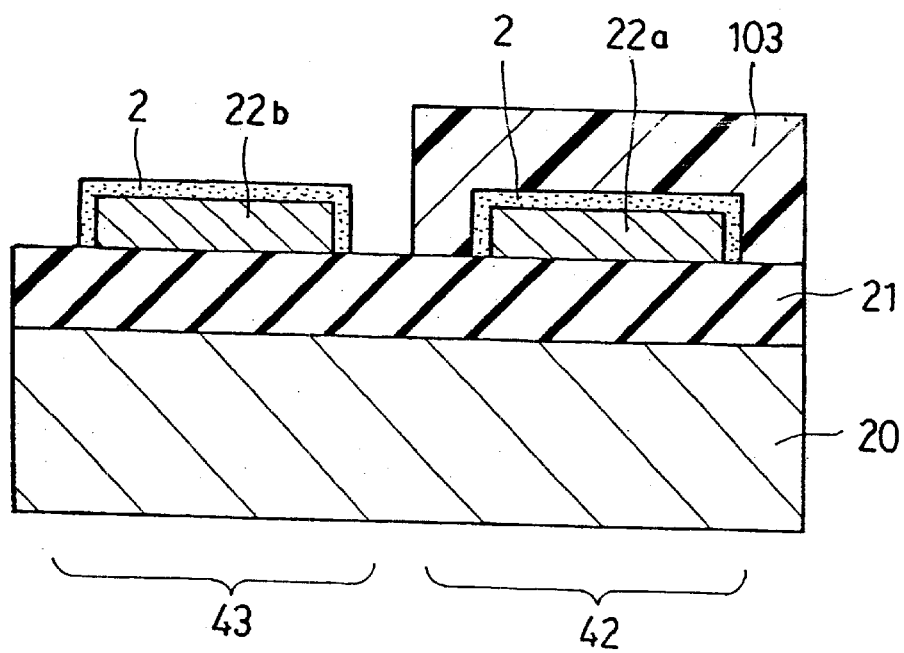

Subsequently, photo-resist is formed again on the entire surface of the SOI substrate 23, and an exposure and development treatment is applied thereto using a predetermined photo mask, patterning a photo-resist 103 in such a way as to form an opening delineating the P channel region 43 as shown in FIG. 22.

Using the photo-resist 103 as a mask against ion implantation, ions of phosphorous, an n-type dopant atom, are implanted into the second semiconductor layer 22b in the P channel region 43 at an acceleration energy of 30 KeV, and at a dopant dose on the order of $8.0 \times 10^{12}$ atoms/cm$^2$. The photo-resist 103 used as the mask against ion implantation is then removed.

Figure 23:
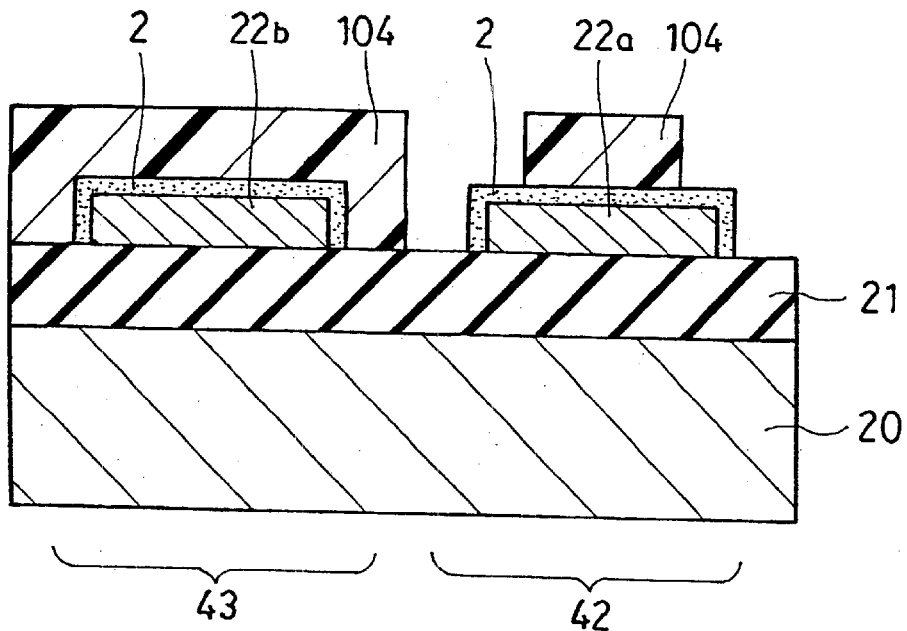

Thereafter, photo-resist is formed on the entire surface of the SOI substrate 23, and exposure and development treatment is applied thereto using a predetermined photo mask, patterning a photo-resist 104 in such a way as to form openings delineating the opposite ends of the first semiconductor layer 22a in the N channel region 42 where an N channel MOS device is to be formed as shown in FIG. 23.

Using the photo-resist 104 as a mask against ion implantation, ions of boron, a p-type dopant atom are implanted into the opposite ends of the first semiconductor layer 22a in the N channel region 42 at an acceleration energy of 25 KeV, and at a dopant dose on the order of $6.0 \times 10^{13}$ atoms/cm$^2$. The photo-resist 104 used as the mask against ion implantation is then removed.

Figure 24:
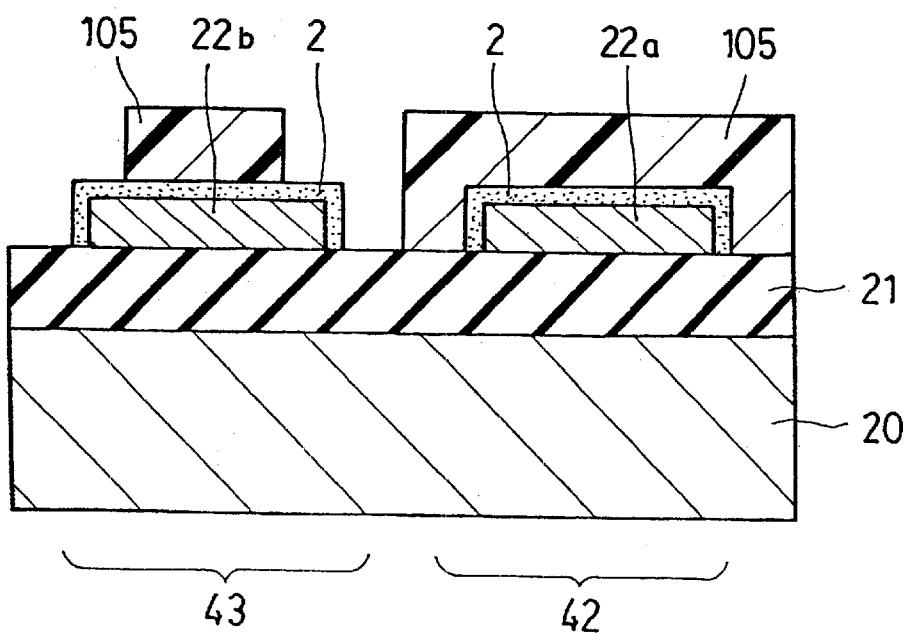

Subsequently, photo-resist is formed again on the entire surface of the SOI substrate, and exposure and development treatment is applied thereto using a predetermined photo mask, patterning a photo-resist 105 in such a way as to form openings delineating the opposite ends of the second semiconductor layer 22b in the P channel region 43 where a P channel MOS device is to be formed as shown in FIG. 24.

Using the photo-resist 105 as a mask against ion implantation, ions of phosphorus, an n-type dopant atom, are implanted into the opposite ends of the second semiconductor layer 22b in the P channel region 43 at an acceleration energy of 30 KeV, and at a dopant dose on the order of $2.0 \times 10^{13}$ atoms/cm$^2$. The photo-resist 105 used as the mask against ion implantation is then removed.

Doped layers for prevention of surface inversion are formed by ion implantation into the opposite ends of the semiconductor layer 22a and 22b, respectively, raising the threshold voltages of parasitic MOS structures formed in these regions so that participation by the parasitic MOS structures can be prevented.

Figure 25:
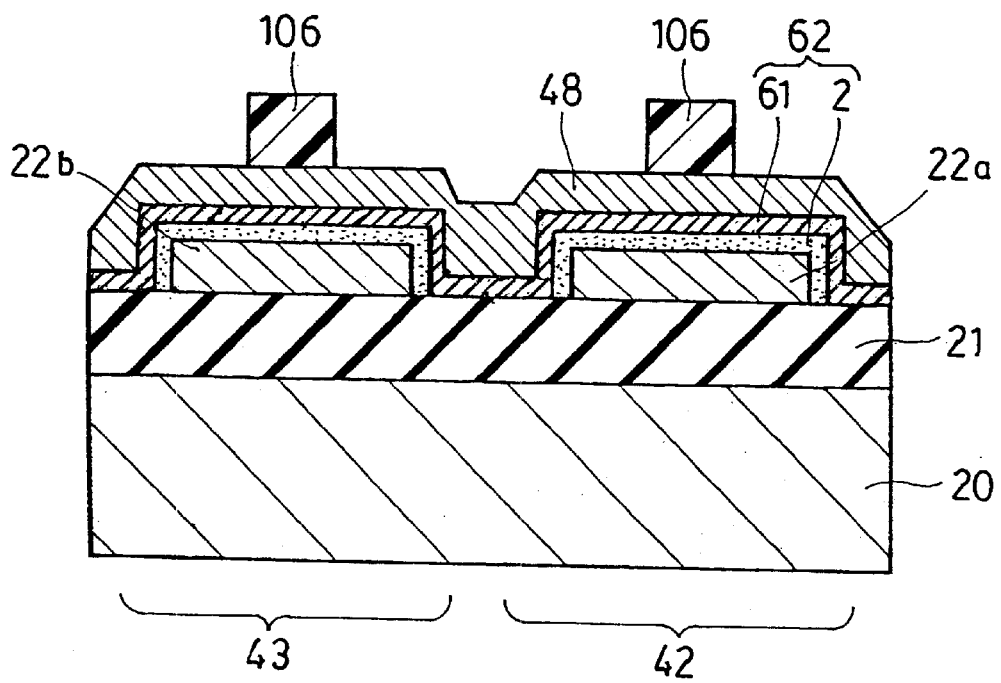

Thereafter, as shown in FIG. 25, a gate silicon nitride film 61 composed of a silicon nitride film is formed by means of the CVD method to a thickness on the order of 5 nm on the entire surface of the gate oxide film 2 formed on the entire surface of the semiconductor layers 22a and 22b, respectively.

The gate silicon nitride film 61 is formed by means of the CVD process applied at 700° C. using a gas containing dichlorosilane ($SiH_2Cl_2$) and ammonia ($NH_3$).

The gate insulating film 62 is made up of a dual-layer film consisting of the gate silicon nitride film 61 and the gate oxide film 2.

Thereafter, a gate electrode 48, composed of a polysilicon film is formed to a thickness on the order of 450 nm on the entire surface of the gate insulating film 62 by means of the CVD process applied at 600° C. using a monosilane ($SiH_4$) gas.

Photo-resist is then formed on the entire surface of the gate electrode material 48, and exposure and development treatment is applied thereto using a predetermined photo mask, patterning a photo-resist 106 only in regions where gate electrodes are to be formed.

Subsequently, the gate electrode material 48 and the gate silicon nitride film 61 are etched by means of the dry-etching system using the photo-resists 106 as etching masks, and a mixed gas of $SF_5$, and $O_2$ as the etching gas. The photo-resists 106 used as the etching masks are then removed.

Figure 26:
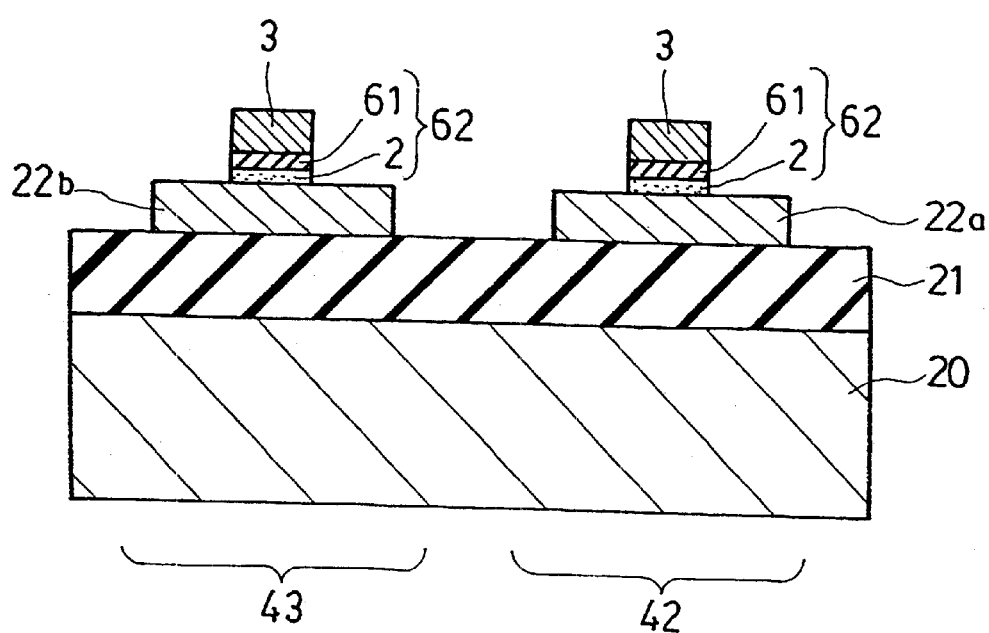

As a result, as shown in FIG. 26, two MOS devices are formed, each made up of the gate insulating film 62 composed of a dual-layer film consisting of the gate oxide film 2 and the gate silicon nitride film 61, formed on the semiconductor layer 22a over the N channel region 42, and the semiconductor layer 22b over the P channel region 43, respectively, and the gate electrode 3 formed on the respective gate insulating films 62.

Figure 27:
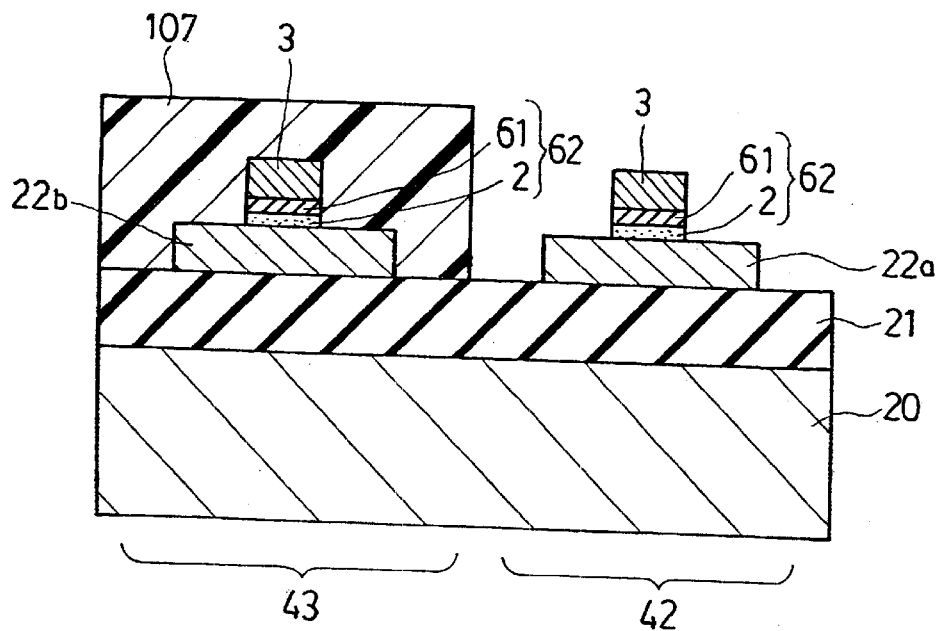

Thereafter, a photo-resist is formed on the entire surface, and an exposure and development treatment is applied thereto using a predetermined photo mask, patterning the photo-resist 107 in such a way as to form an opening delineating the N channel region 42 as shown in FIG. 27.

Using the photo-resist 107 as a mask against ion implantation, ions of arsenic, an n-type dopant atom, are implanted into exposed portions of the semiconductor layer 22a in the N channel region 42 at an acceleration energy of 40 KeV, and at a dopant dose on the order of $3.0 \times 10^{15}$ atoms/cm$^2$. The photo-resist 107 is then removed.

Subsequently, photo-resist (not shown) is formed again on the entire surface, and exposure and development treatment is applied thereto using a predetermined photo mask, patterning a photo-resist in such a way as to form an opening delineating the P channel region 43.

Using the photo-resist as a mask against ion implantation, ions of boron, a p-type dopant atom, are implanted into exposed portions of the semiconductor layer 22b at an acceleration energy of 30 KeV, and at a dopant dose on the order of $3.0 \times 10^{15}$ atoms/cm². The photo-resist is then removed.

Figure 28:
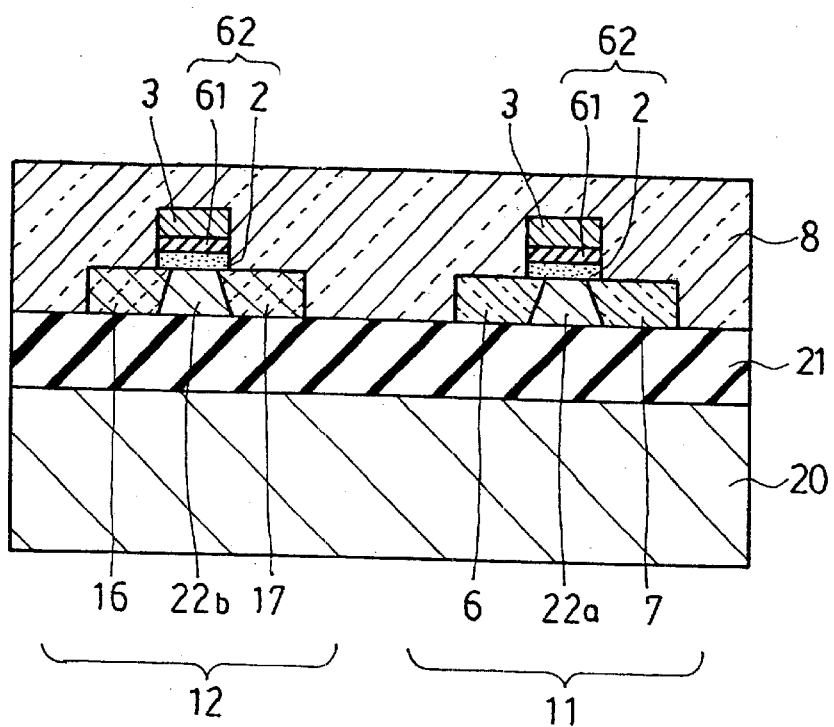

As shown in FIG. 28, an interlevel insulator 8 composed primarily of a silicon dioxide film is then formed on the entire surface.

Thereafter, annealing is applied thereto at 900° C. in a nitrogen atmosphere for activation of the ion-implanted dopants, and concurrently for effecting reflow of the interlevel insulator 8.

As a result, a source 6 and a drain 7, composed of a highly doped n-type layer of an N channel MOS device 11, are formed on the semiconductor layer 22a in the N channel region 42, and a source 16 and a drain 17, composed of a highly doped p-type layer of a P channel MOS device 12, are formed on the semiconductor layer 22b in the P channel region 43.

Thereafter, a photo-resist (not shown) to form openings delineating contact holes 9 used for interconnection is patterned on the interlevel insulator 8.

Using the photo-resist as an etching mask, the contact holes 9 shown in FIG. 2 are formed at positions corresponding to the electrodes 3, 3, the sources 6, 16, and the drains 7, 17, respectively.

Etching treatment for forming the contact holes 9 is executed by the dry-etching system using a mixed gas containing $C_2F_6$, He, and $CHF_3$ as an etching gas. The photo-resist is then removed.

Subsequently, wiring material made primarily of aluminum is applied to the entire surface of the semiconductor substrate and photo-resist for forming wiring is patterned thereon.

Thereafter, the interconnecting material is etched using the photo-resist as an etching mask, forming the interconnections 10 shown in FIG. 2.

The etching of the wiring material is executed by the dry-etching method using a mixed gas containing $BCl_3$, $CHCl_3$, $Cl_2$, and $N_2$ as an etching gas.

Thus, a semiconductor device comprising the N channel MOS device 11 and the P channel MOS device 12, formed on the SOI substrate 23, as shown in FIG. 2, is completed.

The Embodiment of a Fabrication Method: FIG. 3 and FIGS. 29 through 40

A method of fabricating the semiconductor device (the third embodiment) according to the invention, described with reference to FIG. 3, is described hereinafter as a third embodiment of a method of fabricating the semiconductor device according to the invention.

FIGS. 29 through 40 are schematic cross-sectional views showing the state of the semiconductor device and constituent materials thereof in respective steps of the method of fabricating the same. Referring to these figures and FIG. 3 showing the completed state, the third embodiment of the method of fabricating the semiconductor device is described hereinafter.

Figure 29:
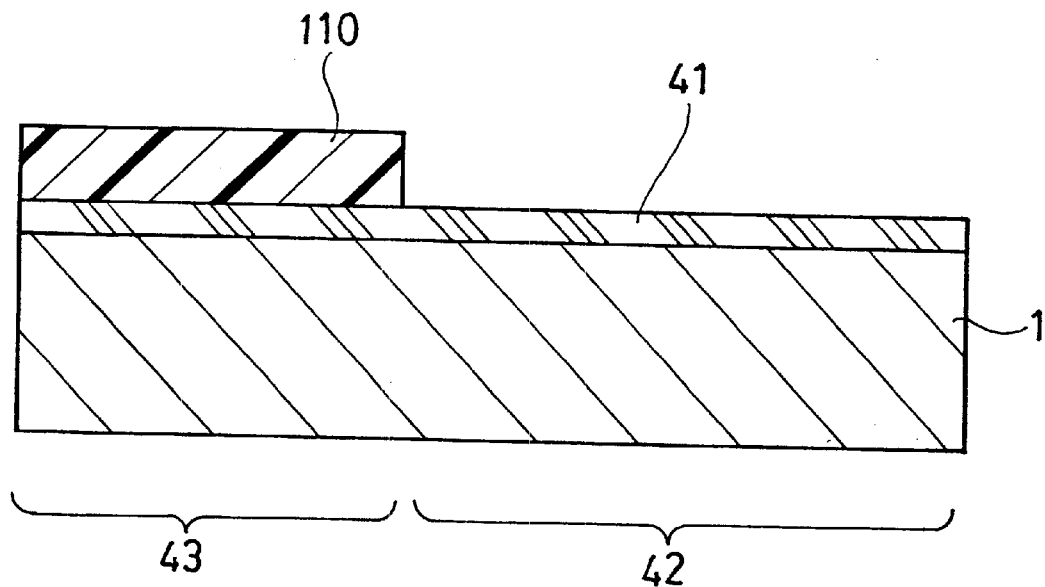
FIGS. 29 through 40 are schematic cross-sectional views showing the state of the semiconductor device and constituent materials thereof in respective steps of a fabrication process in order to describe a third embodiment of a method of fabricating the same according to the invention.

As shown in FIG. 29, an oxidation treatment is first applied to an n-type semiconductor substrate 1 in a water vapor oxidizing atmosphere, and an oxide film 41 composed of a silicon dioxide of 550 nm in thickness is formed on the entire surface thereof.

Subsequently, a photo-resist is formed on the entire surface of the oxide film 41, and exposure and development treatment is applied thereto using a predetermined photo mask, patterning the photo-resist 110 in such a way as to form an opening delineating an N channel region 42 where an N channel MOS device is to be formed.

The oxide film 41 is then etched by use of a hydrofluoric acid buffer solution, using, the photo-resist 110 as an etching mask. Thereafter, the photo-resist 110 used as the etching mask is removed.

Figure 30:
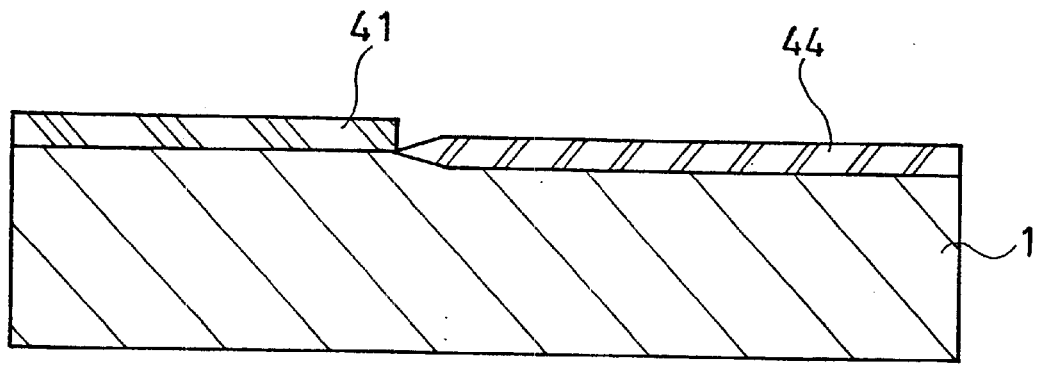

Subsequently, oxidation treatment is applied thereto in a mixed gas of oxygen and nitrogen, and as shown in FIG. 30, a first buffer oxide film 44 composed of a silicon dioxide film 80 nm thick is formed.

As a result, the oxide film 41, a thick oxide film, is formed on the surface of the semiconductor substrate 1, in a P channel region 43 where a P channel MOS device is to be formed while the first buffer oxide film 44, an oxide film thinner than the oxide film 41, is formed on the surface of the semiconductor substrate 1 in the N channel region 42. Thereafter, ions of boron, a p-type dopant atom, are implanted at an acceleration energy of 60 KeV, and at a dopant dose on the order of $2.0 \times 10^{13}$ atoms/cm².

Such ion implantation is applied to the semiconductor substrate 1 only in the N channel region 42, with the thinner oxide film formed thereon.

Thereafter, the entire surface of the oxide film 41 and the first buffer oxide film 44 are etched by use of a hydrofluoric acid buffer solution, and removed.

Figure 31:
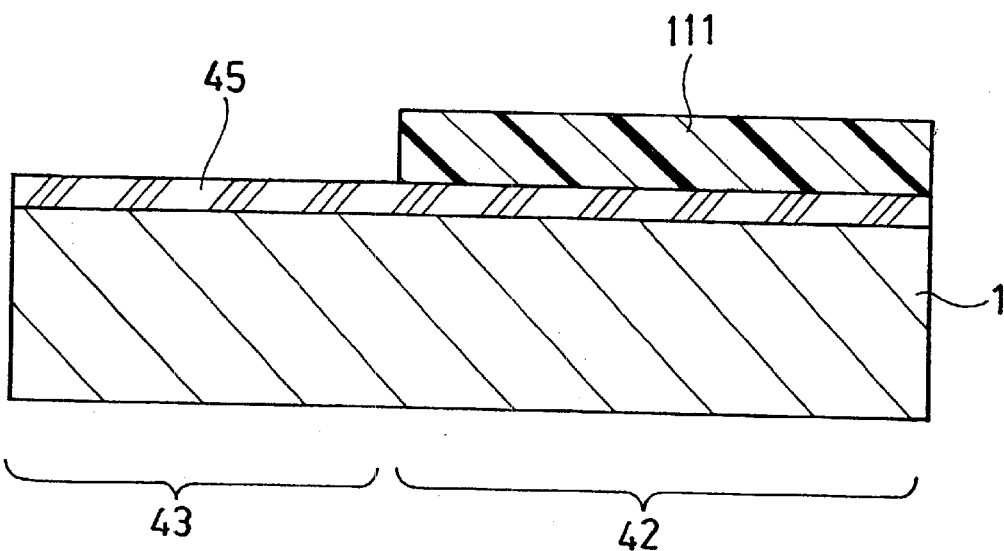

Oxidation treatment is then applied thereto in a mixed gas of oxygen and nitrogen, and as shown in FIG. 31, a second buffer oxide film 45 composed of a silicon dioxide film 40 nm thick is formed on the entire surface of the semiconductor substrate 1.

Subsequently, a photo-resist is formed on the entire surface of the second buffer oxide film 45, and an exposure and development treatment is applied thereto using a predetermined photo mask, patterning the photo-resist 11 in such a way as to form an opening delineating a P channel region 43.

Using the photo-resist 111 as a mask against ion implantation, ions of phosphorus, an n-type dopant atom are implanted into the semiconductor substrate 1 in the P channel region 43 at an acceleration energy of 100 KeV, and at a dopant dose on the order of $8.0 \times 10^{13}$ atoms/cm².

Thereafter, the photo-resist 111 is removed, and further, the entire surface of the second buffer oxide film 45 is etched by use of a hydrofluoric acid buffer solution.

Subsequently, an annealing is applied to the semiconductor substrate 1 in a mixed gas of oxygen and nitrogen. As a result of the heat treatment, the dopants which are ion-implanted are activated, forming a P well 4 in the N channel region 42, and an N well 5 in the P channel region 43.

Further, through the heat treatment, a pad oxide film 46 composed of a silicon dioxide film of 20 nm in thickness is formed on the entire surface of the semiconductor substrate 1.

The steps described in the foregoing are similar to the corresponding steps of the first embodiment of the method of fabricating the semiconductor device described with reference to FIGS. 7 through 10. However, in the third embodiment, the N channel region 42 is sufficiently larger than the P channel region 43, and consequently, the P well 4 is larger than the N well 5. This enables the P channel MOS device 11 and the MONOS device 35 to be assembled to the surface of the semiconductor substrate 1 over the P well 4 in the N channel region 42.

Figure 32:
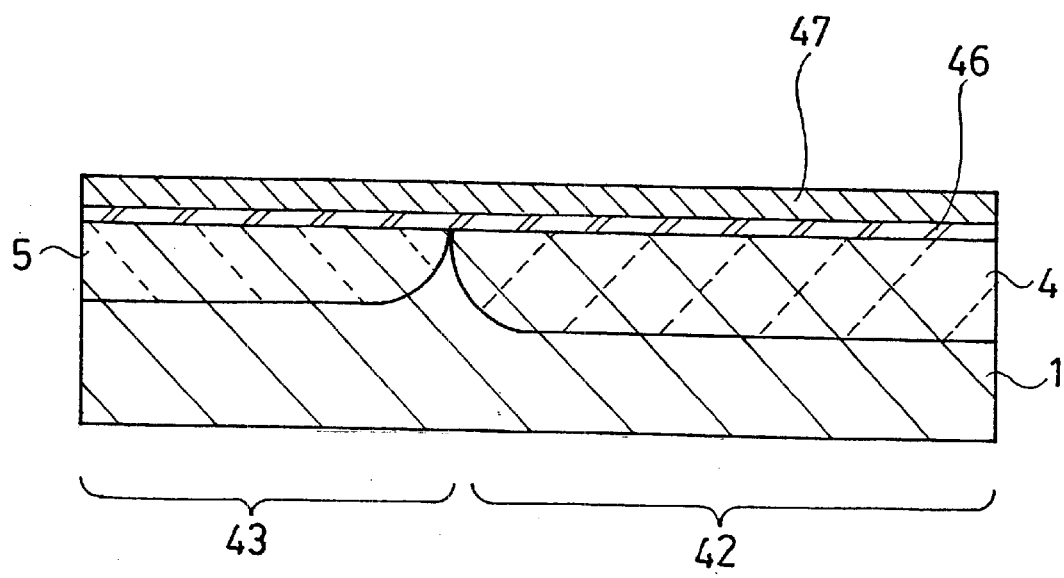

Subsequently, as shown in FIG. 32, a nitride film 47 composed of a silicon nitride film is formed on the entire surface of the pad oxide film 46 to a thickness on the order of 120 nm by means of the CVD process applied at 740° C. using a gas containing dichlorosilane ($SiH_2Cl_2$) and ammonia ($NH_3$).

Figure 33:
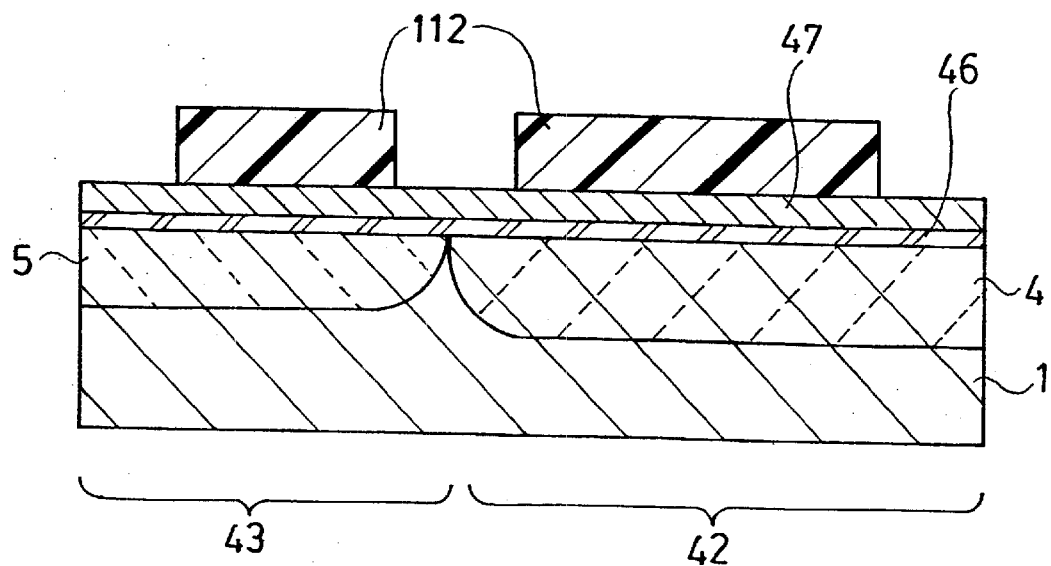

A photo-resist which is a photosensitive polymer is then formed on the entire surface of the nitride film 47, and an exposure and development treatment is applied thereto using a predetermined mask, patterning the photo-resist 112 as shown in FIG. 33 in such a way as to form openings delineating field regions surrounding device regions. The nitride film 47 is then etched using the photo-resist 112 as an etching mask.

The etching of the nitride film 47 is carried out by use of the dry-etching system in a mixed gas containing $SF_6$, $CHF_3$, and He.

Figure 34:
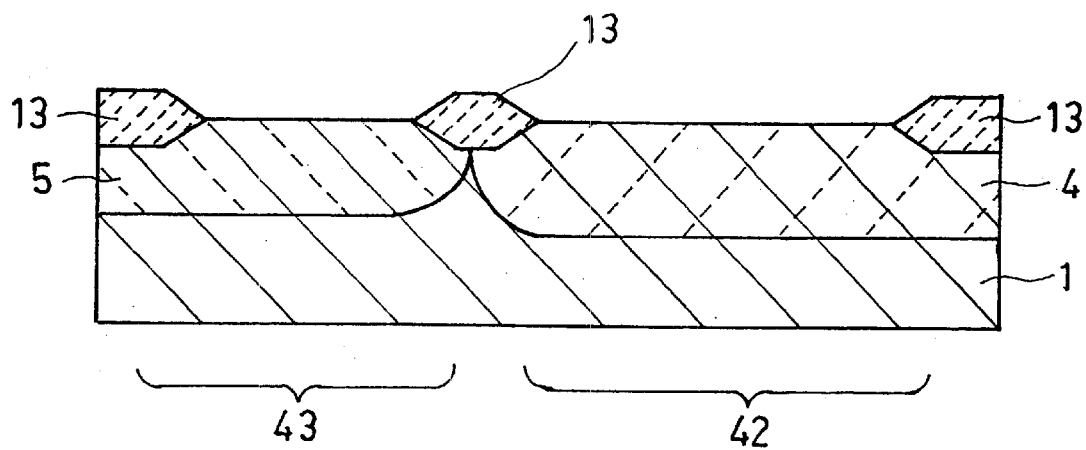

Subsequently, as shown in FIG. 34, field oxide films 13 are formed to a thickness on the order of 700 nm by applying the so-called selective oxidation treatment whereby the field regions surrounding the device regions are oxidized with the nitride film 47, an oxidation-resistant film, used as a mask.

The selective oxidation treatment is executed by applying oxidation treatment at 1000° C. in a water vapor oxidizing atmosphere.

Subsequently, the nitride film 47 is removed by use of hot phosphoric acid ($H_3PO_4$) heated to 180° C., and further, the pad oxide film 46 is etched by use of a hydrofluoric acid buffer solution, and removed. FIG. 34 shows the state of the semiconductor substrate 1 after such removal.

Figure 35:
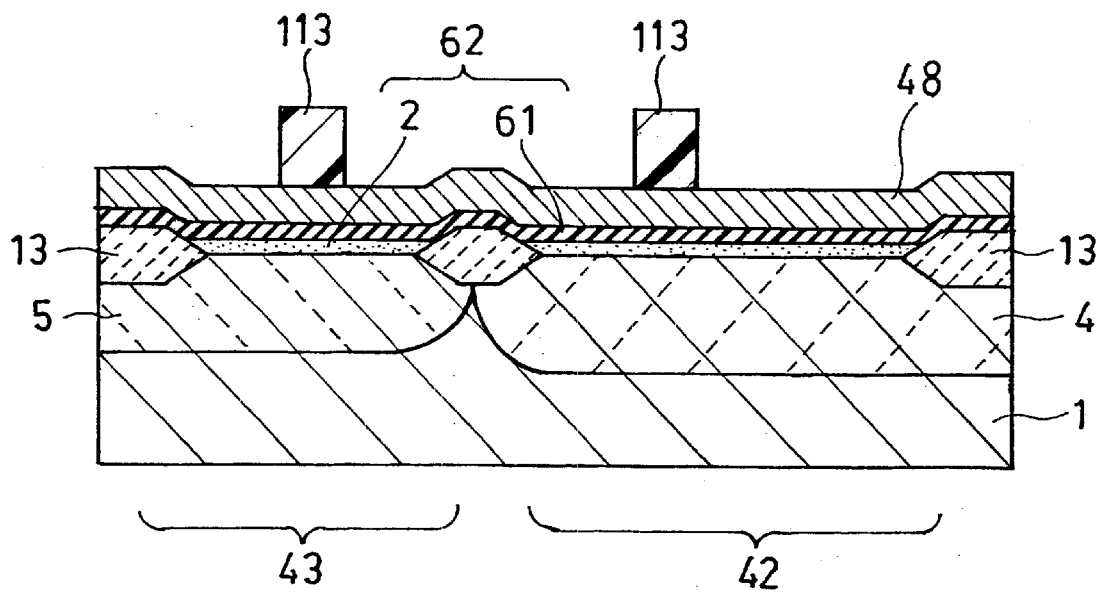

Thereafter, an oxidation treatment is applied in a mixed gas of oxygen and nitrogen, and as shown in FIG. 35, a gate oxide film 2 composed of a silicon dioxide film of about 10 nm in thickness is formed on the entire surface of the semiconductor substrate 1, in the N channel region 42 as well as P channel region 43.

Subsequently, a gate silicon nitride film 61 composed of a silicon nitride film is formed to a thickness on the order of 5 nm on the entire surface of the semiconductor substrate 1, including the surfaces of the gate oxide films 2, by means of the CVD process.

The gate silicon nitride film 61 is formed by means of the CVD process applied at 700° C. using a gas containing dichlorosilane ($SiH_2Cl_2$) and ammonia ($NH_2$).

A gate insulating film 62 is made up of a dual-layer film consisting of the gate silicon nitride film 61 and the gate oxide film 2.

Thereafter, a first gate electrode material 48 composed of a polysilicon film is formed on the entire surface to a thickness on the order of 450 nm by means of the CVD process applied at 600° C. using monosilane ($SiH_4$) gas.

Subsequently, a photo-resist is formed on the entire surface of the first gate electrode material 48, and an exposure and development treatment is applied thereto using a predetermined mask, patterning photo-resists 113 in regions where gate electrodes of a pair of MOS devices are to be formed as shown in FIG. 35.

Figure 36:
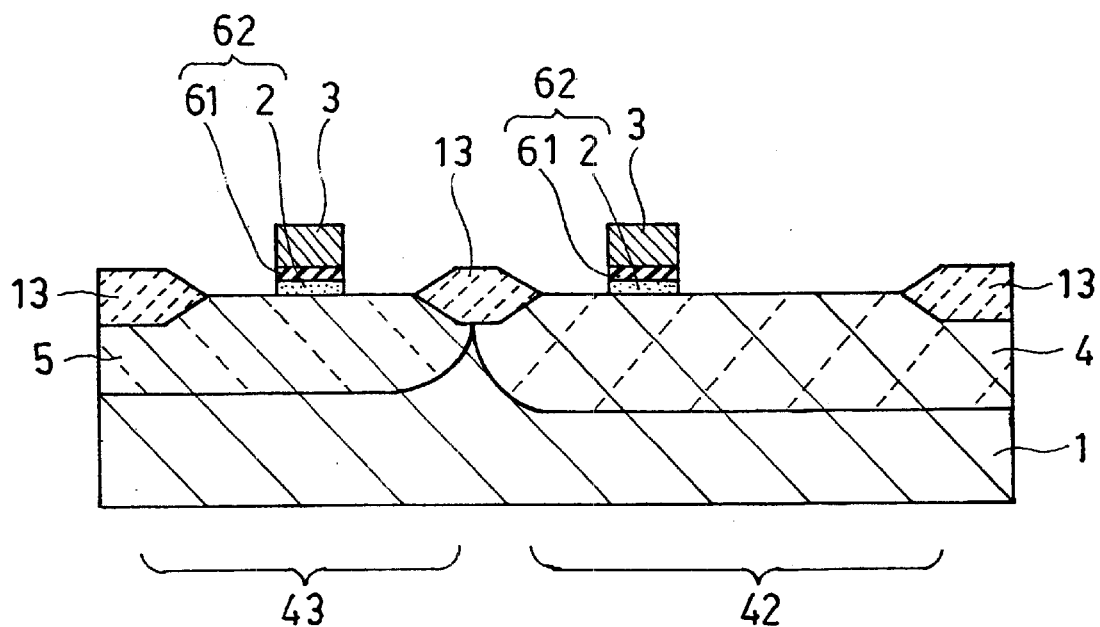

The first gate electrode material 48 and the gate silicon nitride film 61 are then etched by means of the dry-etching system using the photo-resists 113 as etching masks, and a mixed gas of $SF_6$ and $O_2$ as an etching gas, thereby forming a pair of gate electrodes 3, 3 as shown in FIG. 36.

Subsequently, the gate oxide films 2 in regions other than those matching the gate electrodes 3, 3 are removed. Such etching of the gate oxide films 2 is executed by use of a hydrofluoric acid buffer solution. Thereafter, the photo-resists 113 are removed.

As a result, the gate insulating film 62 made up of the dual-layer film consisting of the gate oxide film 2 and the gate silicon nitride film 61, formed on the surface of the semiconductor substrate 1, and the first gate electrode material 48 formed on top of the gate insulating film 62 are removed, leaving intact only portions thereof on which MOS devices are to be formed (the portions where the electrodes 3 are disposed), over the N channel region 42 and the P channel region 43.

Figure 37:
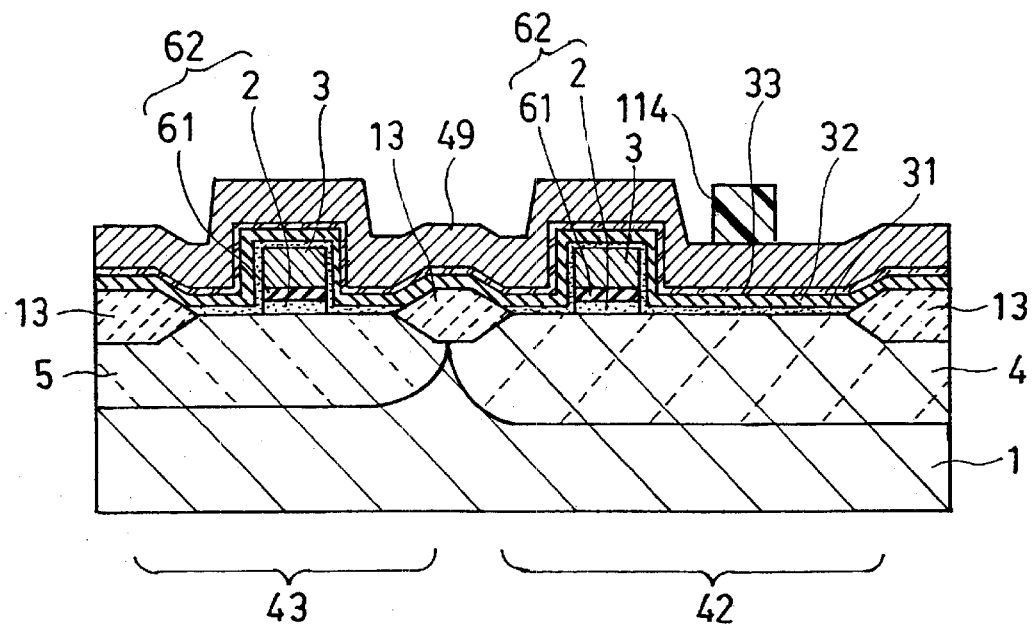

Thereafter, oxidation treatment is applied in a mixed gas of oxygen and nitrogen, and as shown in FIG. 37, a memory oxide film 31 composed of a silicon dioxide film about 2.2 nm thick is formed on the entire surface of the semiconductor substrate 1. Further, nitriding treatment is applied to the memory oxide film 31 in an ammonia ($NH_3$) atmosphere at 950° C., turning the memory oxide film 31 into a silicon nitride oxide film.

The nitriding treatment is applied in order to enhance the characteristic of the MONOS device which is a nonvolatile memory unit, for-writing and erasing data faster.

A problem has been encountered at the time of the nitriding treatment in that highly reactive $NH_3$ and $H_2$ have been diffused into the gate oxide film of the MOS device, generating positive electric charge.

However, in this embodiment of the invention, since the gate insulating film 62 is made up of the dual-layer film consisting of the gate oxide film 2 and the gate silicon nitride film 6 which is a closely packed film, diffusion of $NH_3$ and $H_2$ can be inhibited, enabling generation of positive electric charge to be suppressed.

Subsequently, a memory nitride film 32 composed of a silicon nitride film is formed to thickness on the order of 12 nm on the entire surface including that of the memory oxide film 31 by means of the CVD process.

The memory nitride film 32 is formed by means of the CVD process applied at 700° C. using a mixed gas containing dichlorosilane ($SiH_2Cl_2$) and ammonia ($NH_3$)

Further, by applying an oxidation treatment at 950° C. in a water vapor atmosphere, the memory nitride film 32 is oxidized, forming a top oxide film 33 composed of a silicon dioxide film on top of the memory nitride film 32.

As a result of the oxidation treatment, the memory nitride film 32 is formed to a thickness on the order of 9 nm, and the top oxide film 33 to thickness on the order of 4 nm.

Thereafter, a second gate electrode material 49 composed of a polysilicon film is formed to a thickness on the order of 450 nm on the entire surface by means of the CVD process applied at 600° C. using a monosilane ($SiH_4$) gas.

A photo-resist is then formed on the entire surface of the second gate electrode material 49, and an exposure and development treatment is applied thereto using a predetermined photo mask, patterning the photo-resist 114 in a region where a memory gate electrode of the MONOS device is to be formed as shown in FIG. 37.

Figure 38:
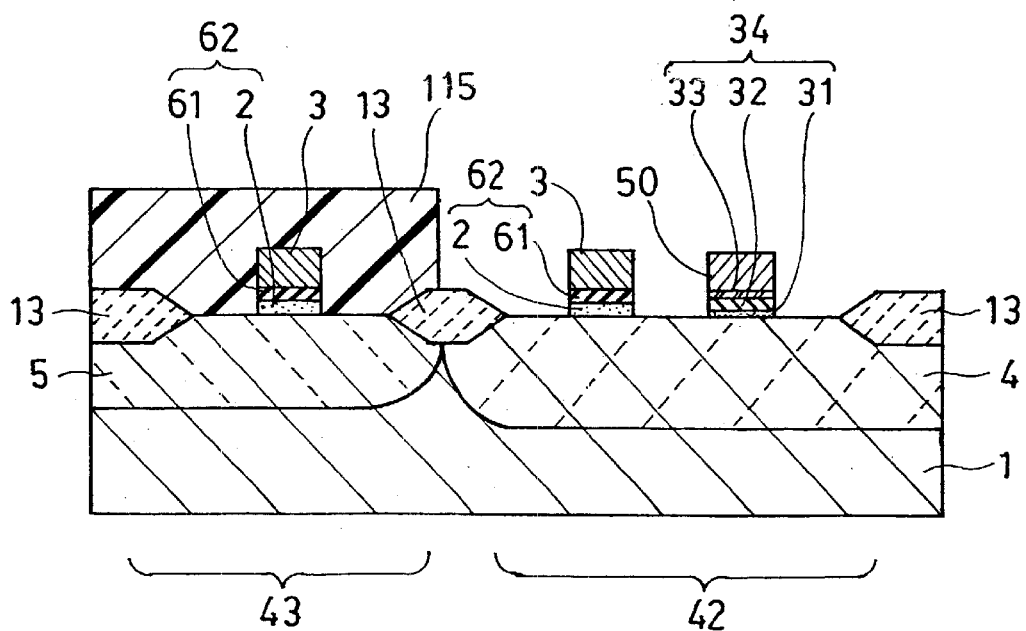

Subsequently, the second gate electrode material 49 composed of the polysilicon film is etched by means of the dry-etching system using the photo-resists 114 as an etching mask, and a mixed gas of $SF_5$ and $O_2$ as an etching gas, thereby forming the memory gate electrodes 50 as shown in FIG. 38.

Thereafter, the top oxide film 33, memory nitride film 32, and memory oxide film 31 are etched by means of the dry-etching system again using the photo-resists 114 as the etching mask, and a mixed gas of $CF_4$, He, $CBr_3$, and $O_2$ as an etching gas. The photo-resists 114 used as the etching mask are then removed.

Further, a photo-resist is formed on the entire surface, and an exposure and development treatment is applied thereto using a predetermined photo mask, patterning the photo-resist 115 in such a way as to form an opening delineating the N channel region 42.

Using the photo-resist 115 as a mask against ion implantation, ions of arsenic, an n-type dopant atom, are implanted into the P well 4 in the N channel region 42 at an acceleration energy of 60 KeV, and at a dopant dose on the order of $3.0 \times 10^{15}$ atoms/cm². Thereafter, the photo-resist 115 is removed.

Although not shown, a photo-resist is again formed on the entire surface of the semiconductor substrate 1, and an exposure and development treatment is applied thereto using a predetermined photo mask, patterning the photo-resist in such a way as to form an opening delineating the P channel region 43.

Using the photo-resist as an etching mask, ions of boron, a p-type dopant atom, are implanted at an acceleration energy of 40 KeV, and at a dopant dose on the order of $3.0 \times 10^{15}$ atoms/cm². The photo-resist is then removed.

Figure 39:
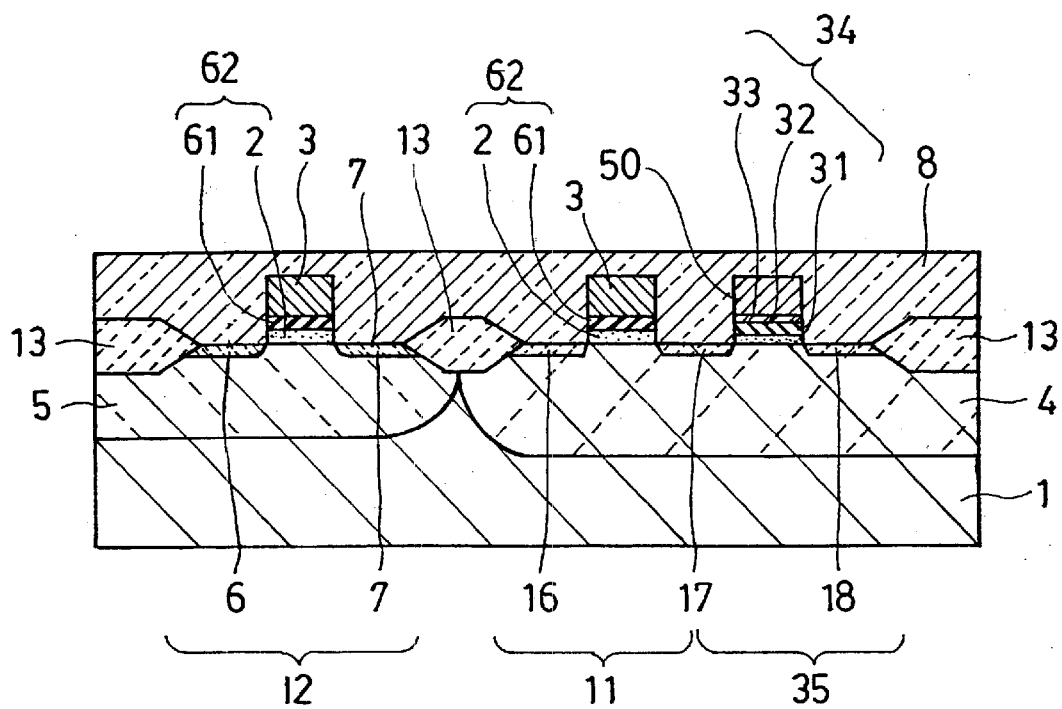

As shown in FIG. 39, an interlevel insulator 8 composed primarily of a silicon dioxide film is then formed on the entire surface.

Thereafter, annealing is applied at 900° C. thereto in a nitrogen atmosphere for activation of the ion-implanted dopants, and concurrently for effecting reflow of the interlevel insulator 8.

As a result, a source 16 and drains 17 (also acting as a source), 18, composed of the highly doped n-type layer of the N channel MOS device 11 and the MONOS device 35, respectively, and a source 6 and a drain 7 composed of the highly doped p-type layer of the P channel MOS device 12 can be formed.

Figure 40:
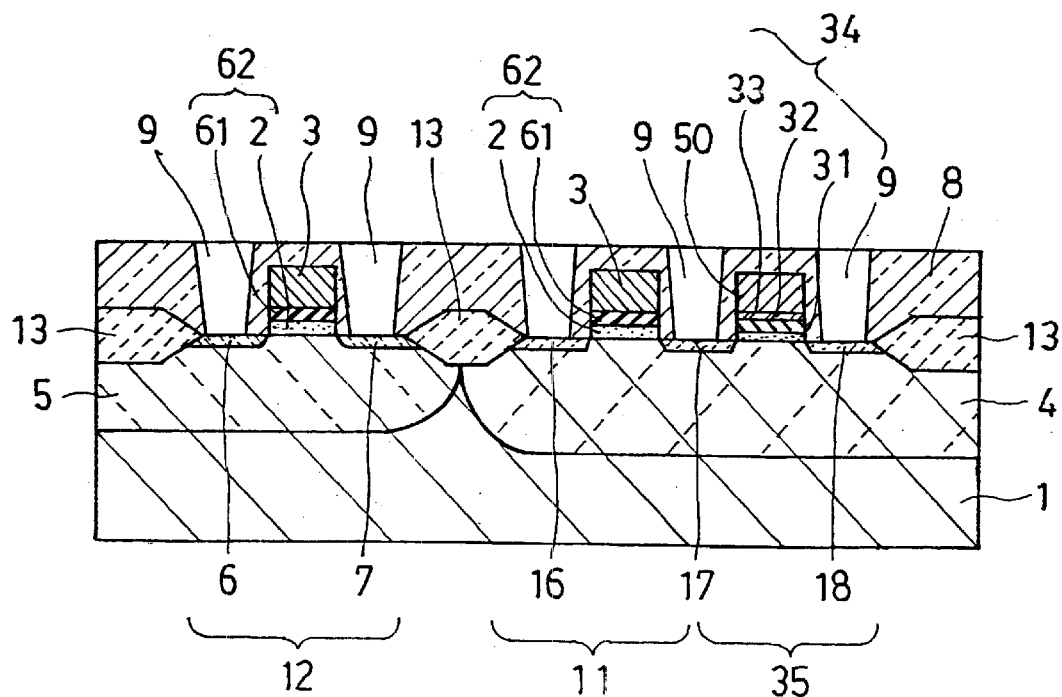

Thereafter, a photo-resist (not shown) to form openings delineating contact holes 9 used for interconnection is patterned on the interlevel insulator 8. Using the photo-resist as an etching mask, the contact holes 9 as shown in FIG. 40 are formed at positions corresponding to the gate electrodes 3, 3, 50, the sources 6, 16, 7, and the drains 7, 17, 18 of the respective semiconductor devices.

An etching treatment for forming the contact holes 9 is executed by the dry-etching system using a mixed gas containing $C_2F_6$, He, and $CHF_3$ as an etching gas. The photo-resist is then removed.

Subsequently, interconnecting material made primarily of aluminum is applied to the entire surface of the interlevel insulator 8 (including the inside of the contact holes 9) and a photo-resist for forming interconnections are patterned thereon.

Thereafter, the interconnecting material is etched using the photo-resist as an etching mask, forming the interconnections 10 shown in FIG. 3. The etching of the interconnecting material is executed by the dry-etching system using a mixed gas containing $BCl_3$, $CHCl_3$, $Cl_2$, and $N_2$ as an etching gas.

Thus, the semiconductor device shown in FIG. 3, comprising the N channel MOS device 11, P channel MOS device 12, and MONOS device 35, formed on the same semiconductor substrate 1, is completed.

Fourth Embodiment of a Fabrication Method: FIG. 4 and FIGS. 41 through 50

A method of fabricating the semiconductor device (the fourth embodiment) according to the invention, described with reference to FIG. 4, is described hereinafter as a fourth embodiment of a method of fabricating the semiconductor device according to the invention.

FIGS. 41 through 50 are schematic cross-sectional views showing the state of the semiconductor device and constituent materials thereof in respective steps of the method of fabricating the same. Referring to these figures and FIG. 4 showing the completed state, the fourth embodiment of the method of fabricating the semiconductor device is described hereinafter.

Figure 41:
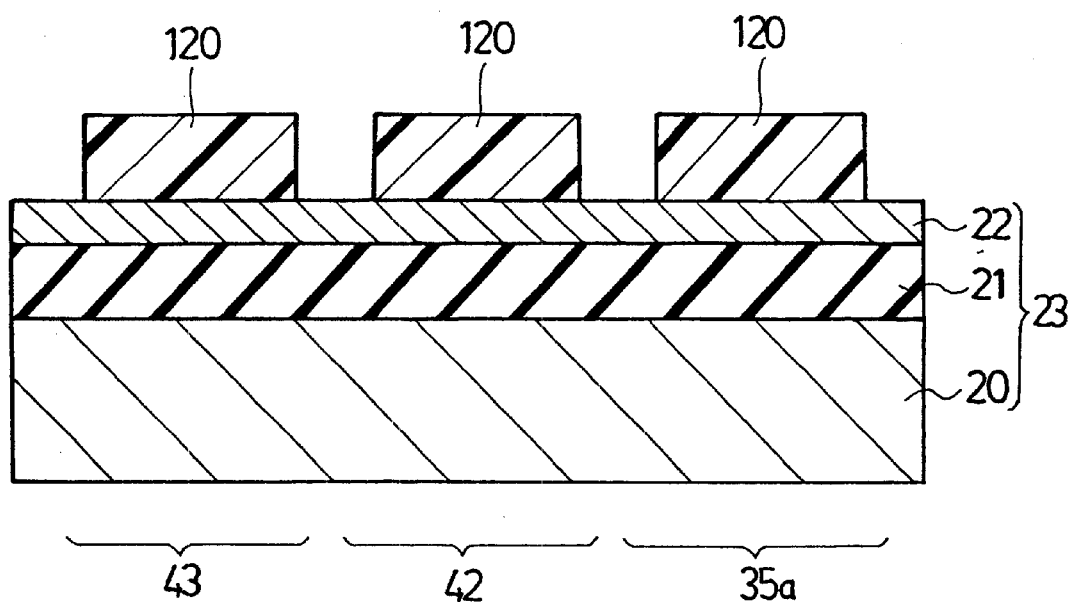
FIGS. 41 through 50 are schematic cross-sectional views showing the state of the semiconductor device and constituent materials thereof in respective steps of a fabrication process in order to describe a fourth embodiment of a method of fabricating the same according to the invention.

As shown in FIG. 41, this semiconductor device makes use of an SOI substrate 23 comprising a supporting substrate 20, an insulating film 21, and a semiconductor layer 22.

A photo-resist is formed on the entire surface of the SOI substrate 23, and an exposure and development treatment is applied thereto using a predetermined photo mask, patterning photo-resists 120 over an N channel region 42 where an N channel MOS device is to be formed, a P channel region 43 where a P channel MOS device is to be formed, and a MONOS region 35a where a MONOS device is to be formed, respectively, as shown in FIG. 41.

Figure 42:
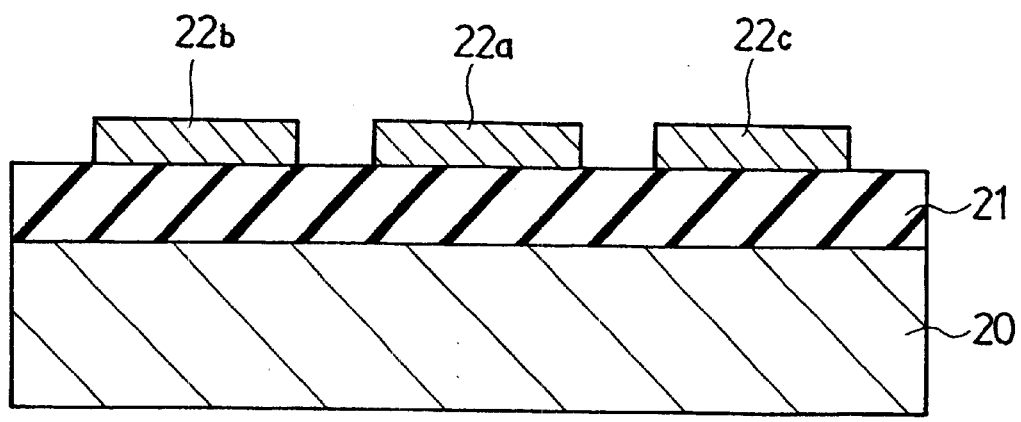

The semiconductor layer 22 is then etched using the photo-resists 120 as etching masks, and as shown in. FIG. 42, a first semiconductor layer 22a patterned in an island-like shape, a second semiconductor layer 22b patterned in an island-like shape, and a third semiconductor layer 22c patterned in an island-like shape are left intact in the N channel region 42, the P channel region 43, and the MONOS region 35a, respectively, removing the semiconductor layer 22 in all other regions. The etching of the semiconductor layer 22 is executed by means of a dry-etching system using a mixed gas containing $SF_6$ and $O_2$.

Thereafter, the photo-resists 120 used as the etching masks are removed.

Figure 43:
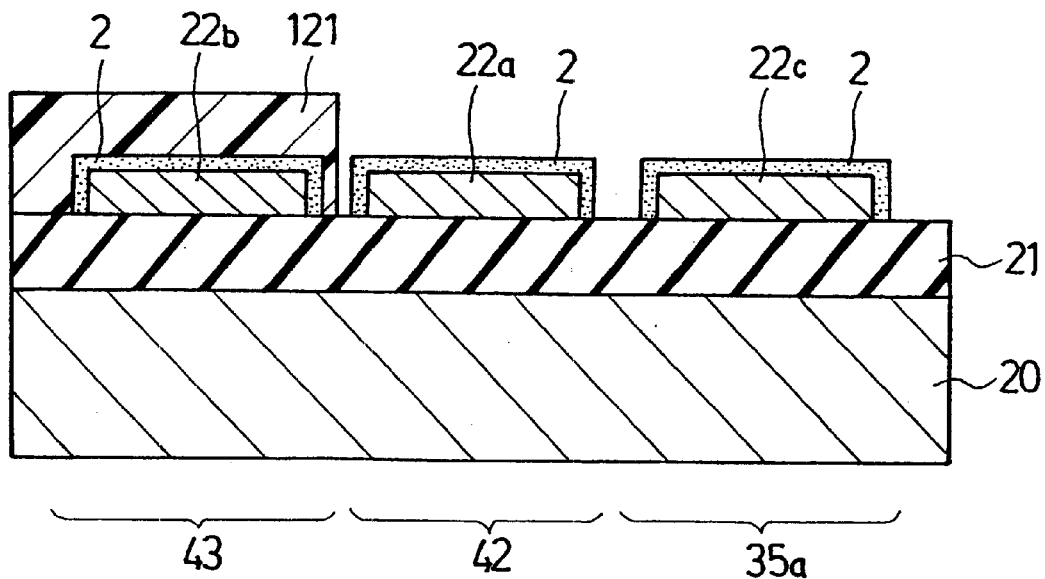

Subsequently, an oxidation treatment is applied in a mixed gas of oxygen and nitrogen, and as shown in FIG. 43, a gate oxide film 2 composed of a silicon dioxide film about 10 nm thick is formed on the entire surface of the first, second, and third semiconductor layers, 22a, 22b, and 22c, each patterned in an island-like shape, respectively.

Thereafter, a photo-resist is formed on the entire surface of the SOI substrate 23, and an exposure and development treatment is applied thereto using a predetermined photo mask, patterning the photo-resist 121 in such a way as to form an opening delineating the N channel region 42 and the MONOS region 35a.

Using the photo-resist 121 as a mask against ion implantation, ions of boron, a p-type dopant atom, are implanted into the first semiconductor layer 22a and the third semiconductor layer 22c at an acceleration energy of 25 KeV, and at a dopant dose on the order of $2.0 \times 10^{13}$ atoms/cm². Thereafter, the photo-resist 121 used as the mask against ion implantation is removed.

Figure 44:
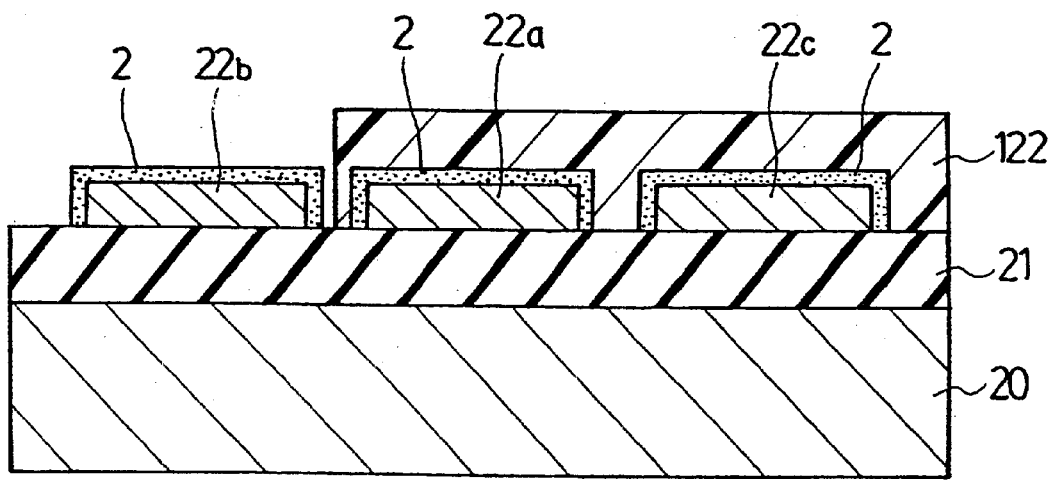

Subsequently, a photo-resist is formed again on the entire surface of the SOI substrate 23, and an exposure and development treatment is applied thereto using a predetermined photo mask, patterning the photo-resist 122 in such a way as to form an opening delineating the P channel region 43 as shown in FIG. 44.

Using the photo-resist 122 as a mask against ion implantation, ions of phosphorous, an n-type dopant atom, are implanted into the second semiconductor layer 22b at an acceleration energy of 30 KeV, and at a dopant dose on the order of $8.0 \times 10^{12}$ atoms/cm$^2$. Thereafter, the photo-resist 122 is removed.

Figure 45:
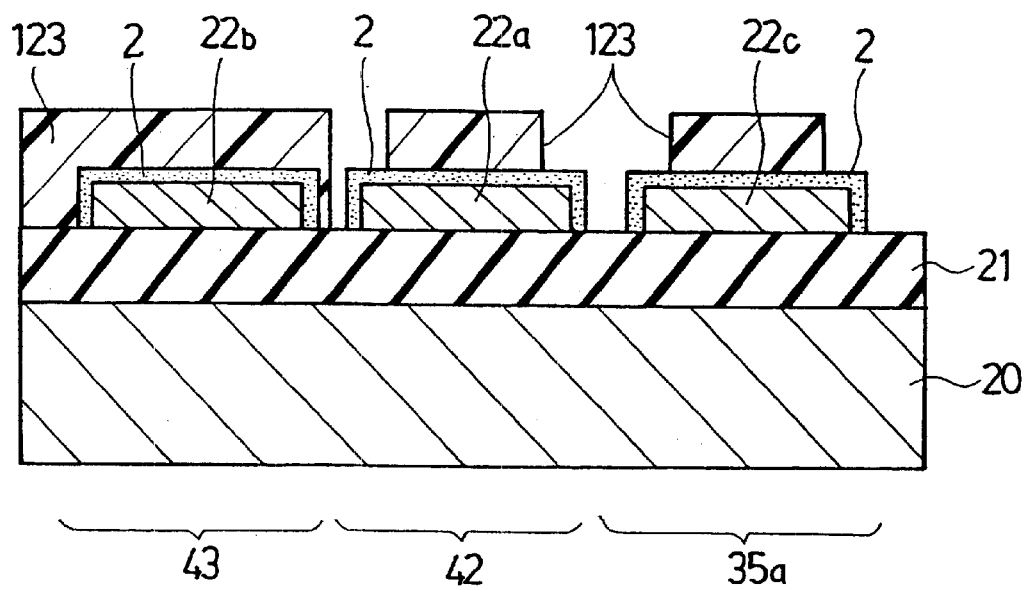

Thereafter, a photo-resist is formed again on the entire surface of the SOI substrate 23, and an exposure and development treatment is applied thereto using a predetermined photo mask, patterning the photo-resists 123 in such a way as to form openings delineating the opposite ends of the first semiconductor layer 22a in the N channel region 42 and third semiconductor layer 22c in the MONOS region 35a as shown in FIG. 45.

Then, using the photo-resists 123 as masks against ion implantation, ions of boron, a p-type dopant atom, are implanted into the opposite ends of the first semiconductor layer 22a and the third semiconductor layer 22c, respectively, at an acceleration energy of 25 KeV, and at a dopant dose on the order of $6.0 \times 10^{13}$ atoms/cm$^2$. Thereafter, the photo-resists 123 used as the masks against ion implantation are removed.

Figure 46:
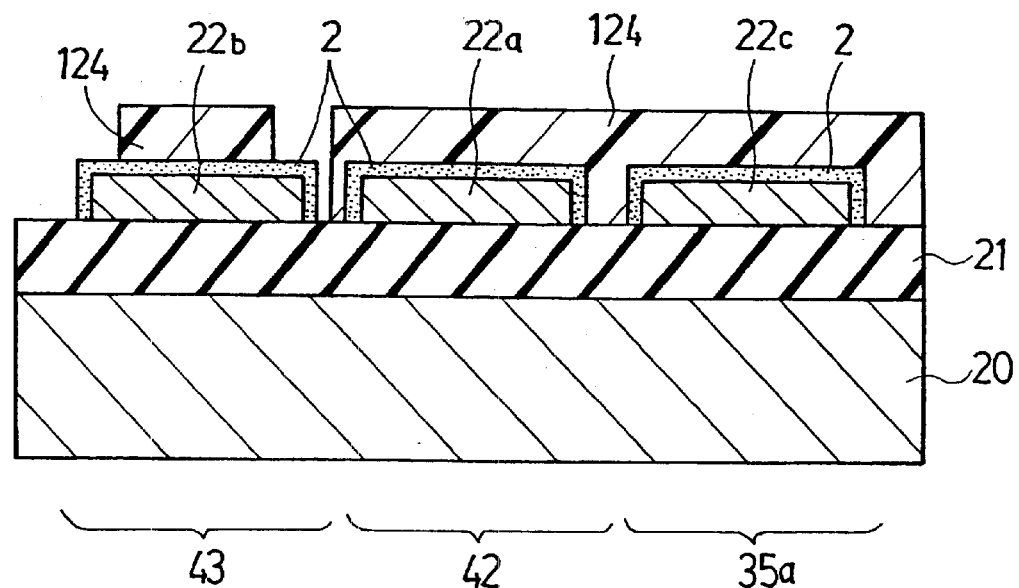

Subsequently, a photo-resist is formed again on the entire surface of the SOI substrate 23, and an exposure and development treatment is applied thereto using a predetermined photo mask, patterning the photo-resists 124 in such a way as to form openings delineating the opposite ends of the second semiconductor layer 22b in the P channel region 43 as shown in FIG. 46.

Using the photo-resists 124 as masks against ion implantation, ions of phosphorus, an n-type dopant atom, are implanted into the opposite ends of the second semiconductor layer 22b at an acceleration energy of 30 KeV, and at a dopant dose on the order of $2.0 \times 10^{13}$ atoms/cm$^2$. Thereafter, the photo-resists 124 are removed.

Doped layers for prevention of surface inversion are formed by such ion implantation into the opposite ends of the respective semiconductor layers 22a, 22b, and 22c, raising the threshold voltages of parasitic MOS structures formed in these regions so that participation by the parasitic MOS structures can be prevented.

Figure 47:
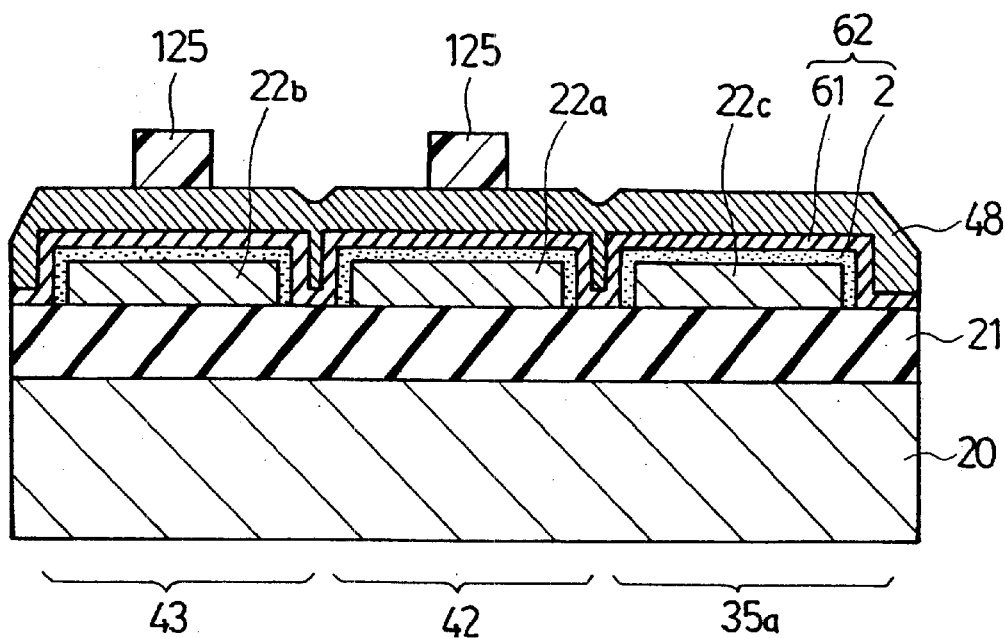

Thereafter, as shown in FIG. 47, a gate silicon nitride film 61 composed of a silicon nitride film is formed to a thickness on the order of 5 nm on the entire surface of the gate oxide film 2 formed on the entire surface of the semiconductor layers 22a, 22b, and 22c, respectively. The gate silicon nitride film 61 is formed by means of the CVD process applied at 700° C. using a gas containing dichlorosilane (SiH$_2$Cl$_2$) and ammonia (NH$_3$).

A gate insulating film 62 is made up of a dual-layer film consisting of the gate silicon nitride film 61 and the gate oxide film 2.

Thereafter, as shown in FIG. 47, a first gate electrode material 48 composed of a polysilicon film is formed to a thickness on the order of 450 nm on the entire surface by means of the CVD process applied at 600° C. using monosilane (SiH$_4$) gas.

A photo-resist is then formed on the entire surface of the first gate electrode material 48, and an exposure and development treatment is applied thereto using a predetermined photo mask, patterning the photo-resists 125 only over regions where respective gate electrodes of a pair of MOS devices are to be formed as shown in FIG. 47

Figure 48:
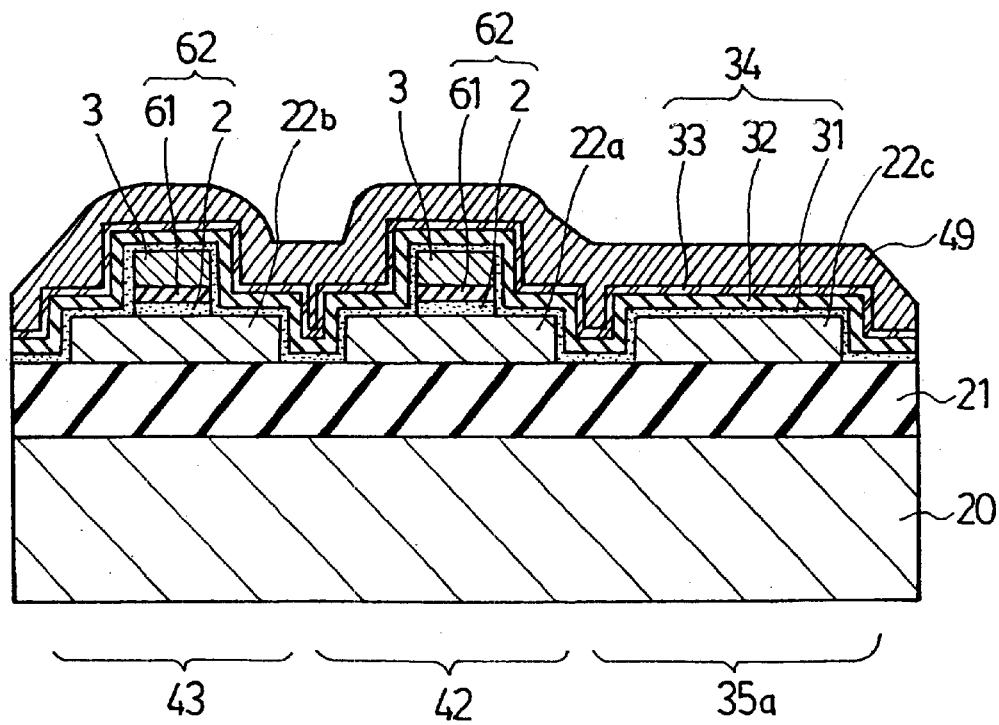

Subsequently, the first gate electrode material 48 and the gate silicon nitride film 61 are etched by means of the dry-etching system using the photo-resists 125 as etching masks, and a mixed gas of SF$_5$ and O$_2$ as an etching gas, forming a pair of gate electrodes as shown in FIG. 48.

Subsequently, the gate oxide films 2 in regions other than those matching the gate electrodes 3, 3 are removed. Such etching of the gate oxide films 2 is executed by use of a hydrofluoric acid buffer solution. The photo-resists 125 are then removed.

As a result, a pair of MOS devices are formed, each made up of the gate insulating films 62 composed of the dual-layer film consisting of the gate oxide film 2 and the gate silicon nitride film 61, formed on the surface of the first and second semiconductor layers 22a, 22b, respectively, and the gate electrode 3 formed on top of the respective gate insulating films 62.

Subsequently, an oxidation treatment is applied in a mixed gas of oxygen and nitrogen, and as shown in FIG. 48, a memory oxide film 31 composed of a silicon dioxide film about 2.2 nm thick is formed on the entire surface. Further, nitriding treatment is applied to the memory oxide film 31 in an ammonia (NH$_3$) atmosphere at 950° C., turning the memory oxide film 31 into a silicon nitride oxide film.

The nitriding treatment is applied in order to enhance the characteristic of the MONOS device which is a nonvolatile memory unit, for writing and erasing data faster.

A problem has been encountered at the time of the nitriding treatment in that highly reactive NH$_3$ and H$_2$ have been diffused into the gate oxide film of the MOS device, generating a positive electric charge. However, in this embodiment of the invention, since the gate insulating film 62 is made up of the dual-layer film consisting of the gate oxide film 2 and the gate silicon nitride film 6 which is a closely packed film, diffusion of NH$_3$ and H$_2$ can be inhibited, enabling generation of positive electric charges to be suppressed.

Subsequently, a memory nitride film 32 composed of a silicon nitride film is formed to a thickness on the order of 12 nm on the entire surface including that of memory oxide film 31 by means of the CVD process.

The memory nitride film 32 is formed by means of the CVD process applied at 700° C. using a mixed gas containing dichlorosilane (SiH$_2$Cl$_2$) and ammonia (NH$_3$)

Further, by applying oxidation treatment at 950° C. in a water vapor atmosphere, the memory nitride film 32 is oxidized, forming a top oxide film 33 composed of a silicon dioxide film on top of the memory nitride film 32. As a result of the oxidation treatment, the memory nitride film 32 is formed to a thickness on the order of 9 nm, and the top oxide film 33 to a thickness on the order of 4 nm.

Subsequently, as shown in FIG. 48, a second gate electrode material 49 composed of a polysilicon film is formed to a thickness on the order of 450 nm on the entire surface by means of the CVD process applied at 600° C. using a monosilane (SiH$_4$) gas.

Thereafter, a photo-resist (not shown) is formed on the entire surface of the second gate electrode material 49, and an exposure and development treatment is applied thereto using a predetermined photo mask, patterning the photo-resist only in a region where a memory gate electrode of the MONOS device is to be formed.

Figure 49:
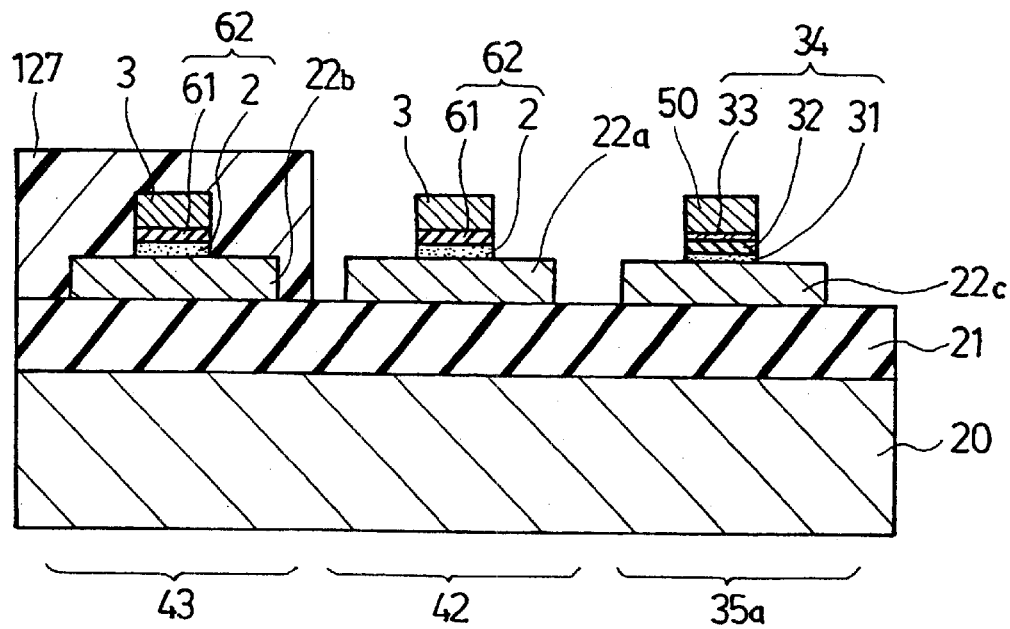

The second gate electrode material 49 composed of the polysilicon film is then etched by means of the dry-etching system using the photo-resist as an etching mask, and a mixed gas of SF$_5$ and O$_2$ as an etching gas, thereby forming a memory gate electrode 50 as shown in FIG. 49.

The top oxide film 33, the memory nitride film 32, and the memory oxide film 31 are then etched by means of the dry-etching system using the same photo-resist again as the etching mask, and a mixed gas of $CF_4$, He, $CBr_3$, and $O_2$ as an etching gas, removing all the films except those in the region matching the memory gate electrode 50 as shown in FIG. 49. The photo-resist used as the etching mask is then removed.

Subsequently, a photo-resist is formed on the entire surface of the SOI substrate, and an exposure and development treatment is applied thereto using a predetermined photo mask, patterning the photo-resist 127 in such a way as to form an opening delineating the N channel region 42 and the MONOS region 35a.

Using the photo-resist 127 as a mask against ion implantation, ions of arsenic, an n-type dopant atom, are implanted into exposed portions of the first and third semiconductor layers, respectively, at an acceleration energy of 60 KeV, and at a dopant dose on the order of $3.0 \times 10^{15}$ atoms/$cm^2$. The photo-resist 127 is then removed.

Thereafter, a photo-resist (not shown) is formed again on the entire surface of the SOI substrate, and an exposure and development treatment is applied thereto using a predetermined photo mask, patterning the photo-resist in such a way as to form an opening delineating the P channel region 43.

Using the photo-resist as an etching mask, ions of boron, a p-type dopant atom, are implanted into exposed portions of the second semiconductor layer 22b at an acceleration energy of 40 KeV, and at a dopant dose on the order of $3.0 \times 10^{15}$ atoms/$cm^2$. The photo-resist is then removed.

Figure 50:
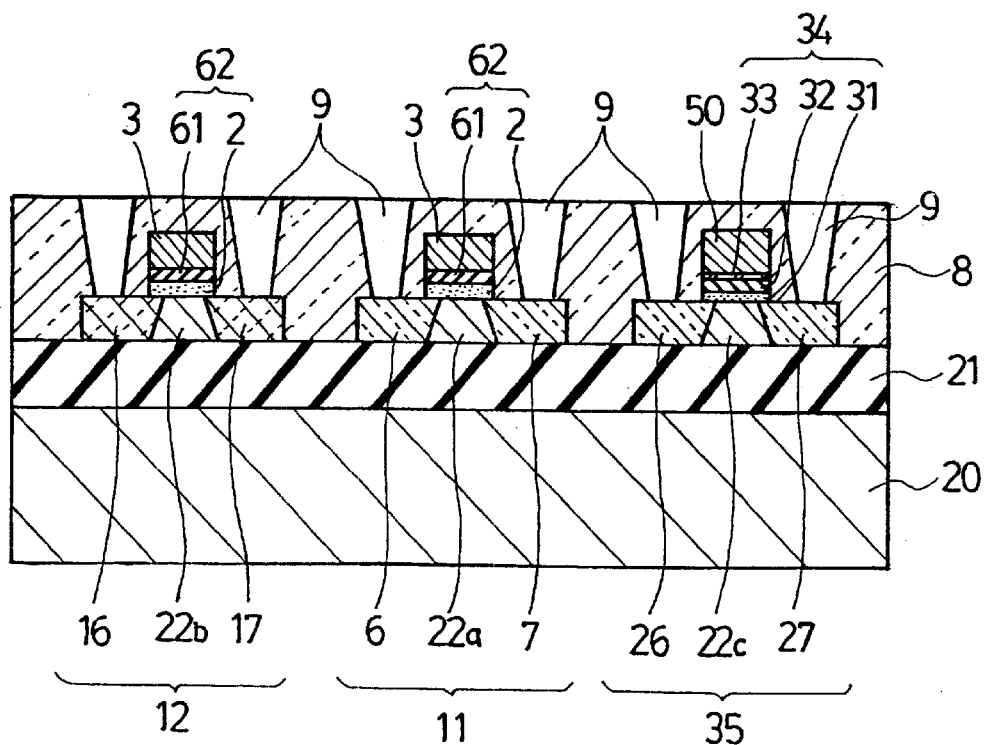

As shown in FIG. 50, an interlevel insulator 8 composed primarily of a silicon dioxide film is then formed on the entire surface and thereafter, annealing is applied. thereto at 900° C. in a nitrogen atmosphere for activation of the ion-implanted dopants, and concurrently for effecting reflow of the interlevel insulator 8.

As a result, sources 6, 26 and drains 7, 27, composed of a highly doped n-type layer of the N channel MOS device 11 and the MONOS device 35, respectively, and a source 16 and drain 17, composed of a highly doped p-type layer of the P channel MOS device 12, can be formed.

Thereafter, a photo-resist to form openings in the interlevel insulator 8 for delineating contact holes 9 used for interconnection is patterned on the interlevel insulator 8. The interlevel insulator is etched using the photo-resist as an etching mask, the contact holes 9 are formed at positions corresponding to the gate electrodes 3, 3, 50, the sources 6, 16, 26, and the drains 7, 17, 27 of the respective semiconductor devices 11, 12, and 35.

Etching treatment for forming the contact holes 9 is carried out by the dry-etching system using a mixed gas containing $C_2F_6$, He, and $CHF_3$ as an etching gas. The photo-resist used as the etching mask is then removed.

Subsequently, interconnecting material made primarily of aluminum is applied to the entire surface of the interlevel insulator 8 (including the inside of the contact holes 9) and a photo-resist for forming interconnections are patterned thereon.

Thereafter, the interconnecting material is etched using the photo-resist as an etching mask, forming the interconnections 10 shown in FIG. 4. The etching of the interconnecting material is carried out by the dry-etching system using a mixed gas containing $BCl_3$, $CHCl_3$, $Cl_2$, and $N_2$ as an etching gas.

Thus, the semiconductor device shown in FIG. 4, comprising the N channel MOS device 11, P channel MOS device 12, and MONOS device 35, formed on the SOI substrate 23, is completed.

Fifth Embodiment of a Fabrication Method: FIG. 5 and FIGS. 51 through 56

A method of fabricating the semiconductor device (the fifth embodiment) according to the invention, described with reference to FIG. 5, is described hereinafter as a fifth embodiment of a method of fabricating the semiconductor device according to the invention.

FIGS. 51 through 56 are schematic cross-sectional views showing the state of the semiconductor device and constituent materials thereof in respective steps of the method of fabricating the same. Referring to these figures and FIG. 5 showing the completed state, the fifth embodiment of the method of fabricating the semiconductor device is described hereinafter.

In the fifth embodiment of the method of fabricating the semiconductor device according to the invention, a semiconductor substrate is employed.

Figure 51:
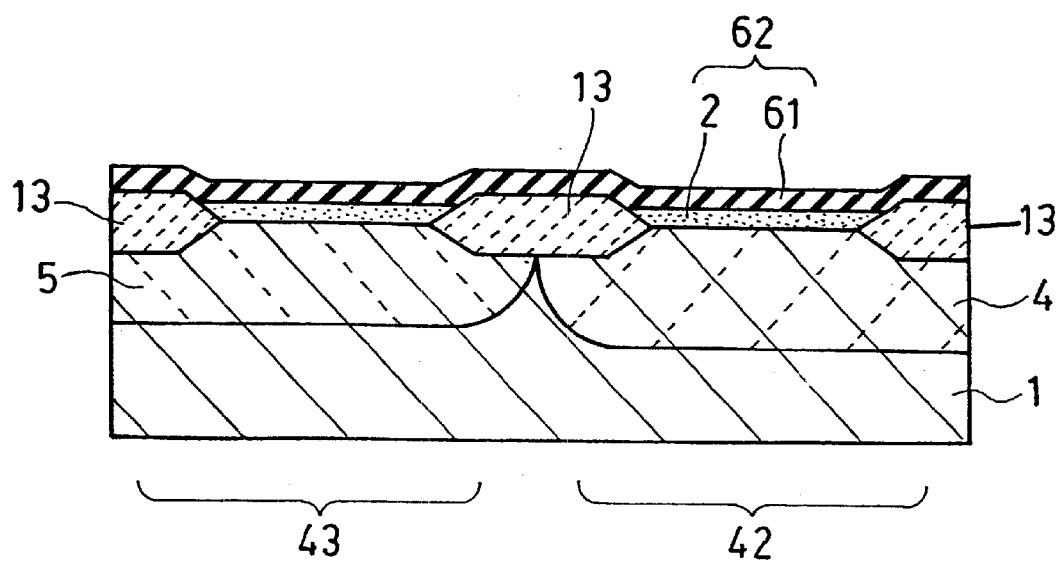
FIGS. 51 through 56 are schematic cross-sectional views showing the state of the semiconductor device and constituent materials thereof in respective steps of a fabrication process in order to describe a fifth embodiment of a method of fabricating the same according to the invention.

As shown in FIG. 51, steps of the fabrication method according to the fifth embodiment of the invention, wherein after forming a P well 4 in an N channel region 42 of the semiconductor substrate 1, and an N well 5 in a P channel region 43 of the same, a silicon nitride film is formed on the surface of the semiconductor substrate 1, and by applying the selective oxidation treatment using the silicon nitride film as the mask, field oxide films 13 are formed, are the same as the respective steps of the method of fabricating the semiconductor device according to the first embodiment of the invention, described with reference to FIGS. 7 through 12.

In this embodiment, oxidation treatment is applied in a mixed gas of oxygen and nitrogen to the surface of the semiconductor substrate 1 in the state described with reference to FIG. 12, and as shown in FIG. 51, a gate oxide film 2 composed of a silicon dioxide film of about 10 nm in thickness is formed on the entire surface over the N channel region 42, and the P channel region 43, respectively.

Subsequently, a gate silicon nitride film 61 composed of a silicon nitride film is formed to a thickness on the order of 5 nm on the entire surface of the gate oxide films 2 by means of the CVD process.

The gate silicon nitride film 61 is formed by means of the CVD process applied at 700° C. using a gas containing dichlorosilane ($SiH_2Cl_2$) and ammonia ($NH_3$).

Figure 52:
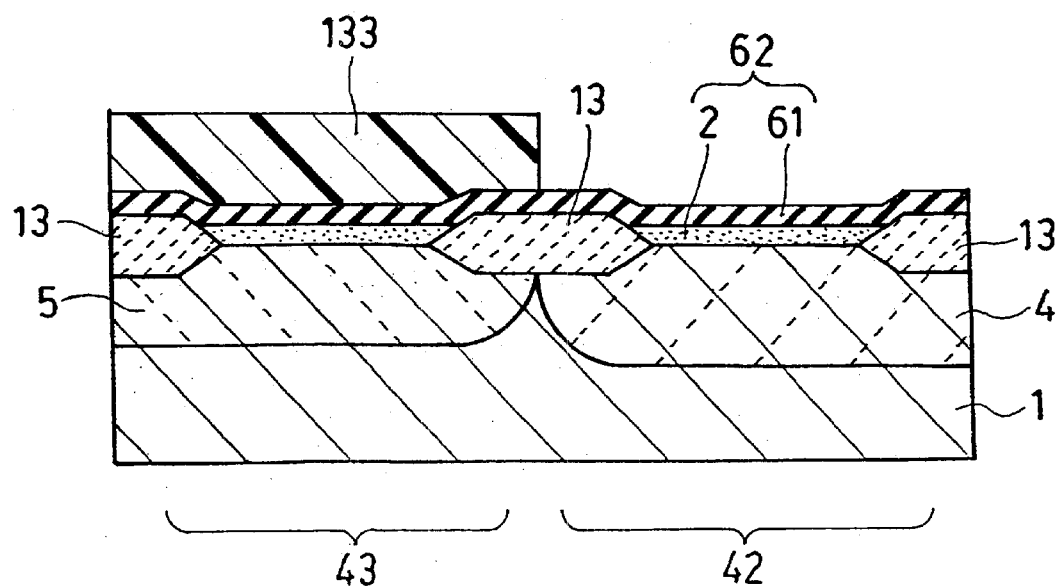

Subsequently, a photo-resist is formed on the entire surface of the gate silicon nitride film 61, and an exposure and development treatment is applied thereto by use of a predetermined mask, patterning the photo-resist 133 in such a way as to form an opening delineating the N channel region 42 as shown in FIG. 52.

Using the photo-resist 133 as an etching mask, the gate silicon nitride film 61 is etched. Etching of the gate silicon nitride film 61 is carried out by means of the dry-etching method using a mixed gas containing $SF_5$, $CHF_3$, and He as an etching gas. The photo-resist 133 is then removed.

Figure 53:
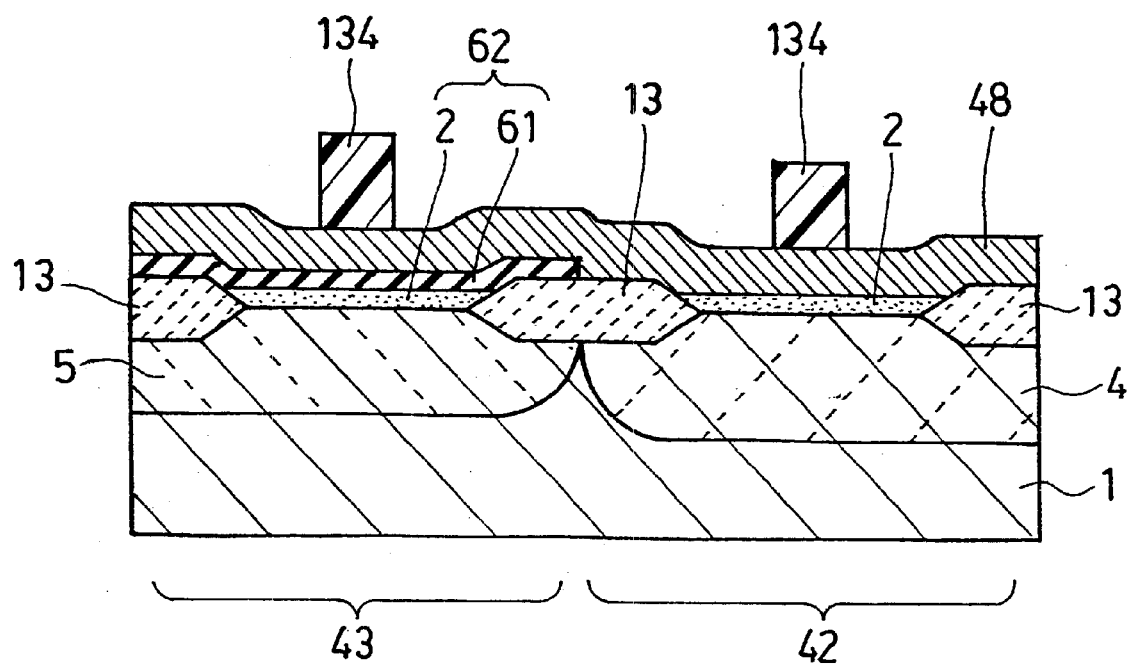

As a result, as shown in FIG. 53, the gate silicon nitride film 61 in the N channel region 42 is removed, leaving behind the gate oxide film 2 only. Accordingly, the gate insulating film 62 in the N channel region 42 is composed of the gate oxide film 2 only while the gate insulating film 62 in the P channel region 43 is composed of a dual-layer film consisting of the gate oxide film 2 and the gate silicon nitride film 61.

Thereafter, a gate electrode material 48 composed of a polysilicon film is formed on the entire surface to a thickness on the order of 450 nm by means of the CVD method applied at 600° C. using monosilane ($SiH_4$) gas.

Subsequently, a photo-resist is formed on the entire surface of the gate electrode material 48, and an exposure and development treatment is applied thereto by use of a predetermined mask, patterning the photo-resists 134 (FIG. 53) only in regions where respective gate electrodes of a pair of MOS devices are to be formed.

The gate electrode material 48 and the gate silicon nitride film 61 are then etched by means of the dry-etching system using the photo-resists 134 as etching masks, and a mixed gas of $SF_5$, and $O_2$ as an etching gas. The photo-resists 134 used as the etching masks are then removed.

Figure 54:
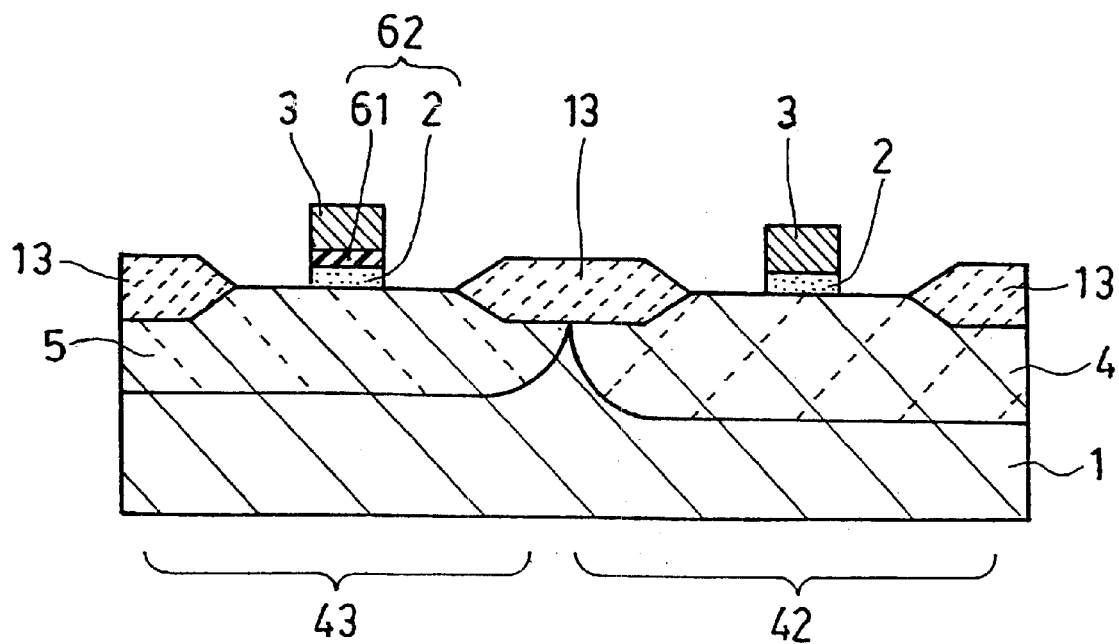

As a result, as shown in FIG. 54, in the P channel region 43, a MOS device is made up of the gate insulating film 62 composed of the dual-layer film consisting of the gate oxide film 2 and the gate silicon nitride film 61, formed on the surface of the semiconductor substrate 1, and the gate electrode 3 formed on top of the gate insulating film 62, while in the N channel region 42, a MOS device is made up of the gate oxide film 2 formed on the surface of the semiconductor substrate 1, and the gate electrode 3.

Figure 55:
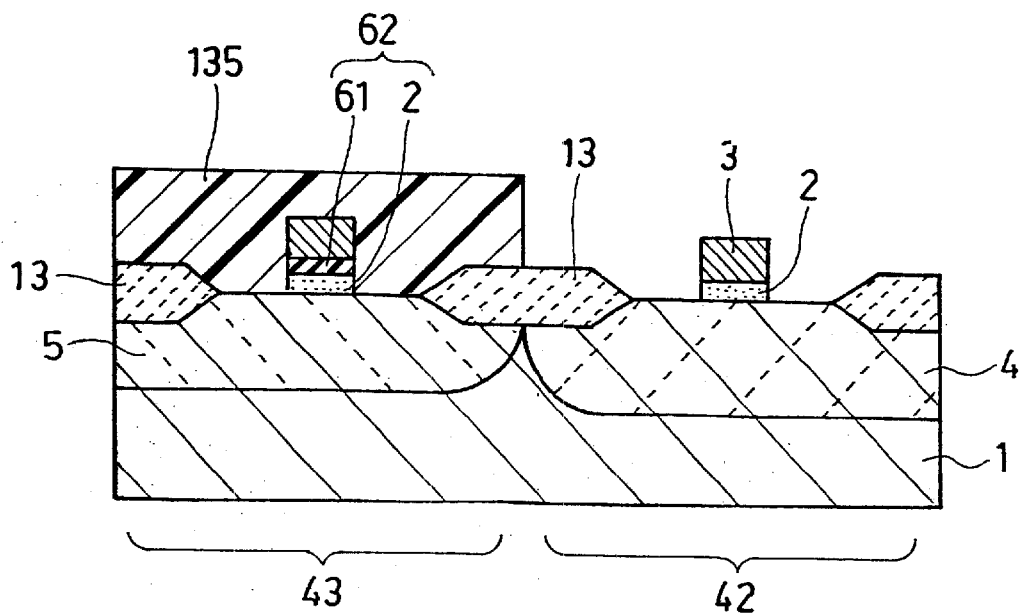

Thereafter, a photo-resist is formed on the entire surface of the semiconductor substrate 1, and an exposure and development treatment is applied thereto by use of a predetermined photo mask, patterning the photo-resist 135 in such a way as to form an opening delineating the N channel region 42 as shown in FIG. 55.

Using the photo-resist 135 as a mask against ion implantation, ions of arsenic, an n-type dopant atom, are implanted into the P well 4 in the N channel region 42 at an acceleration energy of 60 KeV, and at a dopant dose on the order of $3.0 \times 10^{13}$ atoms/cm$^2$. Thereafter, the photo-resist 135 is removed.

Figure 56:
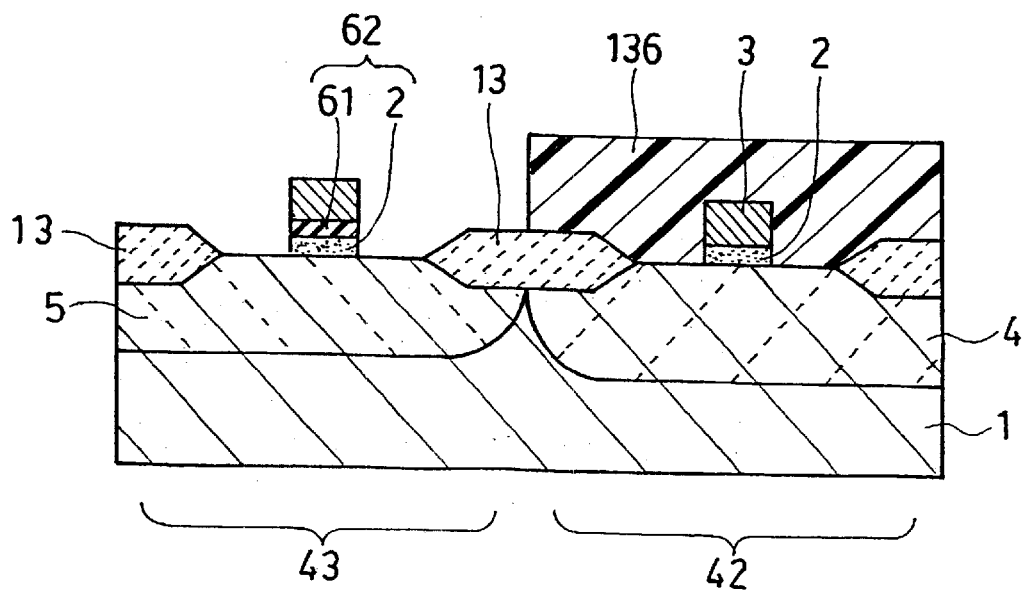

Subsequently, a photo-resist is again formed on the entire surface of the semiconductor substrate 1, and an exposure and development treatment is applied thereto by use of a predetermined photo mask, patterning the photo-resist 136 in such a way as to form an opening delineating the P channel region 43 as shown in FIG. 56.

Using the photo-resist 136 as a mask against ion implantation, ions of boron, a p-type dopant atom, are implanted into the N well 5 in the P channel region 43 at an acceleration energy of 40 KeV, and at a dopant dose on the order of $3.0 \times 10^{15}$ atoms/cm$^2$. The photo-resist 136 is then removed.

In subsequent steps similar to those previously described with reference to FIGS. 17 and 18, an interlevel insulator 8 composed primarily of a silicon dioxide film is formed on the entire surface of the semiconductor substrate 1, and annealing is applied thereto at 900° C. in a nitrogen atmosphere for activation of the ion-implanted dopants, and concurrently for effecting reflow of the interlevel insulator 8.

As a result, as shown in FIG. 5, the source 6 and drain 7, composed of a highly doped n-type layer of the N channel MOS device 11, and the source 16 and drain 17, composed of a highly doped p-type layer of the P channel MOS device 12, are formed.

Thereafter, contact holes 9 are formed in the interlevel insulator 8, and interconnections 10 composed of interconnecting material made primarily of aluminum is formed therein.

The semiconductor device shown in FIG. 5, comprising the N channel MOS device 11 and the P channel MOS device 12, formed on the same semiconductor substrate 1, is thus completed.

Sixth Embodiment of a Fabrication Method: FIG. 6 and FIGS. 57 through 66

A method of fabricating the semiconductor device (the sixth embodiment) according to the invention, described with reference to FIG. 6, is described hereinafter as a sixth embodiment of a method of fabricating the semiconductor device according to the invention.

FIGS. 57 through 66 are schematic cross-sectional views showing the state of the semiconductor device and constituent materials thereof in respective steps of the method of fabricating the same. Referring to these figures and FIG. 6 showing the completed state, the sixth embodiment of the method of fabricating the semiconductor device is described hereinafter.

As with the second embodiment, an SOI substrate 23 comprising a supporting substrate 20, an insulating film 21, and a semiconductor layer 22 is employed in this embodiment.

Figure 57:
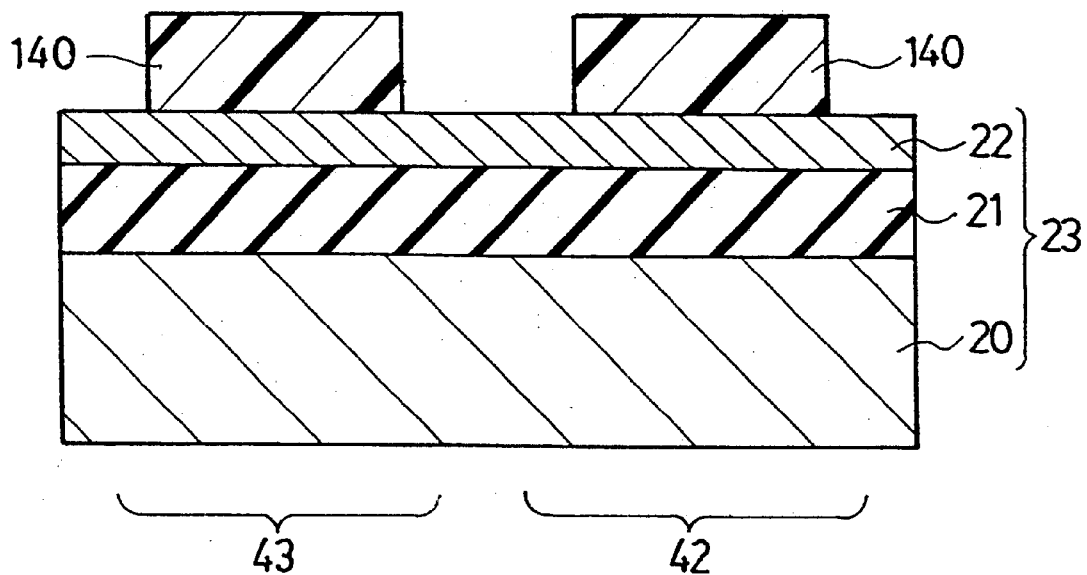

As shown in FIG. 57, photo-resists 140 are formed on the surface of the SOI substrate 23, and the semiconductor layer 22 is etched using the photo-resists 140 as etching masks, thereby forming a first semiconductor layer 22a patterned in an island-like shape on the insulating film 21 in the N channel region 42, and a second semiconductor layer 22b patterned in an island-like shape on the insulating film 21 in the P channel region 43.

Thereafter, a gate oxide film 2 is formed on the entire surface of the first and second semiconductor layers 22a, and 22b, respectively.

Figure 58:
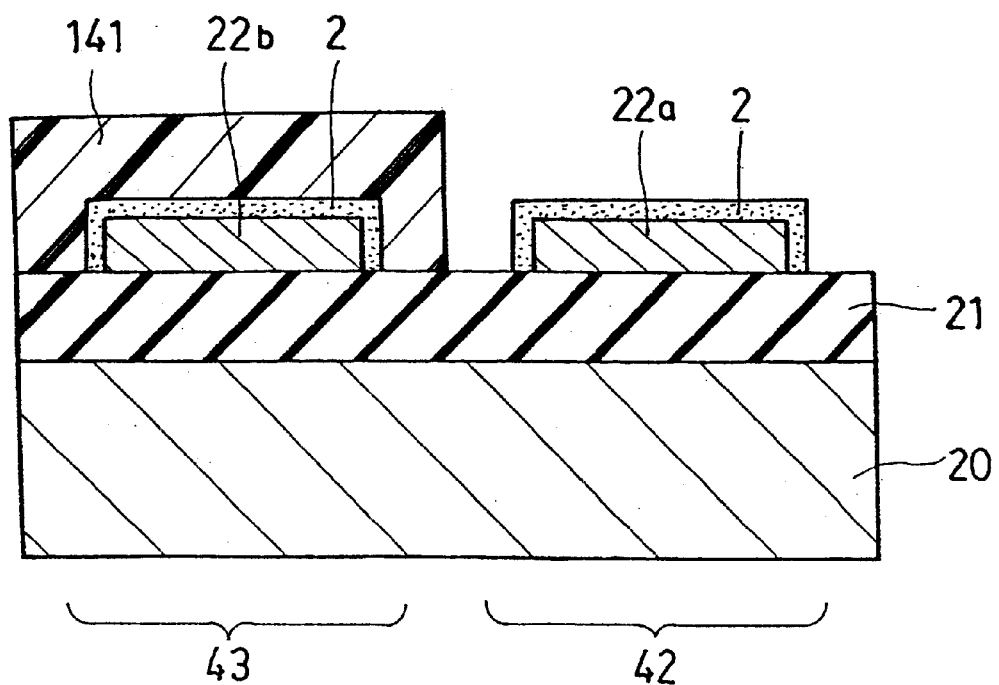

Subsequently, as shown in FIG. 58, a photo-resist 141 is patterned on the surface in such a way as to form an opening delineating the N channel region 42, and using the photo-resist 141 as a mask against ion implantation, ions of boron, a p-type dopant atom, are implanted into the first semiconductor layer 22a.

Figure 59:
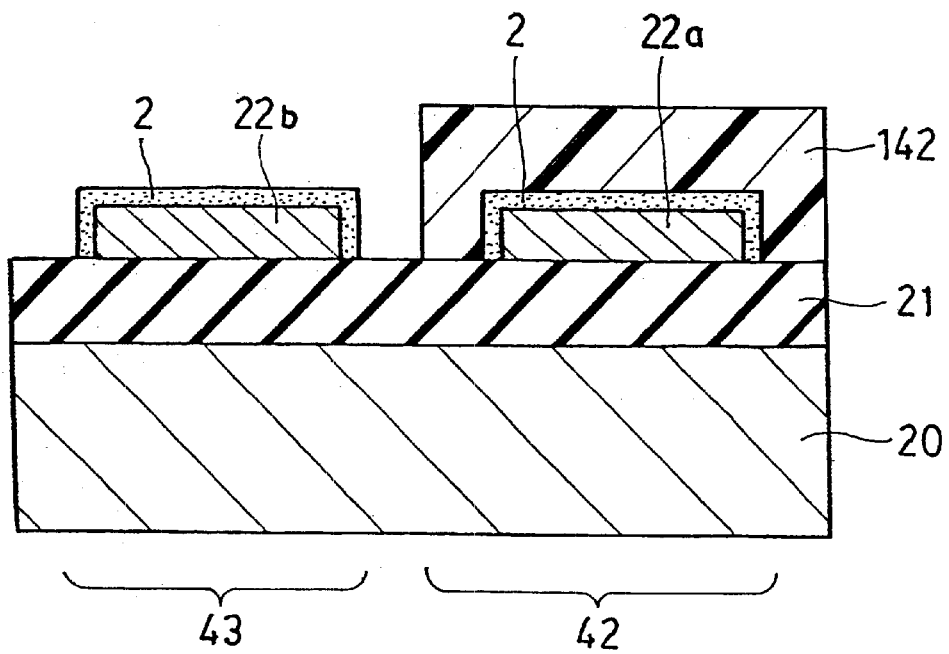

Similarly, as shown in FIG. 59, a photo-resist 142 is patterned in such a way as to form an opening delineating the P channel region 43, and using the photo-resist 142 as a mask against ion implantation, ions of phosphorous, an n-type dopant atom, are implanted into the second semiconductor layer 22b.

Figure 60:
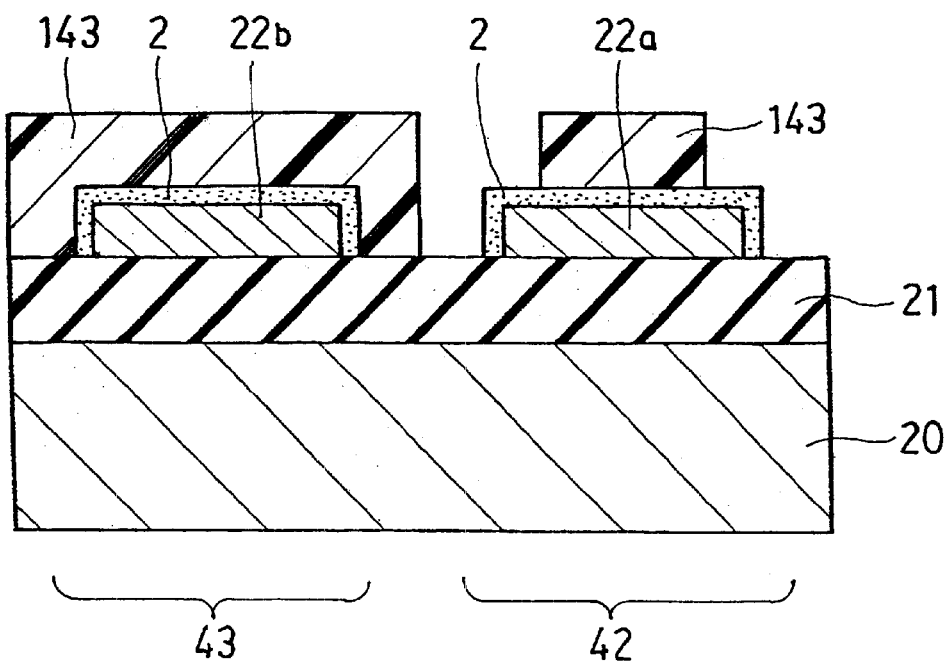
Figure 6:
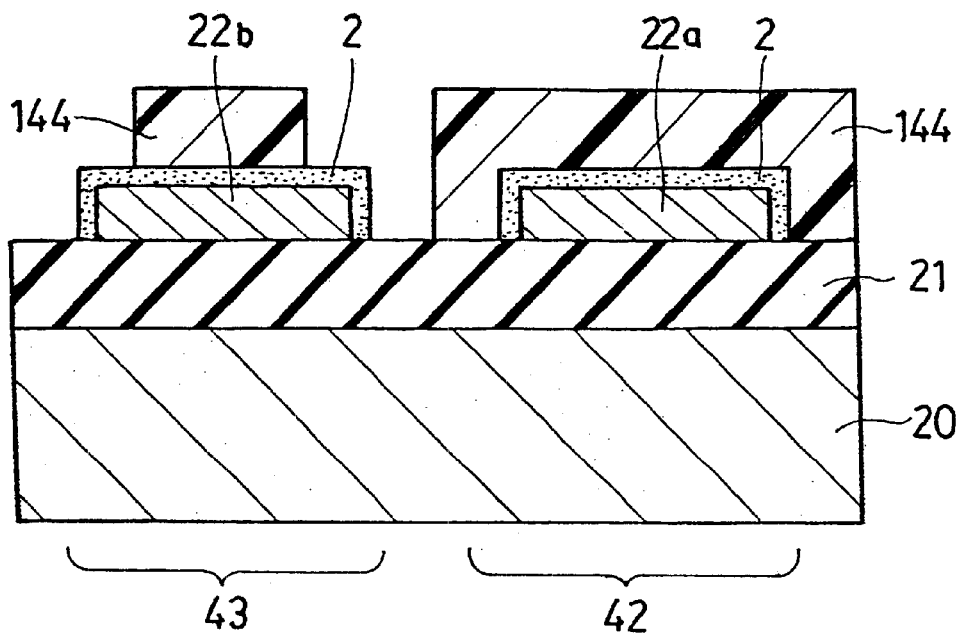
Figure 6:
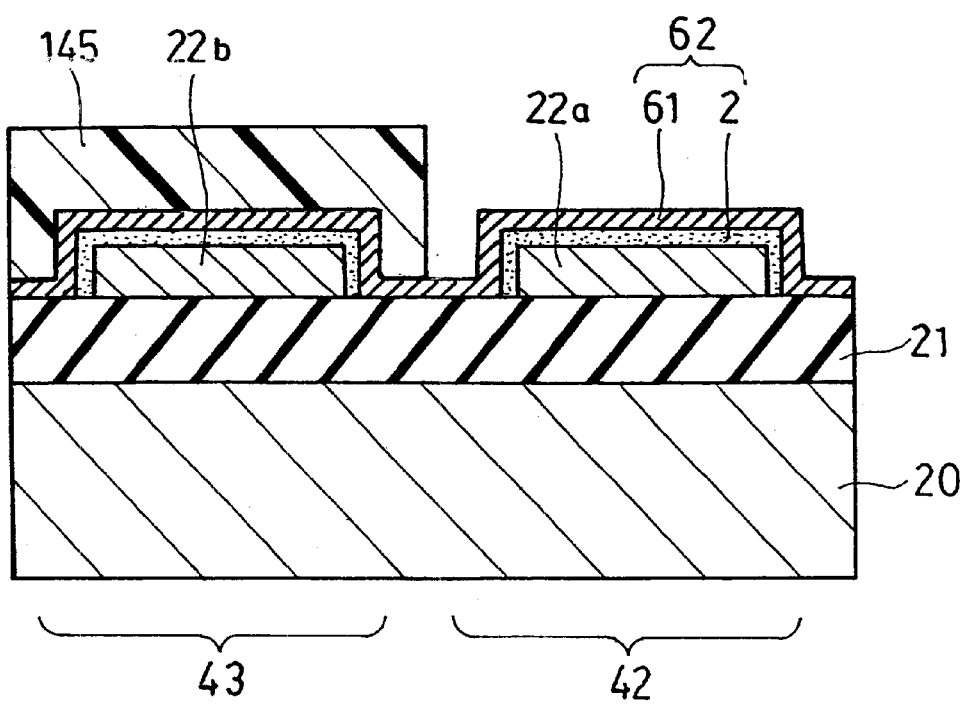

Further, photo-resists 143 are patterned as shown in FIG. 60, and using the same as masks against ion implantation, ions of boron, a p-type dopant atom, are again implanted into the opposite ends of the first semiconductor layer 22a in the N channel region 42.

Subsequently, photo-resists 144 are patterned as shown in FIG. 61, and ions of phosphorus, an n-type dopant atom, are again implanted into the opposite ends of the second semiconductor layer 22b in the P channel region 43. By the steps, doped layers for prevention of surface inversion are formed.

The respective steps described above are the same as those of the second embodiment previously described with reference to FIGS. 19 through 24, and detailed description thereof is therefore omitted.

As shown in FIG. 62, a gate silicon nitride film 61 composed of a silicon nitride film is formed by means of the CVD process to a thickness on the order of 5 nm on the entire surface of the gate oxide film 2.

The gate silicon nitride film 61 is formed by means of the CVD process applied at 700° C. using a gas containing dichlorosilane ($SiH_2Cl_2$) and ammonia ($NH_3$).

Subsequently, a photo-resist which is s photosensitive polymer is formed on the entire surface, and an exposure and development treatment is applied thereto using a predetermined photo mask, patterning the photo-resist 145 in such a way as to form an opening delineating the N channel region 42.

Subsequently, the gate silicon nitride film 61 is etched using the photo-resist 145 as an etching mask. Etching of the gate silicon nitride film 61 is carried out by means of the dry-etching system using a mixed gas of $SF_5$, $CHF_3$, and He as an etching gas. The photo-resist 145 is then removed.

As a result, the gate insulating film in the N channel region 42 will be made up of the gate oxide film 2 only, and the gate insulating film 62 in the P channel region 43 will be made up of a dual-layer film consisting of the gate oxide film 2 and the gate silicon nitride film 61.

Figure 63:
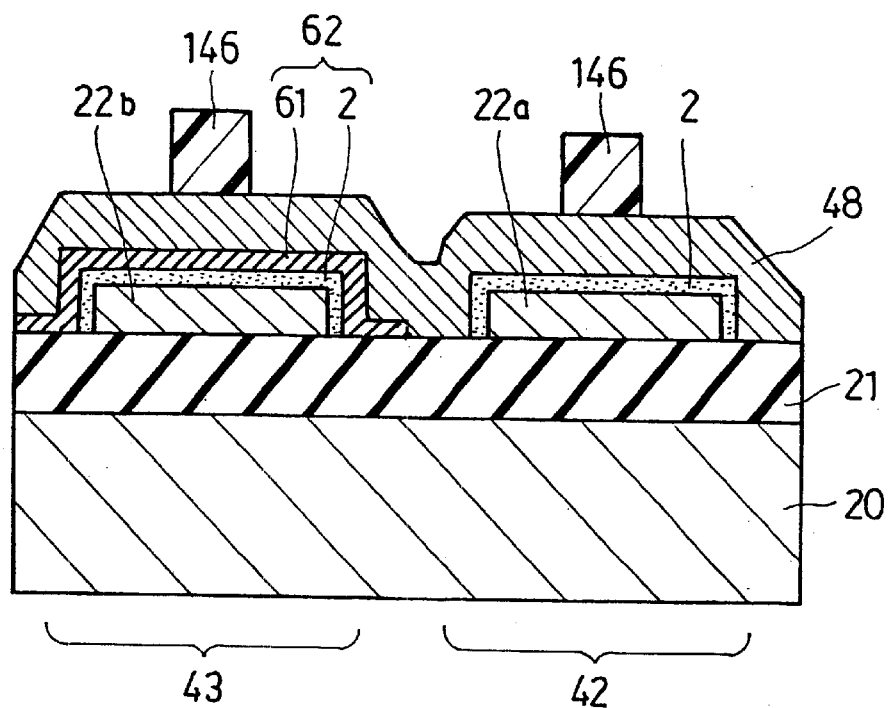

Thereafter, as shown in FIG. 63, a gate electrode material 48 composed of a polysilicon film is formed to a thickness on the order of 450 nm on the entire surface by means of the CVD process applied at 600° C. using a reacting gas of monosilane ($SiH_4$).

Further, a photo-resist is formed on the entire surface of the gate electrode material 48, and an exposure and development treatment is applied thereto using a predetermined photo mask, patterning the photo-resists 146 only in regions where respective gate electrodes of a pair of MOS devices are to be formed.

Subsequently, the gate electrode material 48 and the gate silicon nitride film 61 are etched by means of the dry-etching system using the photo-resists 146 as etching, masks and a mixed gas of $SF_5$ and $O_2$ as an etching gas. The photo-resists 146 are then removed.

Figure 64:
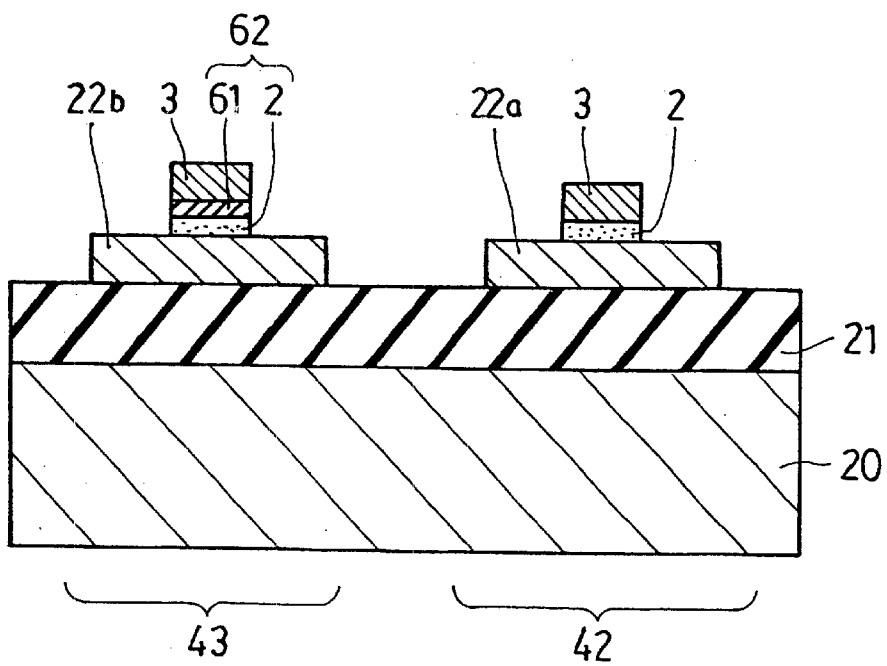

As a result, as shown in FIG. 64, a MOS device in the P channel region 43 is made up of the gate insulating film 62 composed of the dual-layer film consisting of the gate oxide film 2 and the gate silicon nitride film 61, formed on the semiconductor layer 22b, and the gate electrode 3 formed on top of the gate insulating film 62, and a MOS device in the N channel region 42 is made up of the gate oxide film 2 formed on the semiconductor layer 22a, and the gate electrode 3.

Figure 65:
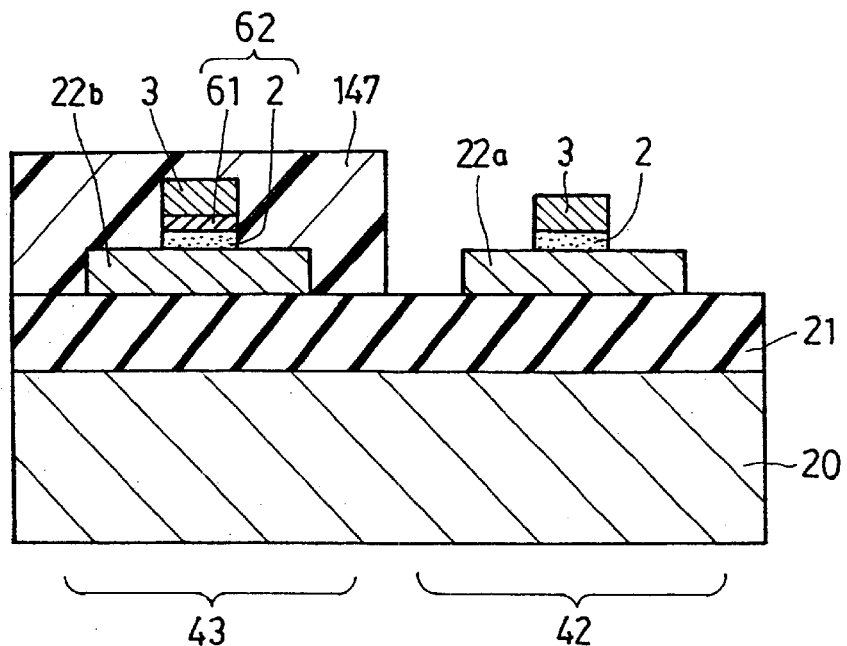

Subsequently, a photo-resist is formed on the entire surface of the SOI substrate, and an exposure and development treatment is applied thereto using a predetermined photo mask, patterning the photo-resist 147 in such a way as to form an opening delineating the N channel region 42 as shown in FIG. 65.

Using the photo-resist 147 as a mask against ion implantation, ions of arsenic, an n-type dopant atom, are implanted into exposed portions of the first semiconductor layer 22a at an acceleration energy of 40 KeV, and at a dopant dose on the order of $3.0 \times 10^{15}$ atoms/cm². The photo-resist 147 is then removed.

Thereafter, a photo-resist (not shown) is formed again on the entire surface of the SOI substrate, and an exposure and development treatment is applied thereto using a predetermined photo mask, patterning the photo-resist in such a way as to form an opening delineating the P channel region 43.

Using the photo-resist as a mask against ion implantation, ions of boron, a p-type dopant atom, are implanted into exposed portions of the second semiconductor layer 22b at an acceleration energy of 30 KeV, and at a dopant dose on the order of $3.0 \times 10^{15}$ atoms/cm². The photo-resist is then removed.

Figure 66:
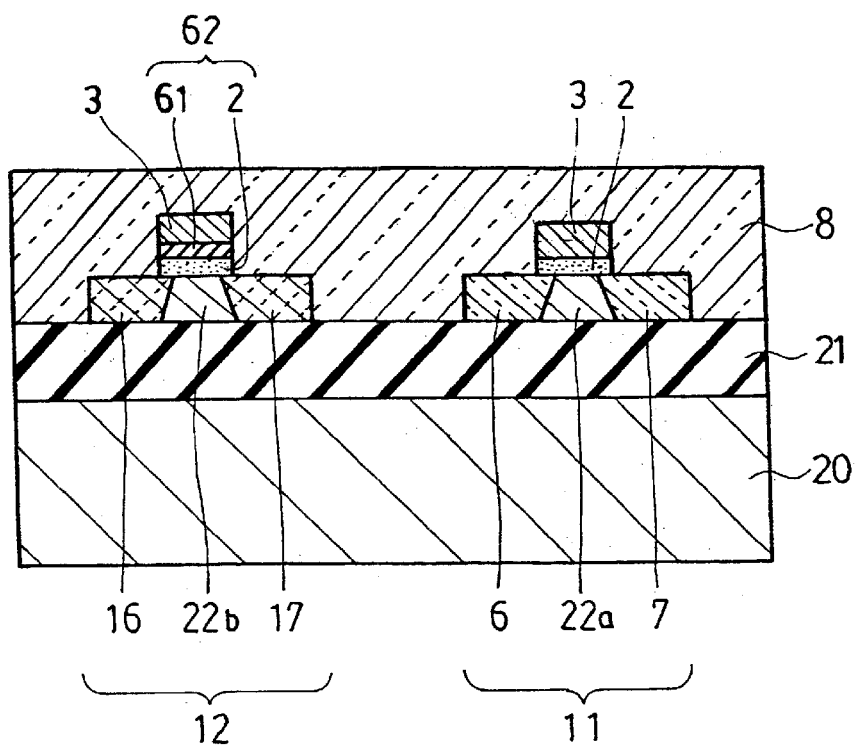

Subsequently, as shown in FIG. 66, an interlevel insulator 8 composed primarily of a silicon dioxide film is formed on the entire surface.

Thereafter, annealing is applied thereto at 900° C. in a nitrogen atmosphere for activation of the ion-implanted dopants and concurrently for effecting reflow of the interlevel insulator 8.

As a result, a source 6 and a drain 7 composed of a highly doped n-type layer of the N channel MOS device 11, and a source 16 and a drain 17 composed of a highly doped p-type layer of the P channel MOS device 12 can be formed.

Subsequently, the contact holes 9 shown in FIG. 6 are formed in the interlevel insulator 8, and interconnections 10 composed of interconnecting material made primarily of aluminum is formed therein. The semiconductor device shown in FIG. 6 comprising the N channel MOS device 11 and the P channel MOS device 12, formed on the same SOI substrate 23, is thus completed.

Supplementary Description with reference to Characteristic Graphs

In the case where the semiconductor device according to the invention as described in the foregoing is used in a radiation environment, the shift in the threshold voltage is described hereinafter with reference to the characteristic graph shown in FIG. 67.

Figure 67:
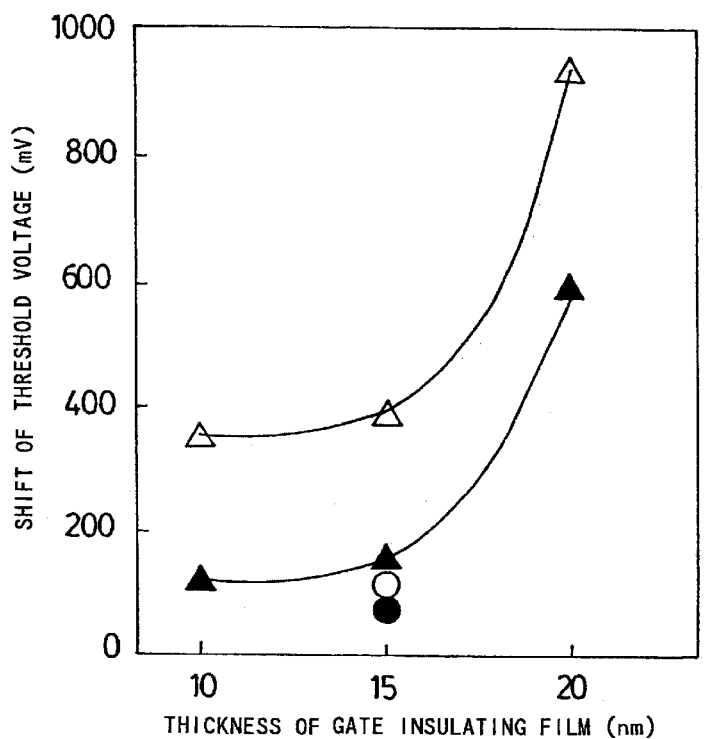
FIG. 67 is a graph showing correlation between thickness of the gate insulating film and shift values of the threshold voltage caused by irradiation with respect to the N channel MOS device and P channel MOS device according to the invention, and the same of the conventional structure.

In FIG. 67, the characteristic of the semiconductor device according to the invention is compared with that of the conventional semiconductor device when both are used in a radiation environment, and the shift in the respective threshold voltages is shown when gamma rays are irradiated to the respective semiconductor devices.

In the graph of FIG. 67, the abscissa indicates thickness of the gate insulating film, and the ordinate indicates shift values of the threshold voltage when gamma rays are irradiated at $1 \times 10^7$ rad. In the figure, symbols Δ and ▲ indicate measurement results of the conventional semiconductor device provided with the gate insulating film composed of the gate oxide film only, the symbol ▲ indicating the characteristic of the N channel MOS device while the symbol Δ indicates the characteristic of the P channel MOS device.

Symbols ○ and ● indicate measurement results of the semiconductor device according to the invention, the symbol ● indicating the characteristic of the N channel MOS device while the symbol ○ similarly indicates the characteristic of the P channel MOS device.

The thicker the thickness of the gate insulating film, the greater the magnitude of shift in the threshold voltage becomes due to an increase in the value of positive electric charge generated by the presence of gamma rays.

In comparing the characteristic of the semiconductor device of the invention with that of the conventional one, in the case of the gate insulating film being 15 nm thick, it is demonstrated by the graph that the invention has a significant advantage over the conventional art in respect of the effect of inhibiting the shift in the threshold voltage of the P channel MOS device.

It follows therefore that as shown in the foregoing description of the embodiments of the invention, the semiconductor device according to the invention is not limited to one wherein both the N channel MOS device and P channel MOS device are provided with the gate insulating film, respectively, composed of the dual-layer film consisting of the gate oxide film and gate silicon nitride film, but may also comprise a P channel MOS device having the gate insulating film composed of the dual-layer film consisting of the gate oxide film and gate silicon nitride film, and an N channel MOS device having the gate insulating film composed of the oxide film only.

Even with such a structure, it is possible to inhibit the shift in the threshold voltage accompanying generation of positive electric charge which occurs in a radiation environment.

Further, with the semiconductor device according to the invention, it is also possible to inhibit the shift in the threshold voltage which occurs in the course of annealing process applied in an ammonia atmosphere when making up the N channel MOS device, P channel MOS device, and MONOS device, on the same semiconductor substrate or the same SOI substrate.

The shift in the threshold voltage caused by the annealing applied in an ammonia atmosphere, and the characteristic of the semiconductor device according to invention are described with reference to the characteristic graph in FIG. 68.

Figure 68:
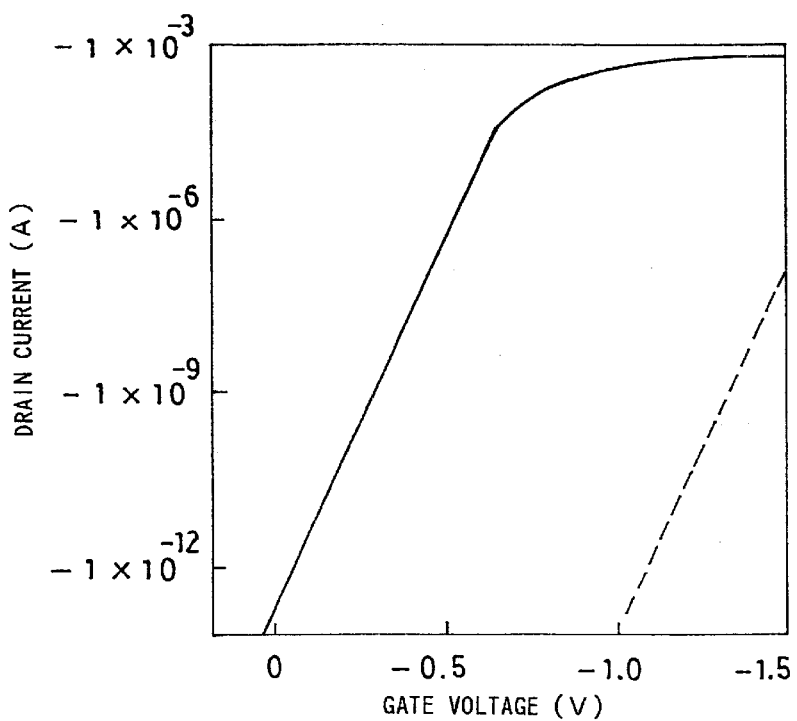
FIG. 68 is a graph showing correlation between gate voltage and drain current with respect to the P channel MOS device according to the invention, and the same of the conventional structure.
Figure 69:
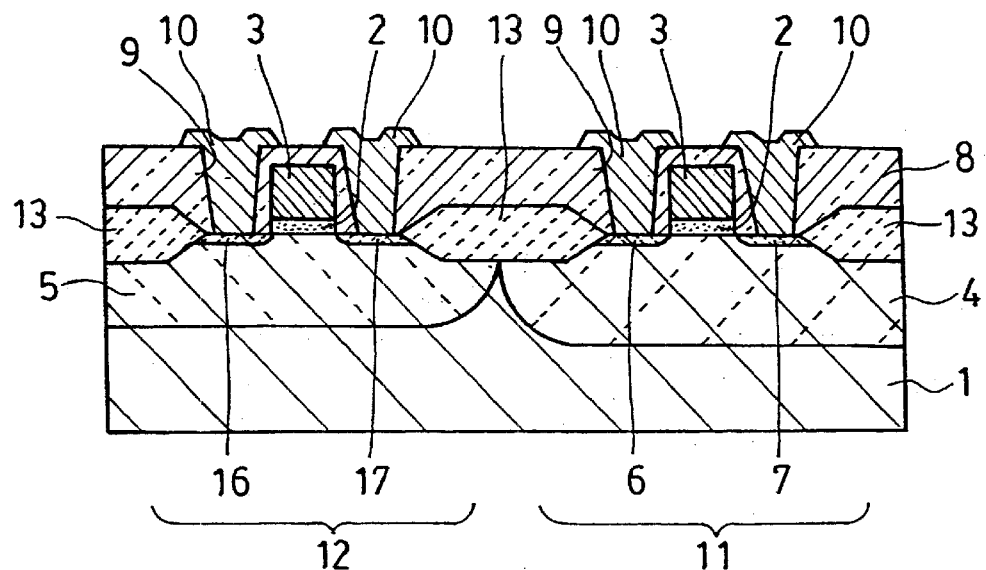
FIGS. 69 through 71 are schematic cross-sectional views showing various examples of the structure of the conventional semiconductor device.
Figure 70:
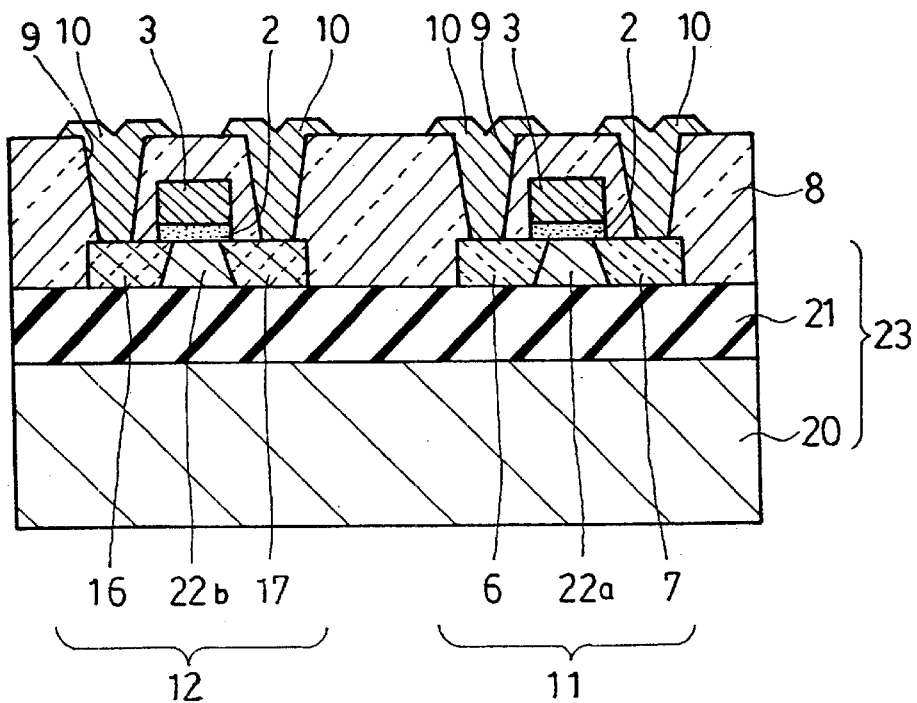
Figure 71:
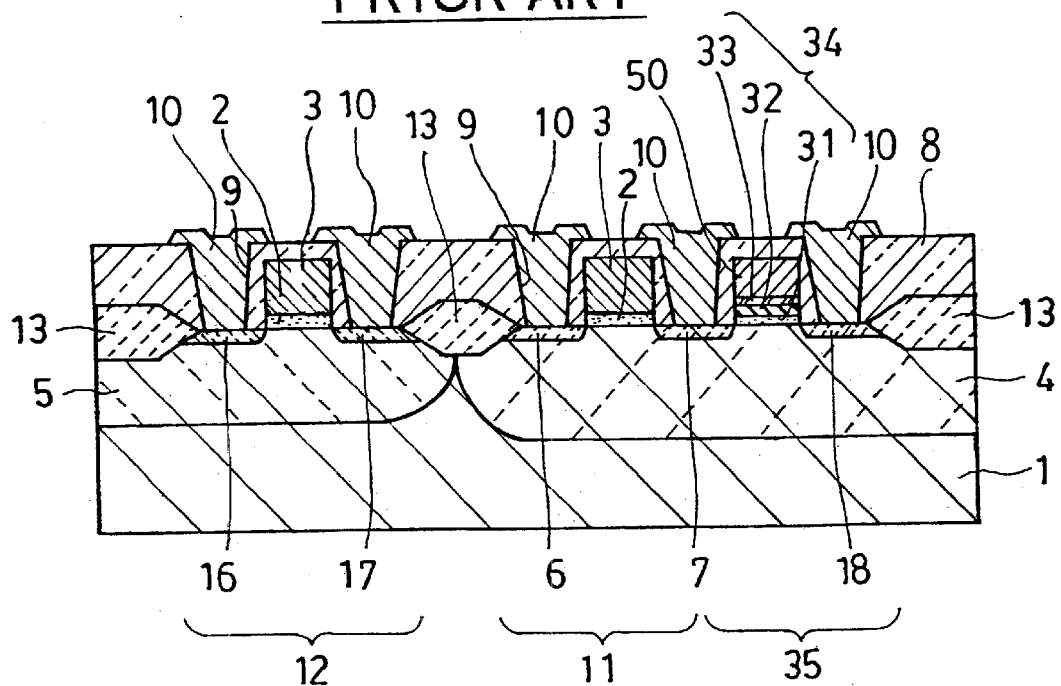
Figure 72:
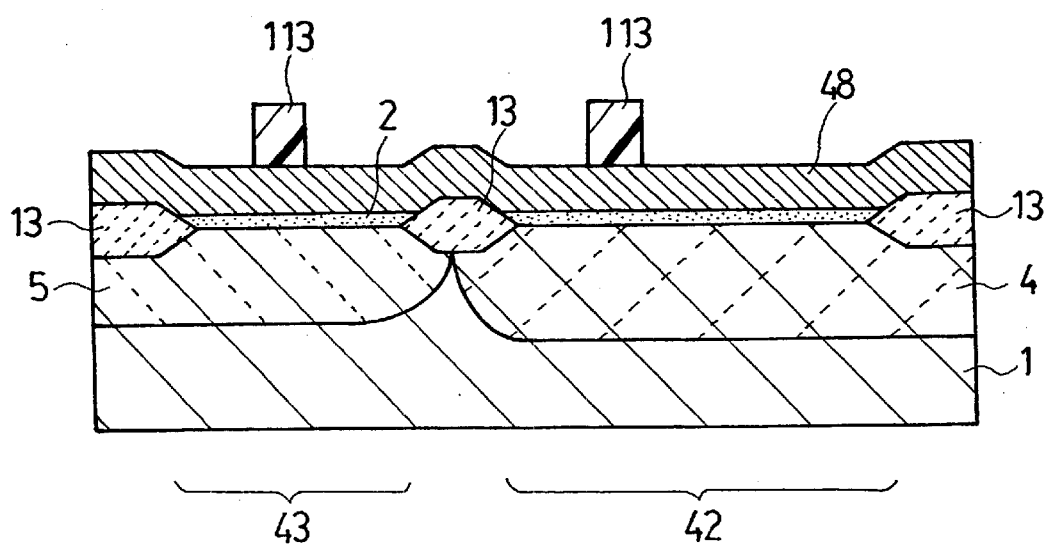
FIGS. 72 through 76 are schematic cross-sectional views showing the state of the semiconductor device shown in FIG. 71 and constituent materials thereof in respective steps of a fabrication process in order to describe the conventional method of fabricating the same.
Figure 73:
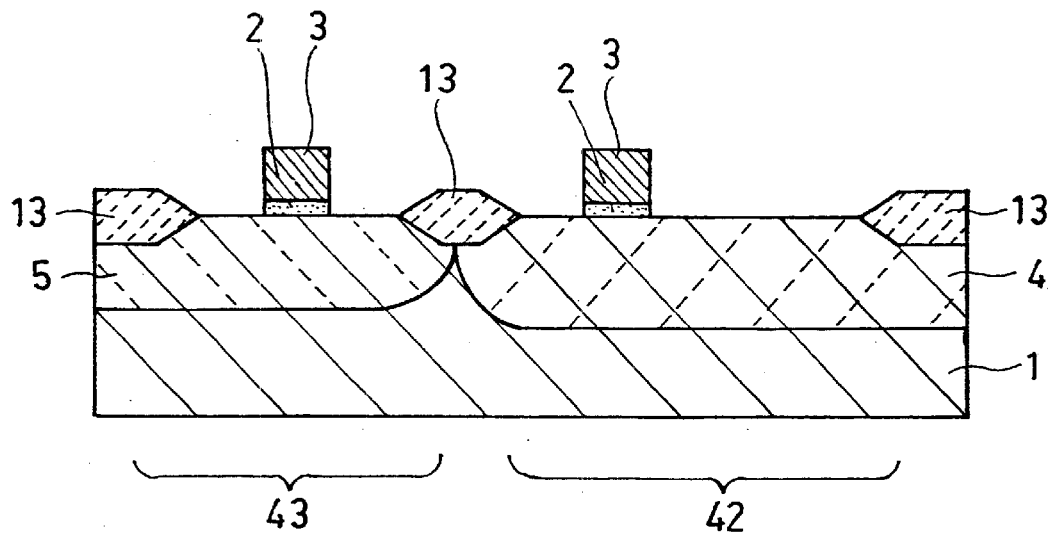
Figure 74:
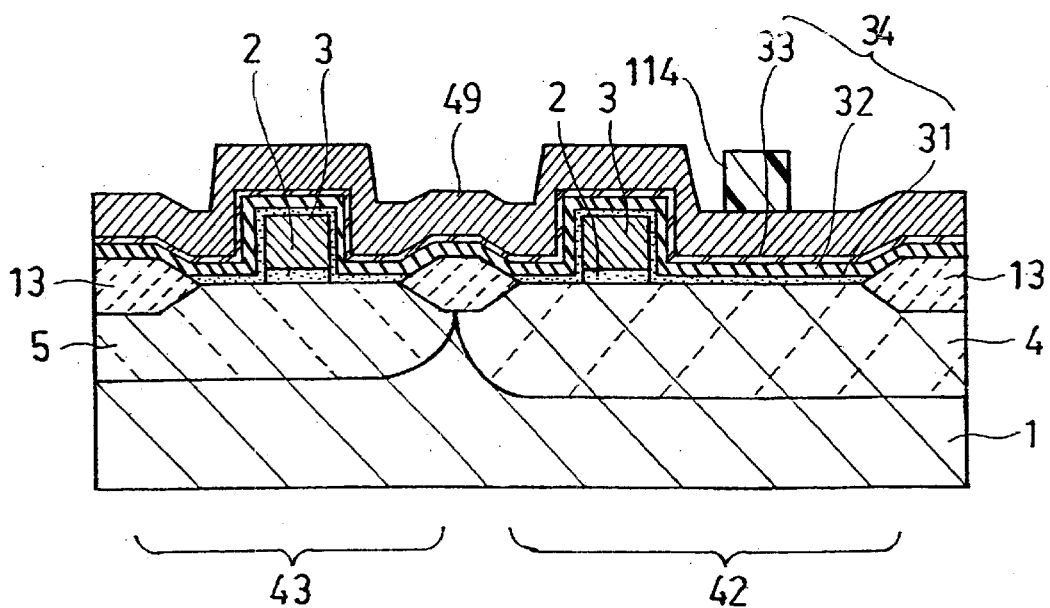
Figure 75:
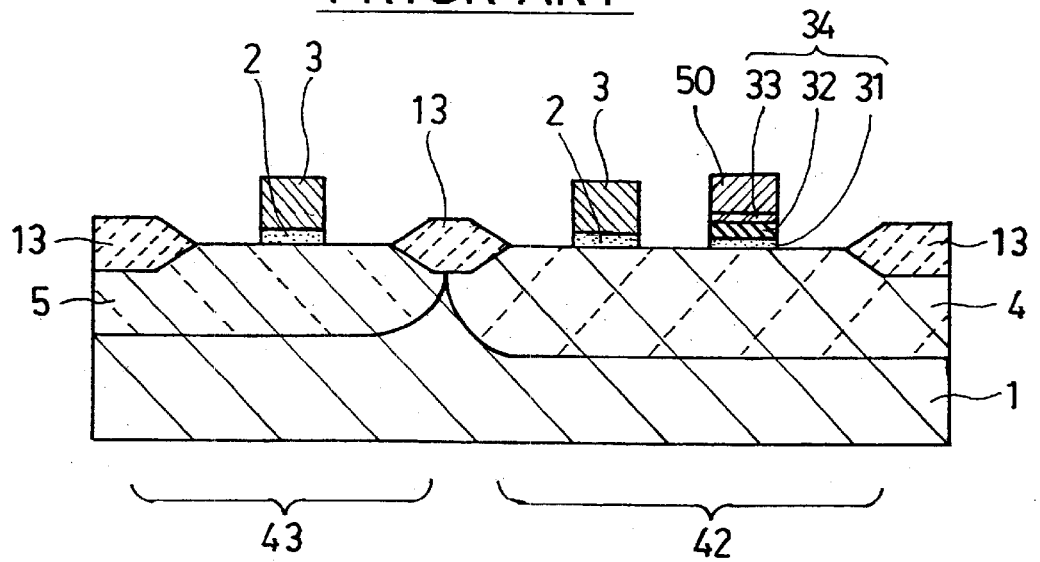
Figure 76:
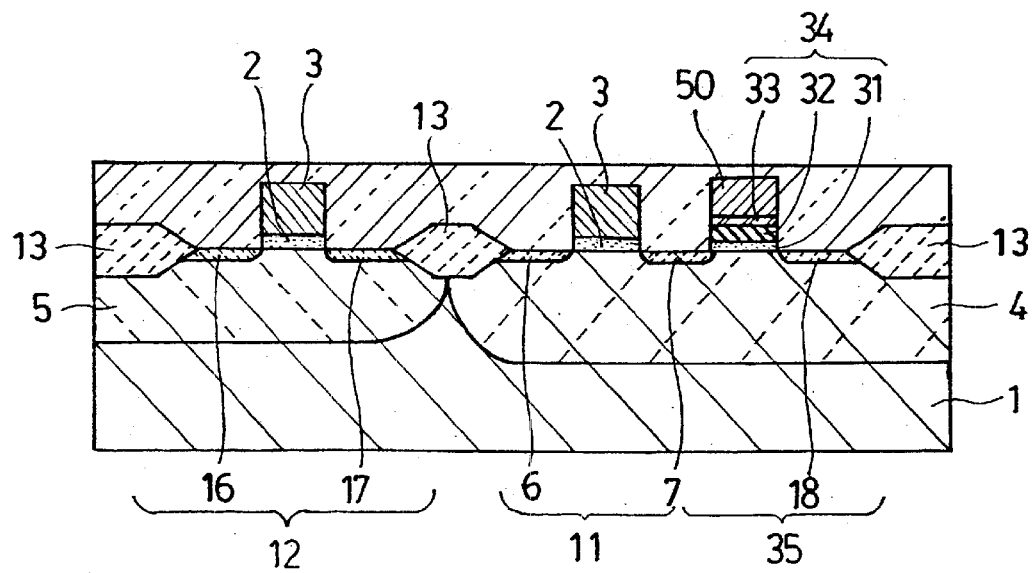

FIG. 68 shows the correlation between gate voltage and drain current of the P channel MOS device.

In the graph shown in FIG. 68, the abscissa indicates gate voltage applied to the gate electrode of the P channel MOS device, and the ordinate shows logarithm values of drain current caused by the gate voltage.

In the graph, the solid line represents the characteristic of the P channel MOS device according to the invention while the broken line represents the characteristic of the conventional P channel MOS device.

As shown in FIG. 68, in the case of the conventional P channel MOS device, shift of the threshold voltage towards the higher side occurs as a result of the annealing process applied in an ammonia atmosphere in the middle of the fabrication process.

This is attributable to a phenomenon in which the annealing applied in an ammonia atmosphere causes ammonia and hydrogen to be diffused into the gate oxide film, or the interface between the gate oxide film and the semiconductor substrate, and to react, thereby generating positive electric charge.

As opposed to the above, with the P channel MOS device according to the invention, the gate insulation film is composed of the dual-layer film consisting of the gate oxide film and gate silicon nitride film.

Hence, owing to the effect of the gate silicon nitride film which is a closely packed film, diffusion of ammonia and hydrogen is reduced, and the amount of positive electric charge generated is greatly reduced. Consequently, with little shift in the threshold voltage occurring, the characteristic of the semiconductor device as designed can be maintained.

As is evident from the description given hereinbefore, with the semiconductor device and the method of fabricating the same, according to the invention, it has become possible to inhibit the shift in the threshold voltage in a radiation environment, which used to be a problem encountered with conventional semiconductor devices using a semiconductor substrate or an SOI substrate. As a result, the characteristic of the semiconductor device can be stabilized in a radiation environment.

Furthermore, in the case of making up the N channel MOS device, the P channel MOS device, and the MONOS device on the same semiconductor substrate or the same SOI substrate, the shift in the threshold voltage caused by the annealing process applied in an ammonia atmosphere can also be inhibited.

More specifically, by providing at least the P channel MOS device with the gate insulation film composed of the dual-layer film consisting of the gate oxide film and gate silicon nitride film, diffusion of ammonia and hydrogen is reduced owing to the effect of the gate silicon nitride film which is a closely packed film, and magnitude of positive electric charge generated is greatly reduced, thus inhibiting the shift in the threshold voltage.

What is claimed is:
1. A method of fabricating a semiconductor device comprising the steps of:
   forming an oxide film on the entire surface of a semiconductor substrate through oxidation thereof in an oxidizing atmosphere;
   etching the oxide film on the semiconductor substrate, in an N channel region where an N channel MOS device is to be formed;
   forming a first buffer oxide film for implanting a p-type dopant into the N channel region;
   implanting the p-type dopant into the N channel region of the semiconductor substrate;
   forming a second buffer oxide film on the entire surface of the semiconductor substrate after etching the oxide film formed on the entire surface of the semiconductor substrate;
   implanting an n-type dopant into a P channel region of the semiconductor substrate, where a P channel MOS device is to be formed, using photoresist as a mask;
   forming a pad oxide film on the entire surface of the semiconductor substrate after etching the second buffer oxide film, and activating the respective dopants implanted in an oxidizing atmosphere;
   forming a nitride film composed of a silicon nitride film, on the pad oxide film;
   etching the nitride film in regions of the semiconductor substrate where field oxide films are to be formed;
   removing the nitride film and pad oxide film after forming the field oxide films on the semiconductor substrate by means of a selective oxidation method for effecting device isolation between the N channel region and the P channel region;
   forming a gate oxide film on the entire surface of the semiconductor substrate, in the N channel region and the P channel region, in an oxidizing atmosphere, and forming a gate silicon nitride film on the entire surface of the gate oxide film;
   forming a first gate electrode material on the entire surface of the gate silicon nitride film, and forming gate electrodes by a photo-etching method;
   forming a memory oxide film by oxidizing the entire surface of the semiconductor substrate in an oxidizing atmosphere, and turning the memory oxide film into an nitride oxide film by annealing in an ammonia atmosphere;
   forming a memory nitride film on the memory oxide film, forming a top oxide film by oxidizing the memory nitride film in an oxidizing atmosphere, and forming a second gate electrode material on the entire surface of the top oxide film;
   forming a memory, gate electrode by photo-etching the second gate electrode material, the top oxide film, the memory nitride film, and the memory oxide film;
   forming a highly doped n-type layer in regions for forming a source and drain, in the N channel region of the semiconductor substrate, using photoresist as a mask against ion implantation;
   forming a highly doped p-type layer in regions for forming, a source and drain, in the P channel region of the semiconductor substrate, using photoresist as a mask against ion implantation;
   forming an interlevel insulator composed primarily of a silicon dioxide film on the entire surface of the semiconductor substrate;

activating the highly doped n-type and p-type layers by annealing;

forming a plurality of contact holes in the interlevel insulator by means of the hot-etching method; and forming interconnections connected, via the contact holes, to the gate electrode, the source, and the drain of the N channel MOS device, the P channel MOS device, and a MONOS device, respectively.

2. A method of fabricating a semiconductor device comprising the steps of:

forming an oxide film on the entire surface of a semiconductor substrate through oxidation thereof in an oxidizing atmosphere;

etching the oxide film on the semiconductor substrate, in an N channel region where an N channel MOS device is to be formed;

forming a first buffer oxide film for implanting a p-type dopant into the N channel region;

implanting the p-type dopant into the N channel region of the semiconductor substrate;

forming a second buffer oxide film on the entire surface of the semiconductor substrate after etching the oxide film formed on the entire surface of the semiconductor substrate;

implanting an n-type dopant into a P channel region of the semiconductor substrate where a P channel MOS device is to be formed, using photoresist as a mask;

forming a pad oxide film on the entire surface of the semiconductor substrate after etching the second buffer oxide film, and activating the respective dopants implanted in an oxidizing atmosphere;

forming a nitride film composed of a silicon nitride film, on the pad oxide film;

etching the nitride film in regions of the semiconductor substrate, where field oxide films are to be formed;

removing the nitride film and the pad oxide film after forming the field oxide films on the semiconductor substrate by means of a selective oxidation method for effecting device isolation between the N channel region and the P channel region;

forming a gate oxide film on the entire surface of the semiconductor substrate, in the N channel region and P channel region, in an oxidizing atmosphere, and forming a gate silicon nitride film on the entire surface of the gate oxide film;

removing the gate silicon nitride film by photo-etching such that the gate silicon nitride film in the P channel region is left intact;

forming a gate electrode material on the entire surface of the semiconductor substrate;

forming gate electrodes by etching the gate electrode material;

forming a highly doped n-type layer in regions for forming a source and a drain, in the N channel region of the semiconductor substrate, using photoresist as a mask against ion implantation;

forming a highly doped p-type layer in regions for forming a source and a drain, in the P channel region of the semiconductor substrate, using photoresist as a mask against ion implantation;

forming an interlevel insulator composed primarily of a silicon dioxide film on the entire surface of the semiconductor substrate;

activating the highly doped n-type and p-type layers by annealing;

forming a plurality of contact holes in the interlevel insulator by means of a photo-etching method; and forming interconnections connected, via the contact holes, to the gate electrode, the source, and the drain of the N channel MOS device and the P channel MOS device, respectively.

3. A method of fabricating a semiconductor device comprising the steps of:

forming photoresist on a semiconductor layer of an SOI substrate made up of a supporting substrate, an insulating film and the semiconductor layer, and forming a first semiconductor layer patterned in an island-like shape on which an N channel MOS device is to be formed, a second semiconductor layer patterned in an island-like shape on which a P channel MOS device is to be formed, and a third semiconductor layer patterned in an island-like shape on which a MONOS device is to be formed, by etching the semiconductor layer using the photoresist as an etching mask;

forming a gate oxide film on the surface of the first through third semiconductor layers, respectively, by oxidizing the respective semiconductor layers in an oxidizing atmosphere;

forming a P channel doped layer in the regions of the first and the third semiconductor layers using photosensitive polymer as a mask against ion implantation;

forming an N channel doped layer in the region of the second semiconductor layer using photoresist as a mask against ion implantation;

forming a p-type doped layer for prevention of surface inversion in the regions surrounding the first and the third semiconductor layers using photoresist as a mask against ion implantation;

forming an n-type doped layer for prevention of surface inversion in the region surrounding the second semiconductor layer using photoresist as a mask against ion implantation;

forming a gate silicon nitride film on the entire surfaces of the semiconductor layers;

forming a first gate electrode material on the entire surface of the gate silicon nitride film, and forming gate electrodes by means of a photo-etching method;

forming a memory oxide film by oxidizing the entire surfaces of the semiconductor layers in an oxidizing atmosphere, and annealing in an ammonia atmosphere for turning the memory oxide film into a nitride oxide film;

forming a memory nitride film on the memory oxide film, forming a top oxide film by oxidizing the memory nitride film in an oxidizing atmosphere, and forming a second gate electrode material on the top oxide film;

forming a memory gate electrode by etching the second gate electrode material, the top oxide film, the memory nitride film, and the memory oxide film by means of the photo-etching method;

forming a highly doped n-type layer in regions of the first and third semiconductor layers, respectively, for forming a source and a drain, using photoresist as a mask against ion implantation;

forming a highly doped p-type layer in regions of the second semiconductor layer, for forming a source and drain, using photoresist as a mask against ion implantation;

forming an interlevel insulator composed primarily of a silicon dioxide film on the entire surfaces of the semiconductor layers;

activating the highly doped n-type and p-type layers by annealing;

forming a plurality of contact holes in the interlevel insulator by means of the photo-etching method; and forming interconnections connected, via the contact holes, to the gate electrode, the source, and the drain of the N channel MOS device, the P channel MOS device, and the MONOS device, respectively.

4. A method of fabricating a semiconductor device comprising the steps of:

forming photoresist on a semiconductor layer of an SOI substrate made up of a supporting substrate, an insulating film and the semiconductor layer, and forming a first semiconductor layer patterned in an island-like shape on which an N channel MOS device is to be formed, and a second semiconductor layer patterned in an island-like shape on which a P channel MOS device is to be formed, by etching the semiconductor layer using the photoresist as an etching mask;

forming a gate oxide film on the surface of the first and second semiconductor layers, respectively, by oxidizing the respective semiconductor layers in an oxidizing atmosphere;

forming a P channel doped layer in the region of the first semiconductor layer using photoresist as a mask against ion implantation;

forming an N channel doped layer in the region of the second semiconductor layer using photoresist as a mask against ion implantation;

forming a p-type doped layer for prevention of surface inversion in the region surrounding the first semiconductor layer using photoresist as a mask against ion implantation;

forming an n-type doped layer for prevention of surface inversion in the region surrounding the second semiconductor layer using photoresist as a mask against ion implantation;

forming a gate silicon nitride film on the gate oxide film formed on the surface of the respective semiconductor layers;

removing the gate silicon nitride film by a photo-etching method except that the region of the second semiconductor layer is kept intact;

forming a gate electrode material on the entire surface of the semiconductor layers;

forming gate electrodes by etching the gate electrode material;

forming a highly doped n-type layer in regions of the first semiconductor layer for forming a source and a drain, using photoresist as a mask against ion implantation;

forming a highly doped p-type layer in regions of the second semiconductor layer for forming a source and a drain, using photoresist as a mask against ion implantation;

forming an interlevel insulator composed primarily of a silicon dioxide film on the entire surfaces of the semiconductor layers;

activating the highly doped n-type and p-type layers by annealing;

forming a plurality of contact holes in the interlevel insulator by means of the photo-etching method; and forming interconnections connected, via the contact holes, to the gate electrode, the source, and the drain of the N channel MOS device and the P channel MOS device, respectively.

* * * * *